United States Patent
Lee et al.

(10) Patent No.: US 12,382,828 B2
(45) Date of Patent: Aug. 5, 2025

(54) LIGHT-EMITTING DEVICE AND ELECTRONIC APPARATUS INCLUDING THE SAME

(71) Applicant: Samsung Display Co., Ltd., Yongin-si (KR)

(72) Inventors: Jonghyeon Lee, Yongin-si (KR); Hangeul Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 824 days.

(21) Appl. No.: 17/591,766

(22) Filed: Feb. 3, 2022

(65) Prior Publication Data

US 2022/0255015 A1    Aug. 11, 2022

(30) Foreign Application Priority Data

Feb. 10, 2021    (KR) .................. 10-2021-0019361

(51) Int. Cl.
| | | |
|---|---|---|
| *H10K 50/12* | (2023.01) | |
| *H10K 85/40* | (2023.01) | |
| *H10K 85/60* | (2023.01) | |
| *H10K 50/11* | (2023.01) | |
| *H10K 50/15* | (2023.01) | |
| *H10K 50/16* | (2023.01) | |
| *H10K 50/17* | (2023.01) | |
| *H10K 101/10* | (2023.01) | |

(52) U.S. Cl.
CPC ......... *H10K 85/6572* (2023.02); *H10K 85/40* (2023.02); *H10K 85/626* (2023.02); *H10K 85/6574* (2023.02); *H10K 85/6576* (2023.02); *H10K 50/11* (2023.02); *H10K 50/12* (2023.02); *H10K 50/15* (2023.02); *H10K 50/16* (2023.02); *H10K 50/171* (2023.02); *H10K 2101/10* (2023.02)

(58) Field of Classification Search
None
See application file for complete search history.

(56) References Cited

U.S. PATENT DOCUMENTS

| | | | |
|---|---|---|---|
| 9,196,859 B2 | 11/2015 | Sim et al. | |
| 9,604,928 B2 | 3/2017 | Shitagaki et al. | |
| 10,418,573 B2 | 9/2019 | Kim et al. | |
| 2006/0263631 A1 | 11/2006 | Lee et al. | |
| 2007/0090756 A1 | 4/2007 | Okada et al. | |
| 2017/0271610 A1 | 9/2017 | Takahashi | |
| 2017/0352815 A1* | 12/2017 | Howard, Jr. | ....... H10K 85/6572 |
| 2018/0182980 A1 | 6/2018 | Lennartz et al. | |
| 2020/0266374 A1 | 8/2020 | Ko | |
| 2020/0321537 A1* | 10/2020 | Jeon | ........ C09K 11/02 |

FOREIGN PATENT DOCUMENTS

| | | |
|---|---|---|
| JP | 2007-134677 | 5/2007 |
| JP | 2017-175128 | 9/2017 |
| JP | 2020-136256 | 8/2020 |
| KR | 10-2006-0040830 | 5/2006 |
| KR | 10-2009-0097464 | 9/2009 |
| KR | 10-1706752 | 2/2017 |
| KR | 10-2090704 | 3/2020 |

OTHER PUBLICATIONS

Dong-Dong Han et al., "Bioinspired Graphene Actuators Prepared by Unilateral UV Irradiation of Graphene Oxide Papers", Advanced Functional Materials, Jun. 16, 2015, p. 4548-4557, vol. 25.

* cited by examiner

*Primary Examiner* — Robert S Loewe
(74) *Attorney, Agent, or Firm* — KILE PARK REED & HOUTTEMAN PLLC

(57) ABSTRACT

Provided are a light-emitting device and an electronic apparatus including the light-emitting device. The light-emitting device includes a first electrode, a second electrode facing the first electrode, and an interlayer disposed between the first electrode and the second electrode. The interlayer includes an emission layer and an n-doping layer disposed between the emission layer and the second electrode. The emission layer includes a first compound, a second compound, and a light-emitting dopant, the n-doping layer includes a third compound and an n-dopant, and does not include the light-emitting dopant, the first compound includes a hole transport host, the second compound and the third compound each independently include an electron transport host, a bipolar host, or any combination thereof, and the second compound and the third compound are identical to or different from each other.

19 Claims, 3 Drawing Sheets

LIGHT-EMITTING DEVICE AND ELECTRONIC APPARATUS INCLUDING THE SAME

CROSS-REFERENCE TO RELATED APPLICATION(S)

This application claims priority to and benefits of Korean Patent Application No. 10-2021-0019361 under 35 U.S.C. § 119, filed on Feb. 10, 2021 in the Korean Intellectual Property Office, the entire contents of which are incorporated herein by reference.

BACKGROUND

1. Technical Field

Embodiments relate to a light-emitting device and an electronic apparatus including the same.

2. Description of the Related Art

From among light-emitting devices, self-emissive devices have wide viewing angles, high contrast ratios, short response times, and excellent characteristics in terms of brightness, driving voltage, and response speed.

Light-emitting devices may include a first electrode on a substrate, and a hole transport region, an emission layer, an electron transport region, and a second electrode sequentially stacked on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transition from an excited state to a ground state to thereby generate light.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a light-emitting device with improved driving voltage, emission efficiency, and lifespan by improving charge balance, and an electronic apparatus including the light-emitting device.

Additional aspects will be set forth in part in the description, which follows and, in part, will be apparent from the description, or may be learned by practice of the embodiments of the disclosure.

According to embodiments, a light-emitting device may include a first electrode, a second electrode facing the first electrode, and an interlayer disposed between the first electrode and the second electrode. The interlayer may include an emission layer, and an n-doping layer disposed between the emission layer and the second electrode. The emission layer may include a first compound, a second compound, and a light-emitting dopant, the n-doping layer may include a third compound and an n-dopant, and may not include the light-emitting dopant, the first compound may include a hole transport host, the second compound and the third compound may each independently include an electron transport host, a bipolar host, or any combination thereof, and the second compound and the third compound may be identical to or different from each other.

In an embodiment, the n-doping layer may directly contact the emission layer.

In an embodiment, the n-dopant may include a metal-containing material including an alkali metal complex, an alkaline earth metal complex, or any combination thereof.

In an embodiment, the n-dopant may include a Li complex.

In an embodiment, an amount of the n-dopant in the n-doping layer may be in a range of about 5 wt % to about 10 wt %, based on the total weight of the n-doping layer.

In an embodiment, a thickness of the n-doping layer may be in a range of about 1 nm to about 20 nm.

In an embodiment, the third compound included in the n-doping layer and the second compound included in the emission layer may be identical to each other.

In an embodiment, the second compound may have a triplet energy (T1) level equal to or greater than about 2.85 eV.

In an embodiment, the light-emitting dopant in the emission layer may include a first dopant, a second dopant, or any combination thereof, the first dopant may be a phosphorescent dopant, and the second dopant may be a thermally activated delayed fluorescence dopant satisfying Equation 1:

$$\Delta E_{ST} = E(S1) - E(T1) \leq 0.3 \text{ eV} \qquad \text{[Equation 1]}$$

In Equation 1, E(S1) may be the lowest excitation singlet energy level (eV) of the thermally activated delayed fluorescence dopant, and E(T1) may be the lowest excitation triplet energy level (eV) of the thermally activated delayed fluorescence dopant.

In an embodiment, the light-emitting dopant in the emission layer may further include a fluorescence dopant.

In an embodiment, the interlayer may further include a hole transport region between the first electrode and the emission layer, and an electron transport region between the n-doping layer and the second electrode. The hole transport region may include a hole injection layer, a hole transport layer, an emission auxiliary layer, an electron blocking layer, or any combination thereof, and the electron transport region may include a buffer layer, a hole blocking layer, an electron control layer, an electron transport layer, an electron injection layer, or any combination thereof.

In an embodiment, the hole transport region may include a hole transport layer, the hole transport layer may include a hole transport material, and the hole transport material included in the hole transport layer and the first compound included in the emission layer may be identical to each other.

In an embodiment, the electron transport region may include an electron transport layer, the n-doping layer may be disposed between the emission layer and the electron transport layer, and the n-doping layer may directly contact the emission layer and may directly contact the electron transport layer.

In an embodiment, the electron transport region may include a Li complex.

According to embodiments, an electronic apparatus may include the light-emitting device.

In an embodiment, the electronic apparatus may further include a thin-film transistor which may include a source electrode, a drain electrode, and an active layer. The first electrode of the light-emitting device and the source electrode or the drain electrode of the thin-film transistor may be electrically connected to each other.

In an embodiment, the electronic apparatus may further include a functional layer which may include a touch screen layer, a polarizing layer, a color filter, a color conversion layer, or any combination thereof.

BRIEF DESCRIPTION OF THE DRAWINGS

The above and other aspects and features of the disclosure will become more apparent by describing in detail embodiments thereof with reference to the accompanying drawings, in which.

DETAILED DESCRIPTION OF THE EMBODIMENTS

Figure 1:
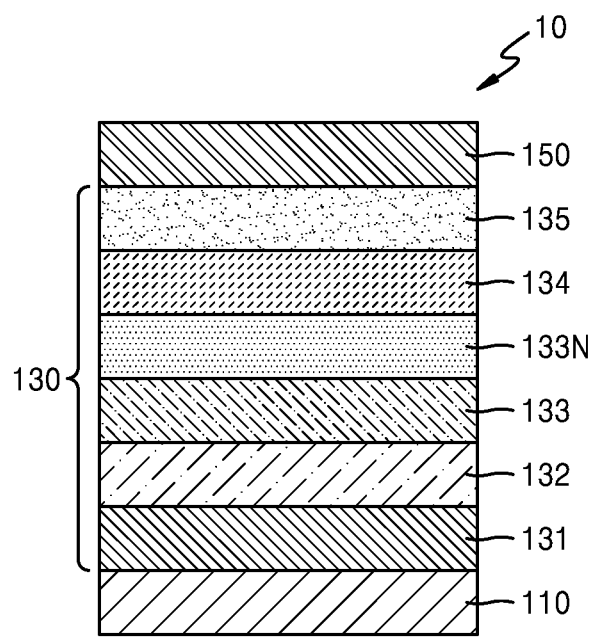
FIG. 1 is a schematic cross-sectional view of a light-emitting device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

The term "at least one of" is intended to include the meaning of "at least one selected from" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, 10%, or 5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

The term "interlayer" as used herein may refer to a single layer and/or all layers between a first electrode and a second electrode of a light-emitting device.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

[Description of FIG. 1]

FIG. 1 is a schematic cross-sectional view of a light-emitting device 10 according to an embodiment. The light-emitting device 10 includes a first electrode 110, an interlayer 130, and a second electrode 150.

Hereinafter, the structure of the light-emitting device 10 according to an embodiment and a method of manufacturing the light-emitting device 10 will be described in connection with FIG. 1.

[First Electrode 110]

In FIG. 1, a substrate may be further included under the first electrode 110 or above the second electrode 150. The substrate may be a glass substrate or a plastic substrate. In an embodiment, the substrate may be a flexible substrate, and may include plastics with excellent heat resistance and durability, such as polyimide, polyethylene terephthalate (PET), polycarbonate, polyethylene napthalate, polyarylate (PAR), polyetherimide, or any combination thereof.

The first electrode 110 may be formed by, for example, depositing or sputtering a material for forming the first electrode 110 on the substrate. When the first electrode 110 is an anode, a material for forming the first electrode 110 may be a high work function material that facilitates injection of holes.

The first electrode 110 may be a reflective electrode, a semi-transmissive electrode, or a transmissive electrode. When the first electrode 110 is a transmissive electrode, a material for forming the first electrode 110 may include indium tin oxide (ITO), indium zinc oxide (IZO), tin oxide ($SnO_2$), zinc oxide (ZnO), or any combinations thereof. In an embodiment, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combinations thereof may be used as a material for forming a first electrode 110.

The first electrode 110 may have a single-layered structure or a multilayer structure including multiple layers. For example, the first electrode 110 may have a three-layered structure of ITO/Ag/ITO.

[Interlayer 130]

The interlayer 130 may be disposed on the first electrode 110. The interlayer 130 may include a hole injection layer 131, a hole transport layer 132, an emission layer 133, an n-doping layer 133N, an electron transport layer 134, and an electron injection layer 135.

In FIG. 1, although the light-emitting device 10 is shown to include the hole injection layer 131, the hole transport layer 132, the electron transport layer 134, and the electron injection layer 135, at least one of the hole injection layer 131, the hole transport layer 132, the electron transport layer 134, and the electron injection layer 135 may be omitted when needed.

The interlayer 130 may further include, in addition to various organic materials, metal-containing compounds such as organometallic compounds, inorganic materials such as quantum dots, and the like.

In an embodiment, the interlayer 130 may include two or more emitting units sequentially stacked between the first electrode 110 and the second electrode 150 and a charge generation layer between the two or more emitting units. When the interlayer 130 includes the two or more emitting units and the charge generation layer as described above, the light-emitting device 10 may be a tandem light-emitting device.

[Emission Layer 133]

The emission layer 133 may include a first compound, a second compound, and a light-emitting dopant.

The first compound may include a hole transport host, and the second compound may include an electron transport host, a bipolar host, or any combination thereof.

For example, the first compound may include a π electron-rich $C_3$-$C_{60}$ cyclic group, and may not include a π electron-deficient nitrogen-containing cyclic group.

The term "π electron-rich $C_3$-$C_{60}$ cyclic group" as used herein may be a cyclic group that has three to sixty carbon atoms and does not include *—N=*' as a ring-forming moiety. For example, the π electron-rich $C_3$-$C_{60}$ cyclic group may be a benzene group, a heptalene group, an indene group, a naphthalene group, an azulene group, a heptalene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a coronene group, an ovalene group, a pyrrole group, an isoindole group, an indole group, a furan group, a thiophene group, a benzofuran group, a benzothiophene group, a benzosilole group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, a benzosilolocarbazole group, a triindolobenzene group, an acridine group, or a dihydroacridine group, but embodiments are not limited thereto.

The term "π electron-deficient nitrogen-containing $C_1$-$C_{60}$ cyclic group" as used herein may be a heterocyclic group that has one to sixty carbon atoms and may include *—N=*' as a ring-forming moiety. For example, the π electron-deficient nitrogen-containing $C_1$-$C_{60}$ cyclic group may be a condensed cyclic group in which at least one of an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinoline group, a phthalazine group, a naphthyridine group, a quinoxaline group, a benzoquinoxaline group, a quinazoline group, a cinnoline group, a phenanthridine group, a phenanthroline group, a phenazine group, a benzimidazole group, an isobenzothiazole group, a benzoxazole group, a benzoisoxazole group, a triazole group, a tetrazole group, an oxadiazole group, a triazine group, a thiadiazole group, an imidazopyridine group, an imidazopyrimidine group, an azaindene group, an azaindole group, an azabenzofuran group, an azabenzothiophene group, an azabenzosilole group, an azafluorene group, an azacarbazole group, an azadibenzofuran group, an azadibenzothiophene group, and an azadibenzosilole group cyclic group are condensed to any cyclic group.

For example, the first compound may be a carbazole-containing compound that does not contain a π electron-deficient nitrogen-containing $C_1$-$C_{60}$ cyclic group.

In an embodiment, the first compound may include a compound represented by Formula 1-1, a compound represented by Formula 1-2, or any combination thereof.

[Formula 1-1]

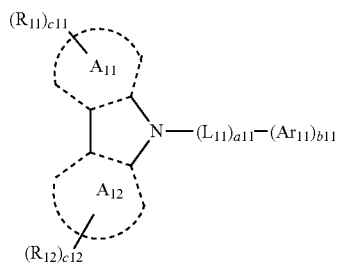

-continued

[Formula 1-2]

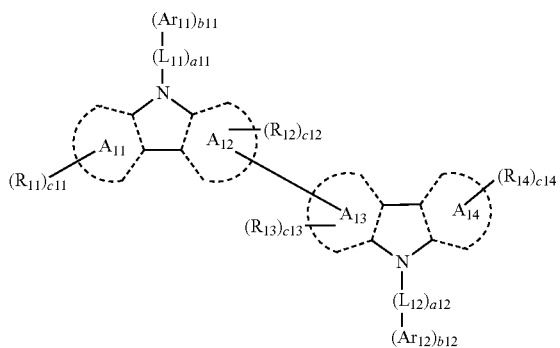

In Formulae 1-1 and 1-2,
$A_{11}$ to $A_{14}$ may each independently be a π electron-rich $C_3$-$C_{60}$ cyclic group,
$R_{11}$ to $R_{14}$ may each independently be a group represented by *-$(L_{13})_{a13}$-$(Ar_{13})_{b13}$, hydrogen, deuterium, —F, —Cl, —Br, —I, a hydroxyl group, a cyano group, a nitro group, a $C_1$-$C_{60}$ alkyl group unsubstituted or substituted with at least one $R_{10b}$, a $C_2$-$C_{60}$ alkenyl group unsubstituted or substituted with at least one $R_{10b}$, a $C_2$-$C_{60}$ alkynyl group unsubstituted or substituted with at least one $R_{10b}$, a $C_1$-$C_{60}$ alkoxy group unsubstituted or substituted with at least one $R_{10b}$, a π electron-rich $C_3$-$C_{60}$ cyclic group unsubstituted or substituted with at least one $R_{10b}$, —Si$(Q_1)(Q_2)(Q_3)$, —N$(Q_1)(Q_2)$, or —B$(Q_1)(Q_2)$,
c11 to c14 may each be independently an integer from 1 to 8,
$L_{11}$ to $L_{13}$ may each independently be a single bond; or a π electron-rich $C_3$-$C_{60}$ cyclic group unsubstituted or substituted with deuterium, —F, —Cl, —Br, —I, a hydroxyl group, a cyano group, a nitro group, a $C_1$-$C_{60}$ alkyl group, a $C_1$-$C_{60}$ alkoxy group, a π electron-rich $C_3$-$C_{60}$ cyclic group, or any combination thereof,
a11 to a13 may each independently be an integer from 1 to 5,
$Ar_{11}$ to $Ar_{13}$ may each independently be:
a π electron-rich $C_3$-$C_{60}$ cyclic group unsubstituted or substituted with deuterium, —F, —Cl, —Br, —I, a hydroxyl group, a cyano group, a nitro group, a $C_1$-$C_{60}$ alkyl group, a $C_1$-$C_{60}$ alkoxy group, a π electron-rich $C_3$-$C_{60}$ cyano group, or any combination thereof; or —Si$(Q_1)(Q_2)(Q_3)$ or —N$(Q_1)(Q_2)$,
b11 to b13 may each independently be an integer from 1 to 5,
$R_{10b}$ may be:
deuterium, —F, —Cl, —Br, —I, a hydroxyl group, a cyano group, or a nitro group;
a $C_1$-$C_{60}$ alkyl group, a $C_2$-$C_{60}$ alkenyl group, a $C_2$-$C_{60}$ alkynyl group, or $C_1$-$C_{60}$ alkoxy group, each unsubstituted or substituted with deuterium, —F, —Cl, —Br, —I, a hydroxyl group, a cyano group, a nitro group, a π electron-rich $C_3$-$C_{60}$ cyclic group, a $C_6$-$C_{60}$ aryloxy group, a $C_6$-$C_{60}$ arylthio group, —Si$(Q_{11})(Q_{12})(Q_{13})$, —N$(Q_{11})(Q_{12})$, —B$(Q_{11})(Q_{12})$, or any combination thereof;
a π electron-rich $C_3$-$C_{60}$ cyclic group, a $C_6$-$C_{60}$ aryloxy group, or $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a π electron-rich $C_3$-$C_{60}$ cyclic group, a $C_6$-$C_{60}$ aryloxy group, a $C_6$-$C_{60}$ arylthio group, —Si$(Q_{21})(Q_{22})(Q_{23})$, —N$(Q_{21})(Q_{22})$, —B$(Q_{21})(Q_{22})$, or any combination thereof; or
—Si$(Q_{31})(Q_{32})(Q_{33})$, —N$(Q_{31})(Q_{32})$, or —B$(Q_{31})(Q_{32})$,
wherein $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a π electron-rich $C_3$-$C_{60}$ cyclic group unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In an embodiment, $A_{11}$ to $A_{14}$ in Formulae 1-1 and 1-2 may each independently be a benzene group, a naphthalene group, an anthracene group, a phenanthrene group, a fluoranthene group, a triphenylene group, a pyrene group, a chrysene group, an indene group, a fluorene group, a spiro-bifluorene group, a benzofluorene group, a dibenzofluorene group, a carbazole group, a dibenzosilole group, a dibenzofuran group, a dibenzothiophene group, a benzocarbazole group, or a dibenzocarbazole group. For example, $A_{11}$ to $A_{14}$ may each independently be a benzene group, a naphthalene group, a phenanthrene group, a fluorene group, a carbazole group, a dibenzofuran group, or a dibenzothiophene group.

In an embodiment, $L_{11}$ to $L_{13}$ may each independently be:
a single bond; or
a benzene group, a heptalene group, an indene group, a naphthalene group, an azulene group, a heptalene group, an indacene group, acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentacene group, a rubicene group, a corogene group, an ovalene group, a pyrrole group, an isoindole group, an indole group, a furan group, a thiophene group, a benzofuran group, a benzothiophene group, a benzosilole group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, a benzosilolocarbazole group, a triindolobenzene group, an acridine group, or a dihydroacridine group.

In an embodiment, $Ar_{11}$ to $Ar_{13}$ may each independently be:
a phenyl group, a biphenyl group, a terphenyl group, a tetraphenyl group, a naphthyl group, a fluorenyl group, a spiro-bifluorenyl group, a benzofluorenyl group, a dibenzofluorenyl group, a phenanthrenyl group, an anthracenyl group, a triphenylenyl group, a pyrenyl group, a chrysenyl group, a pyrrolyl group, an isoindolyl group, an indolyl group, a furanyl group, a thiophenyl group, a benzofuranyl group, a benzothiophenyl group, a benzosilolyl group, a dibenzofuranyl group, a dibenzothiophenyl group, a carbazolyl group, a benzocarbazolyl group, a dibenzocarbazolyl group, a dibenzosilolyl group, an indenocarbazolyl group, an indolocarbazolyl group, a benzofurocarbazolyl group, a benzothienocarbazolyl group, a benzosilolocarbazolyl group, or a dihydroacridinyl group, each unsubstituted or substituted with deuterium, a $C_1$-$C_{10}$ alkyl group, a $C_1$-$C_{10}$ alkoxy group, a phenyl group, a biphenyl group, a terphenyl group, a tetraphenyl group, a naphthyl group, a fluorenyl group, a spiro-bifluorenyl group, a benzofluorenyl group, a dibenzofluorenyl group, a phenanthrenyl group, an anthracenyl group, a triphenylenyl group, a pyrenyl group, a chrysenyl group, a pyrrolyl group, an isoindolyl group, an indolyl group, a furanyl group, a thiophenyl group, a benzofuranyl group, a benzothiophenyl group, a benzosilolyl group, a dibenzofuranyl group, a dibenzothiophenyl group, a carbazolyl group, a benzocarbazolyl group, a dibenzocarbazolyl group, a dibenzosilolyl group, an indenocarbazolyl group, an indolocarbazolyl group, a benzofurocarbazolyl group, a benzothienocarbazolyl group, a benzosilolocarbazolyl group, a dihydroacridinyl group, or any combination thereof; or —Si($Q_1$)($Q_2$)($Q_3$) or —N($Q_1$)($Q_2$), wherein $Q_1$ to $Q_3$ may each independently be hydrogen, deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, or a terphenyl group.

For example, the first compound may be one of Compounds 1-1 to 1-22, but embodiments are not limited thereto:

1-1

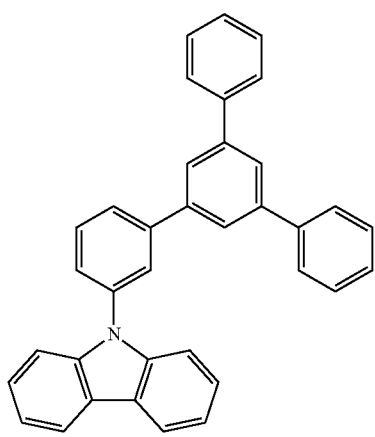

1-2

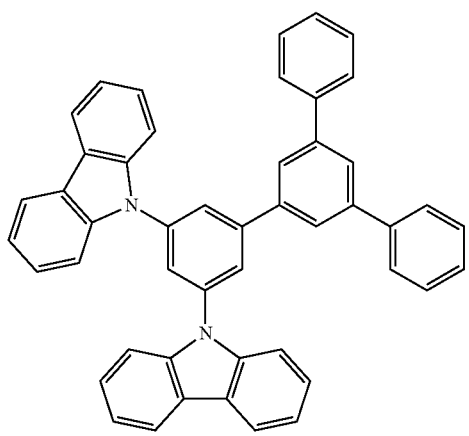

1-3

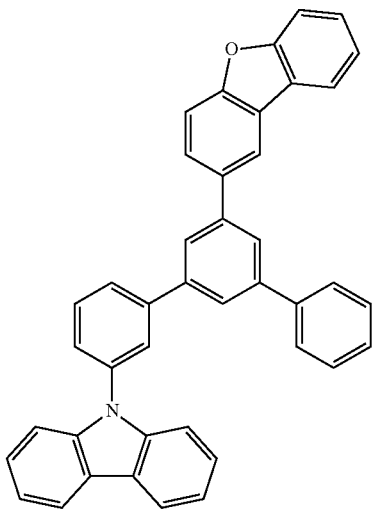

1-4

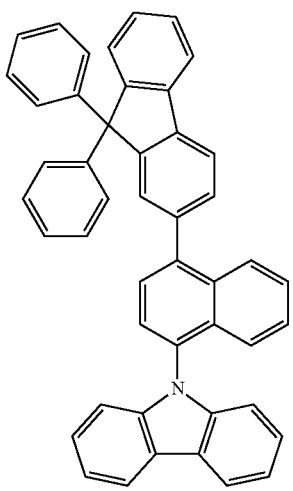

1-5

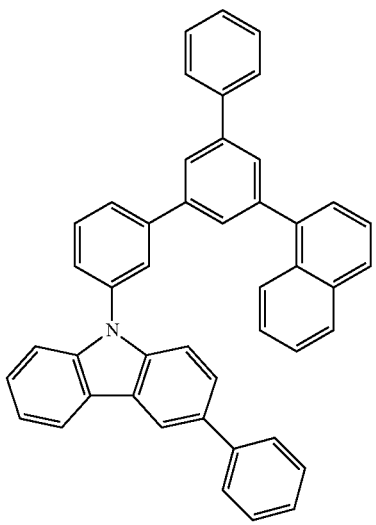

1-6
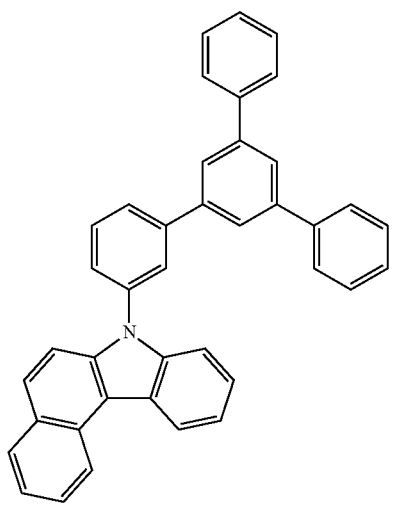
1-7
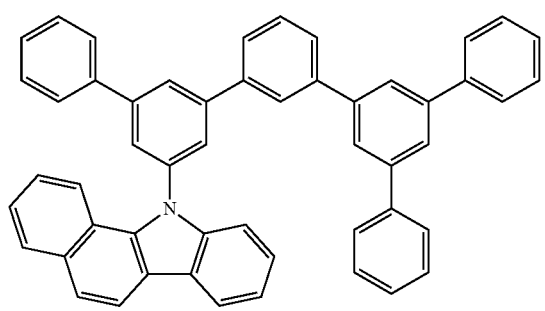
1-8
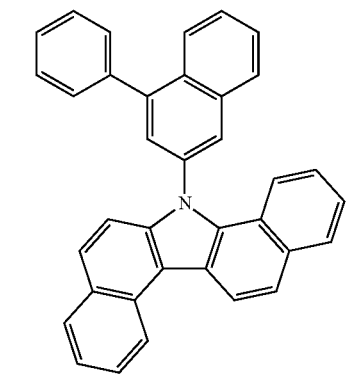
1-9
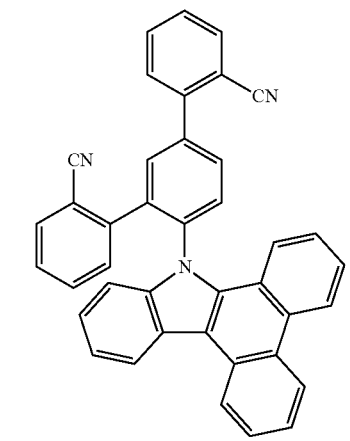
1-10
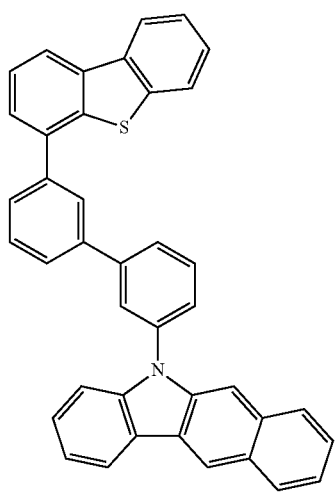
1-11
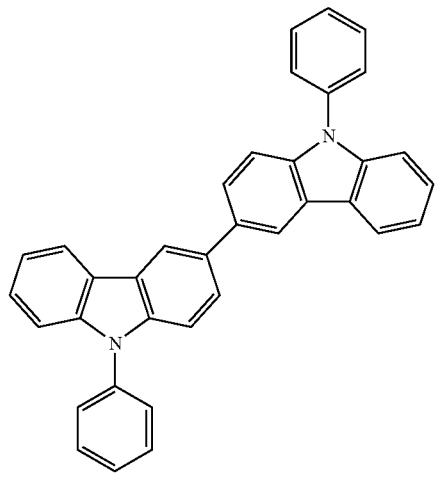
1-12
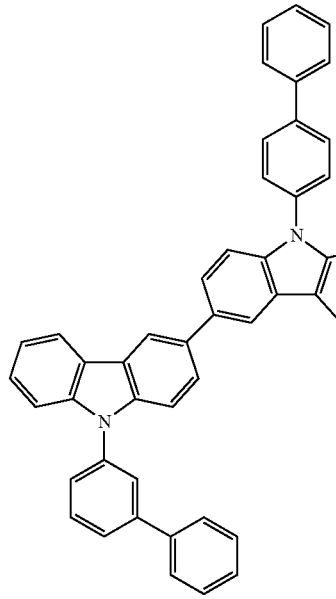

1-13
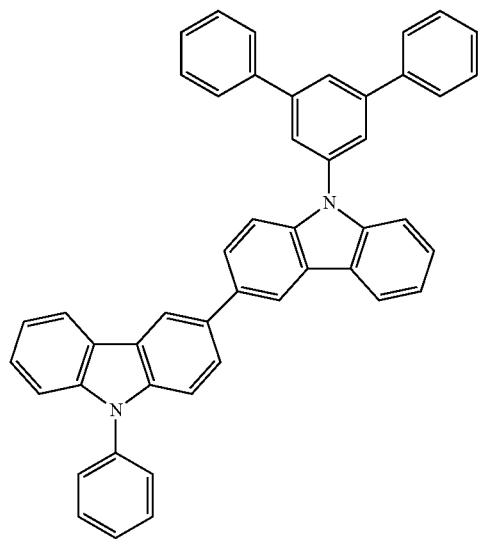
1-14
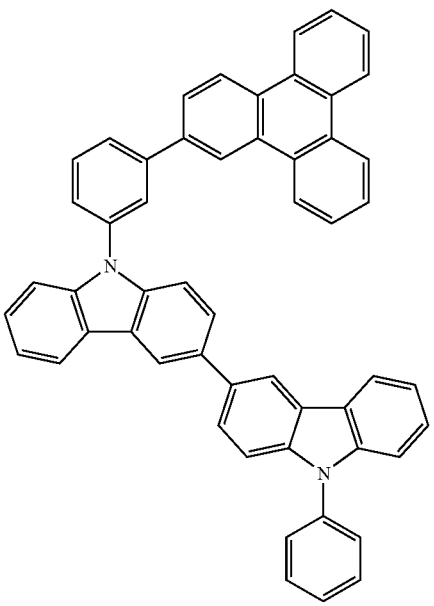
1-15
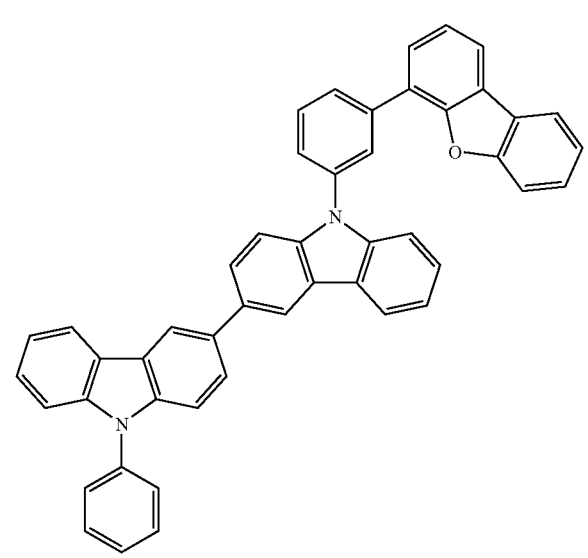
1-16
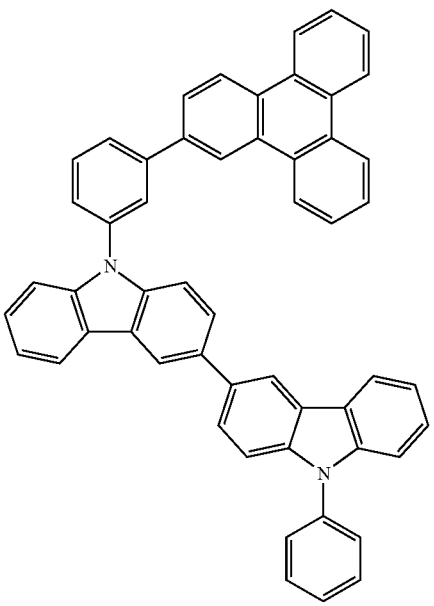
1-17
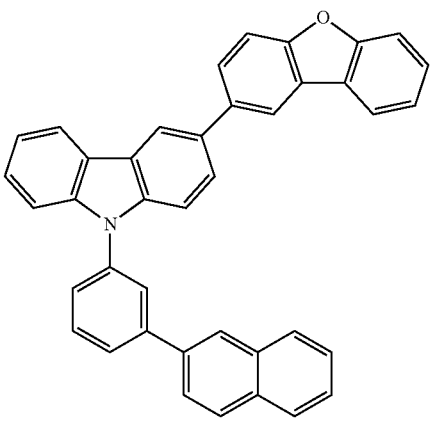

1-18

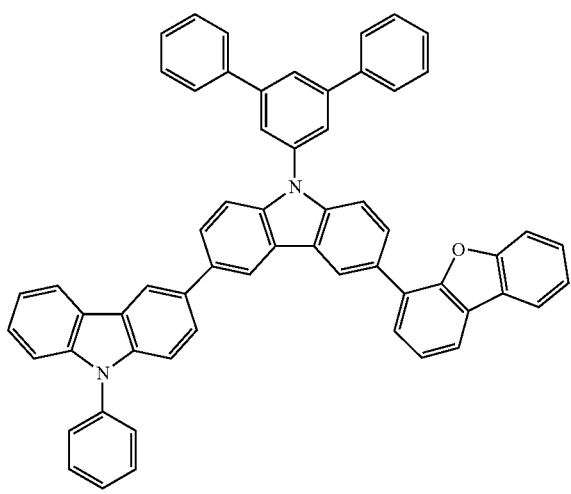

1-19

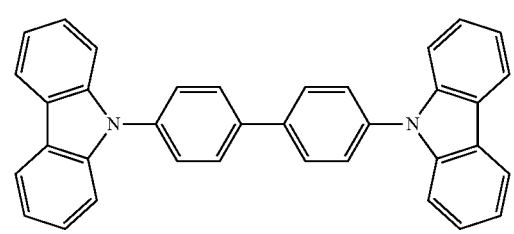

1-20

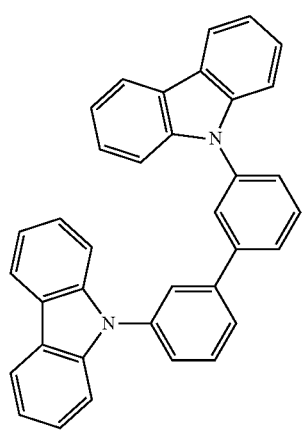

1-21

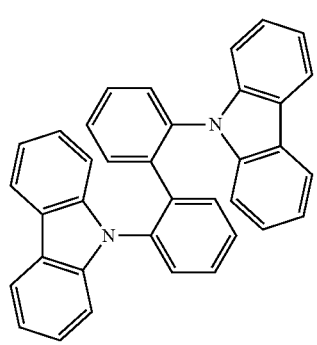

1-22

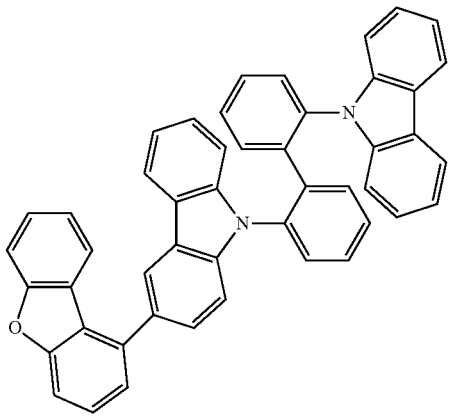

In an embodiment, the electron transport host may be a compound that includes at least one electron withdrawing group. The bipolar host may be a compound that includes at least one electron withdrawing group and at least one electron donating group.

For example, the electron withdrawing group may be: —F, —CFH$_2$, —CF$_2$H, —CF$_3$, —CN or —NO$_2$;

a C$_1$-C$_{60}$ alkyl group substituted with —F, —CFH$_2$, —CF$_2$H, —CF$_3$, —CN, —NO$_2$, or any combination thereof; or a π electron-deficient nitrogen-containing C$_1$-C$_{60}$ cyclic group.

For example, the electron donating group may be a carbazole group, a dibenzofuran group, a dibenzothiophene group, an indolocarbazole group, a benzofurocarbazole group, a benzothienocarbazole group, or —N(Q$_1$)(Q$_2$), wherein Q$_1$ to Q$_2$ may each independently be: hydrogen; deuterium; —F; —Cl; —Br; —I; a hydroxyl group; a cyano group; a nitro group; a C$_1$-C$_{60}$ alkyl group; a C$_2$-C$_{60}$ alkenyl group; a C$_2$-C$_{60}$ alkynyl group; a C$_1$-C$_{60}$ alkoxy group; or a π electron-rich C$_3$-C$_{60}$ cyclic group unsubstituted or substituted with deuterium, —F, a cyano group, a C$_1$-C$_{60}$ alkyl group, a C$_1$-C$_{60}$ alkoxy group, a phenyl group, a biphenyl group, or any combination thereof.

In an embodiment, the second compound may include a compound represented by Formula 2-1, a compound represented by Formula 2-2, a compound represented by Formula 2-3, or any combination thereof:

[Formula 2-1]

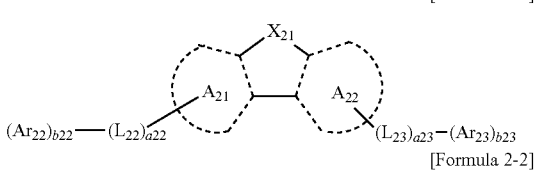

[Formula 2-2]

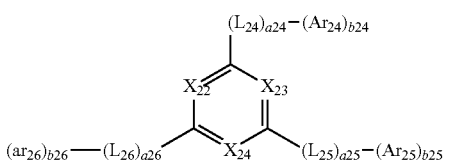

-continued

[Formula 2-3]

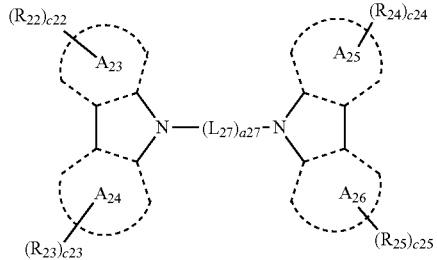

In Formulae 2-1 to 2-3,
$A_{21}$ to $A_{26}$ may each independently be a $C_3$-$C_{60}$ carbocyclic group or a $C_1$-$C_{60}$ heterocyclic group,
$X_{21}$ may be N-$[(L_{21})_{a21}$-$(Ar_{21})_{b21}]$, O, or S,
$X_{22}$ to $X_{24}$ may each independently be N or C($R_{21}$), and at least one of $X_{22}$ to $X_{24}$ may be N,
$L_{21}$ to $L_{27}$ may each independently be a single bond, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$,
a21 to a27 may each independently be an integer from 1 to 3,
$Ar_{21}$ to $Ar_{26}$ and $R_{21}$ to $R_{25}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$),
b21 to b26 may each independently be an integer from 1 to 5,
c22 to c25 may each independently be an integer from 1 to 8,
at least one of $A_{21}$, $A_{22}$, $L_{21}$ to $L_{23}$, and $Ar_{21}$ to $Ar_{23}$ in Formula 2-1 may include a π electron-deficient nitrogen-containing $C_1$-$C_{60}$ cyclic group,
at least one of $R_{22}$ to $R_{25}$ in Formula 2-3 may include an electron withdrawing group,
wherein the electron withdrawing group may be:
—F, —CFH$_2$, —CF$_2$H, —CF$_3$, —CN, or —NO$_2$;
a $C_1$-$C_{60}$ alkyl group substituted with —F, —CFH$_2$, —CF$_2$H, —CF$_3$, —CN, —NO$_2$, or any combination thereof; or
a π electron-deficient nitrogen-containing $C_1$-$C_{60}$ cyclic group,
$R_{10a}$ may be:
deuterium, —F, —Cl, —Br, —I, a hydroxyl group, a cyano group, or a nitro group;
a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;
a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or
—Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$),
wherein $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In an embodiment, $A_{21}$ to $A_{26}$ in Formulae 2-1 and 2-3 may each independently be a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinoline group, a phthalazine group, a naphthyridine group, a quinoxaline group, a benzoquinoxaline group, a quinazoline group, a cinnoline group, a phenanthridine group, a phenanthroline group, a phenazine group, a benzimidazole group, an isobenzothiazole group, a benzoxazole group, a benzoisoxazole group, a triazole group, a tetrazole group, an oxadiazole group, a triazine group, a thiadiazole group, an imidazopyridine group, an imidazopyrimidine group, an azaindene group, an azaindole group, an azabenzofuran group, an azabenzothiophene group, an azabenzosilole group, an azafluorene group, an azacarbazole group, an azadibenzofuran group, an azadibenzothiophene group, or an azadibenzosilole group.

In an embodiment, $L_{21}$ to $L_{27}$ in Formulae 2-1 to 2-3 may each independently be:
a single bond; or
a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinoline group, a phthalazine group, a naphthyridine group, a quinoxaline group, a benzoquinoxaline group, a quinazoline group, a cinnoline group, a phenanthridine group, a phenanthroline group, a phenazine group, a benzimidazole group, an isobenzothiazole group, a benzoxazole group, a benzoisoxazole group, a triazole group, a tetrazole group, an oxadiazole group, a triazine group, a thiadiazole group, an imidazopyridine group, an imidazopyrimidine group, an azaindene group, an azaindole group, an azabenzofuran group, an azabenzothiophene group, an azabenzosilole group, an azafluorene group, an azacarbazole group, an azadibenzofuran group, an azadibenzothiophene group, or azadibenzosilole group, each unsubstituted or substituted with deuterium, —F, —Cl, —Br, —I, a hydroxyl group, a cyano group, a nitro group, a $C_1$-$C_{20}$ alkyl group, a $C_1$-$C_{20}$ alkoxy group, a phenyl group, a naphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a dibenzofuranyl group, a dibenzothiophenyl group, a carbazolyl group, an imidazolyl group, a pyrazolyl group, a thiazolyl group, an isothiazolyl group, an oxazolyl group, an isoxazolyl group, a pyridinyl group, a pyrazinyl group, a pyridazinyl group, a pyrimidinyl group, an indazolyl group, a purinyl group, a quinolinyl group, an isoquinolinyl group, a benzoquinolinyl group, a benzoisoquinolinyl group, a phthalazinyl group, a naphthyridinyl group, a quinoxalinyl group, a benzoquinoxalinyl group, a quinazolinyl group, a cinnolinyl group, a phenanthridinyl group, a phenanthrolinyl group, a phenazinyl group, a benzimidazolyl group, a benzoisothiazolyl group, a benzoxazolyl group, an isobenzoxazolyl group, a triazolyl group, a tetrazolyl group, an oxadiazolyl group, a triazinyl group, a thiadiazolyl group, an imidazopyridinyl group, an imidazopyrimidinyl group, an azaindenyl group, an azaindolyl group, an azabenzofuranyl group, an azabenzothiophenyl group, an azabenzosilolyl group, an azafluorenyl group, an azacarbazolyl group, an azadibenzofuranyl group, an azadibenzothiophenyl group, an azadibenzosilolyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), —P(=O)($Q_{31}$)($Q_{32}$), or any combination thereof, wherein $Q_{31}$ to $Q_{33}$ may each independently be a $C_1$-$C_{10}$ alkyl group, a $C_1$-$C_{10}$ alkoxy group, a phenyl group, a phenyl group substituted with a $C_1$-$C_{10}$ alkyl group, a biphenyl group, a terphenyl group, or a naphthyl group.

In an embodiment, at least one of $A_{21}$, $A_{22}$, $L_{21}$ to $L_{23}$, and $Ar_{21}$ to $Ar_{23}$ in Formula 2-1 may be an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinoline group, a phthalazine group, a naphthyridine group, a quinoxaline group, a benzoquinoxaline group, a quinazoline group, a cinnoline group, a phenanthridine group, a phenanthroline group, a phenazine group, a benzimidazole group, an isobenzothiazole group, a benzoxazole group, a benzoisoxazole group, a triazole group, a tetrazole group, an oxadiazole group, a triazine group, a thiadiazole group, an imidazopyridine group, an imidazopyrimidine group, an azaindene group, an azaindole group, an azabenzofuran group, an azabenzothiophene group, an azabenzosilole group, an azafluorene group, an azacarbazole group, an azadibenzofuran group, an azadibenzothiophene group, or an azadibenzosilole group.

For example, when at least one of $L_{21}$ to $L_{23}$ in Formula 2-1 includes a π electron-deficient nitrogen-containing $C_1$-$C_{60}$ cyclic group, a divalent group, a trivalent group, or a tetravalent group of the aforementioned group may be included. For example, when at least one of $Ar_{21}$ to $Ar_{23}$ includes a π electron-deficient nitrogen-containing $C_1$-$C_{60}$ cyclic group, a monovalent group of the aforementioned group may be included.

In an embodiment, at least one of $R_{22}$ to $R_{25}$ in Formula 2-3 may be:

—F, —CFH$_2$, —CF$_2$H, —CF$_3$, —CN, and —NO$_2$;

a $C_1$-$C_{60}$ alkyl group substituted with at least one selected from —F, —CFH$_2$, —CF$_2$H, —CF$_3$, —CN, and —NO$_2$, or a π electron-deficient nitrogen-containing $C_1$-$C_{60}$ cyclic group unsubstituted or substituted with at least one $R_{10a}$.

In an embodiment, the second compound may be one of Compounds 2-1 to 2-29, but embodiments are not limited thereto:

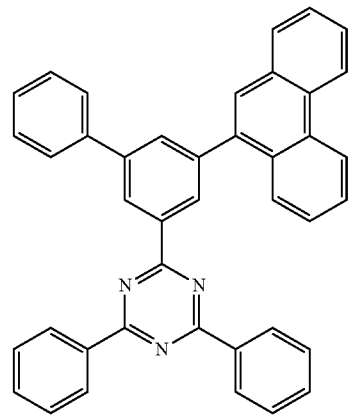

2-1

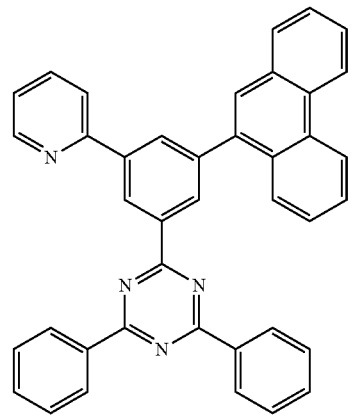

2-2

2-3
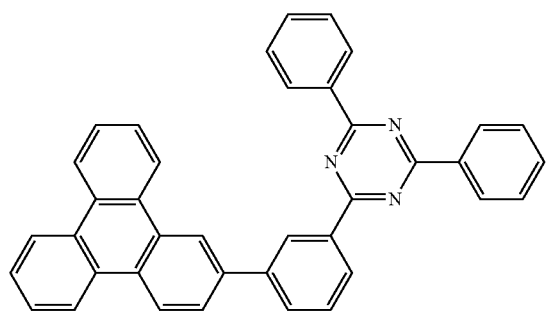
2-4
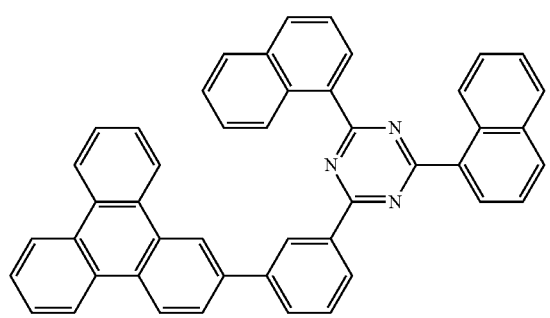
2-5
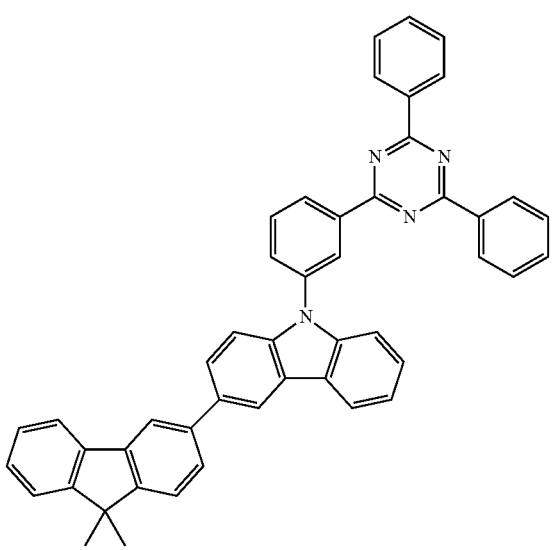
2-6
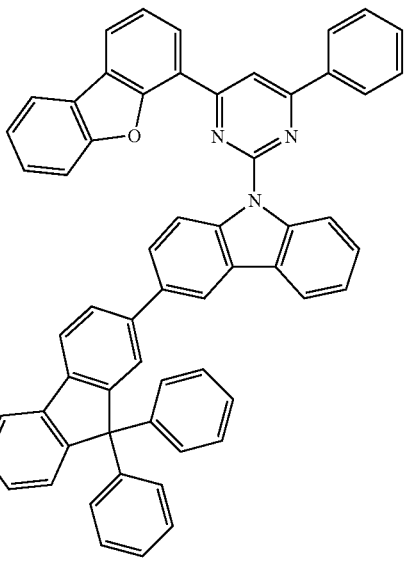
2-7
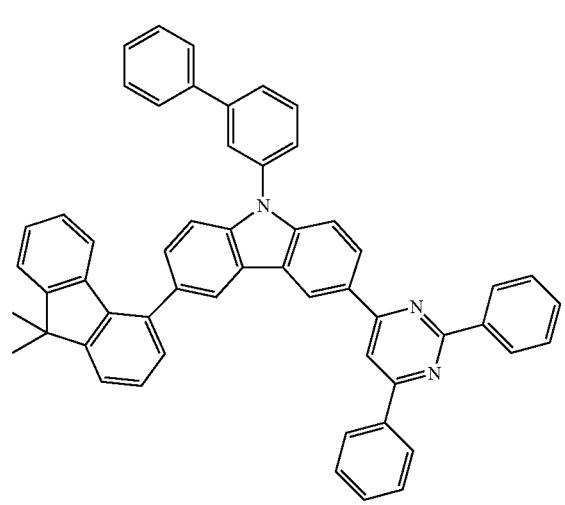
2-8
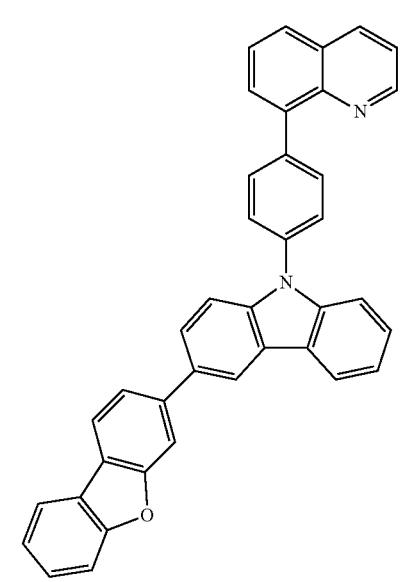

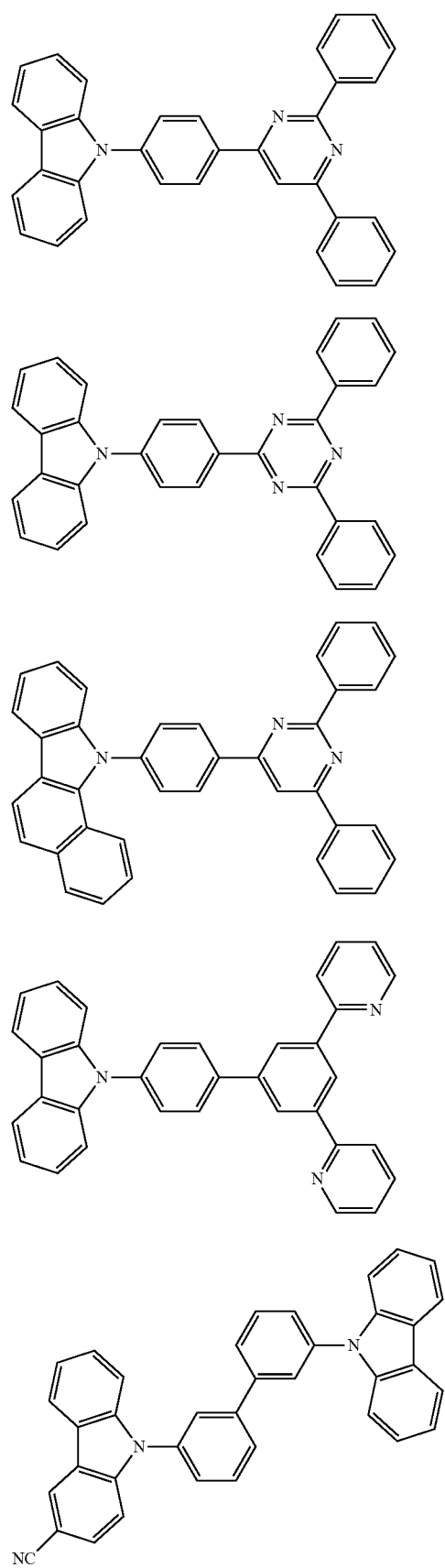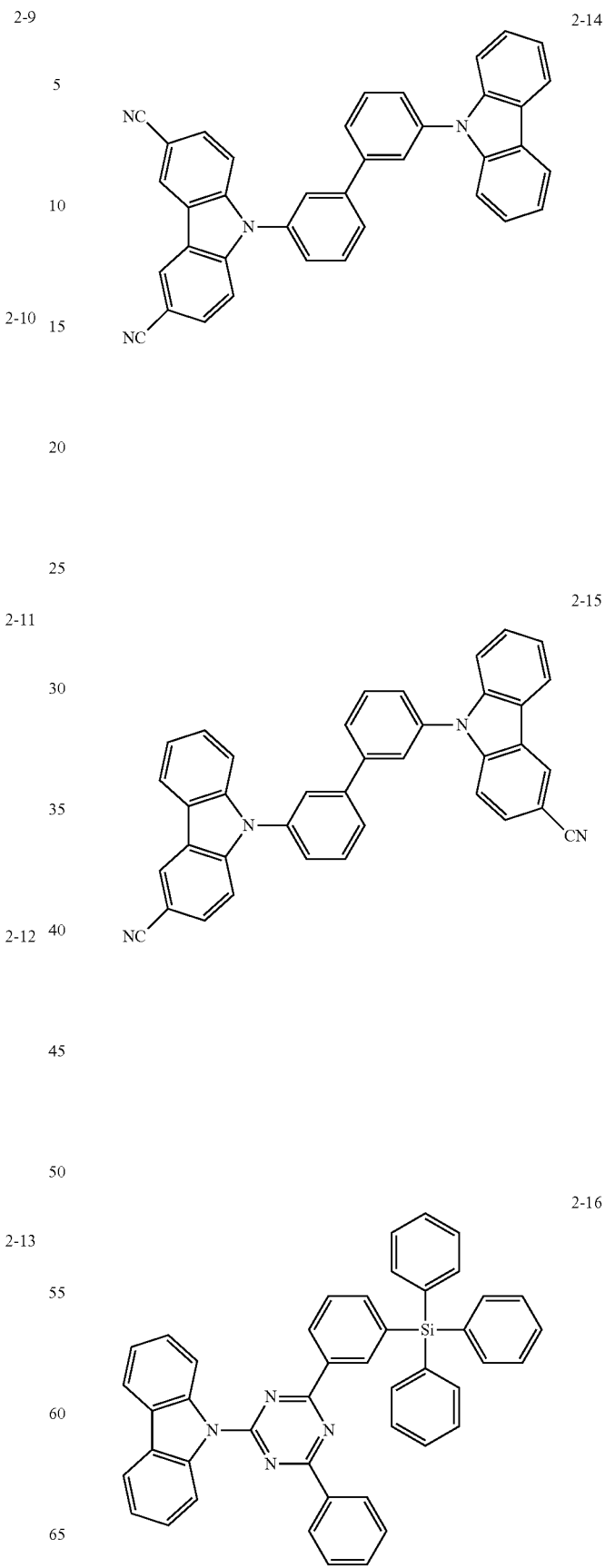

-continued
2-17
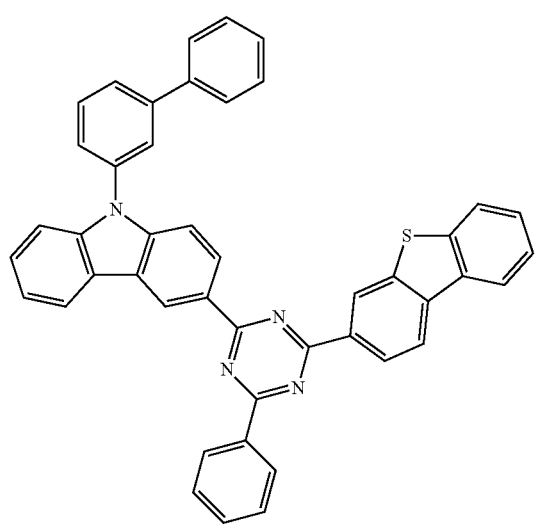
2-18
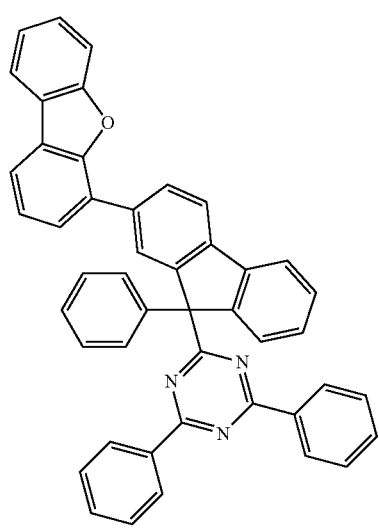
2-19
2-20
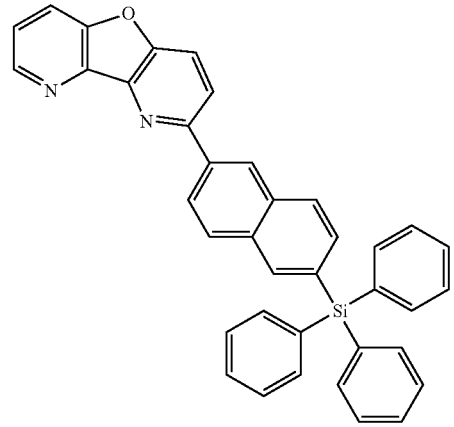
2-21
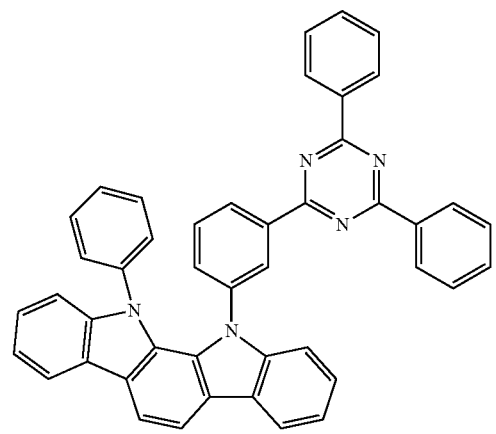
2-22
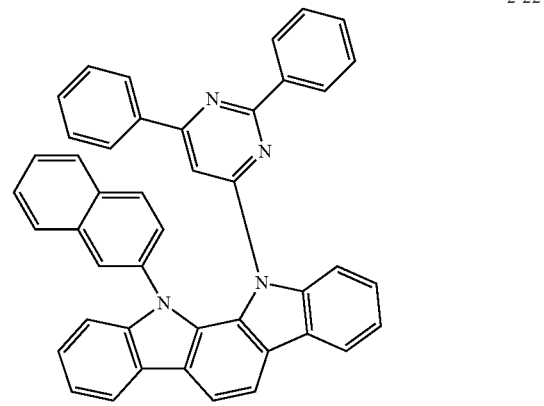

2-23
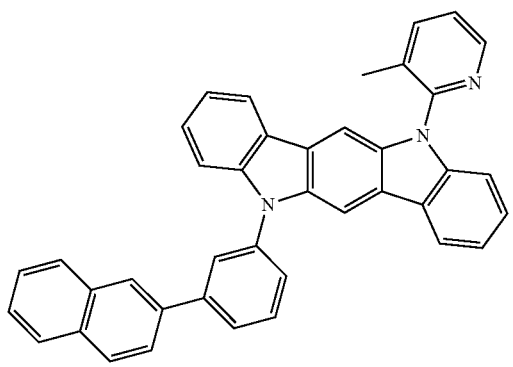
2-24
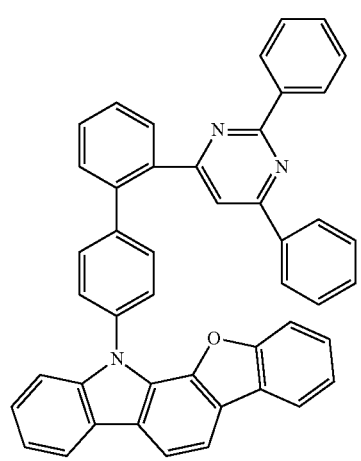
2-25
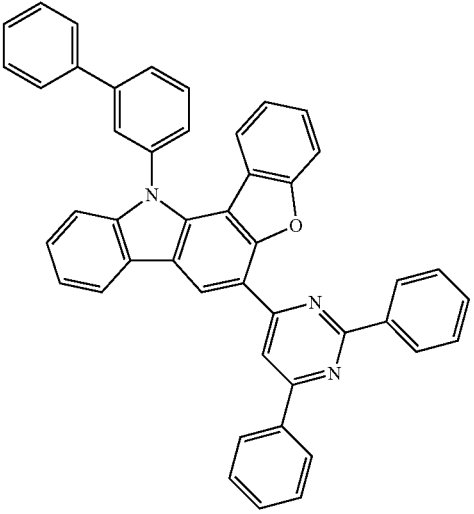
2-26
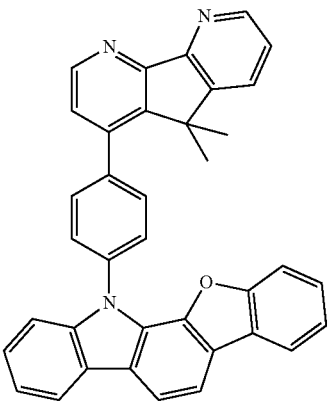
2-27
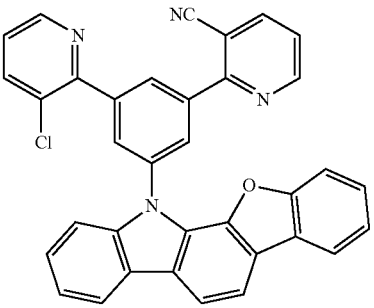
2-28
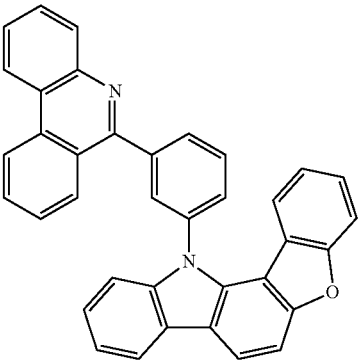
2-29
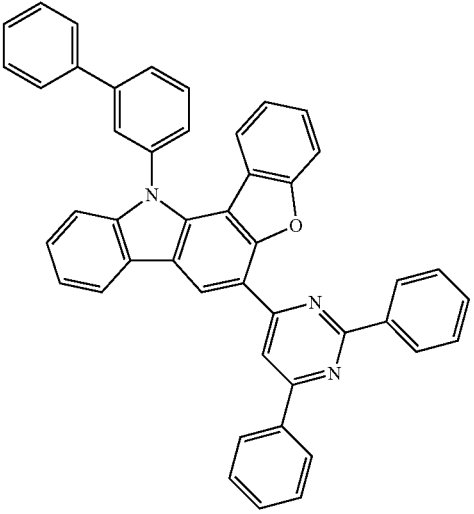
In an embodiment, the second compound in the emission layer 133 may have a triplet energy (T1) level equal to or greater than about 2.85 eV. The second compound may have a triplet energy level suitable for being used as, for example, a blue host, and thus, the light-emitting device 10 may have high efficiency and long lifespan.

In the light-emitting device 10, because the emission layer 133 may include a co-host of the first compound and the second compound, the charge balance of the emission layer 133 may be improved, and an emission zone being formed inside the emission layer 133 may be expanded, thereby improving emission efficiency and lifespan.

In an embodiment, the light-emitting dopant in the emission layer 133 may include a first dopant, a second dopant, or any combination thereof, wherein the first dopant may be a phosphorescent dopant, and the second dopant may be a thermally activated delayed fluorescence dopant satisfying Equation 1.

$$\Delta E_{ST} = E(S1) - E(T1) \leq 0.3 \text{ eV} \qquad \text{[Equation 1]}$$

In Equation 1, E(S1) may be the lowest excitation singlet energy level (eV) of the thermally activated delayed fluorescence dopant, and E(T1) may be the lowest excitation triplet energy level (eV) of the thermally activated delayed fluorescence dopant.

For example, the first dopant may include a compound represented by Formula 3:

$$M_{31}(L_{31})_{n31}(L_{32})_{n32} \qquad \text{[Formula 3]}$$

In Formula 3, $M_{31}$ may be a first-row transition metal of the Periodic Table of Elements, a second-row transition metal of the Periodic Table of Elements, or a third-row transition metal of the Periodic Table of Elements, $L_{31}$ may be a ligand represented by Formula 3A, a ligand represented by Formula 3B, or a ligand represented by Formula 3C, and when n31 is 2 or more, two or more of $L_{31}(s)$ may be identical to or different from each other, $L_{32}$ may be a monodentate ligand, a bidentate ligand, or a tridentate ligand, and when n32 is 2 or more, two or more of $L_{32}(s)$ may be identical to or different from each other, n31 may be an integer from 1 to 3, and n32 may be an integer from 0 to 4.

In an embodiment, $M_{31}$ in Formula 3 may be iridium (Ir), platinum (Pt), osmium (Os), ruthenium (Ru), rhodium (Rh), palladium (Pd), copper(Cu), silver (Ag), gold (Au), titanium (Ti), zirconium (Zr), hafnium (Hf), europium (Eu), terbium (Tb), or thulium (Tm).

For example, $M_{31}$ in Formula 3 may be Ir or Pt.

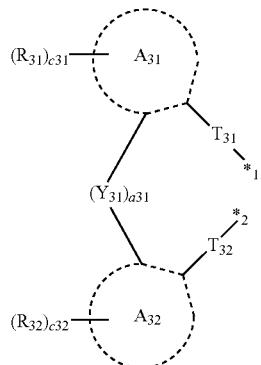
[Formula 3A]

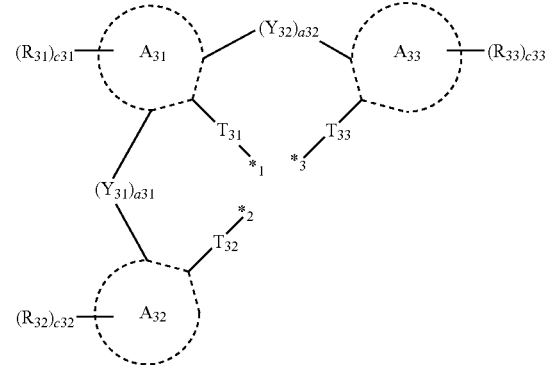
[Formula 3B]

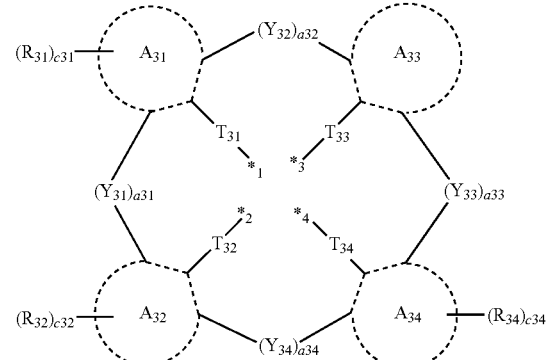
[Formula 3C]

In Formulae 3A to 3C, $A_{31}$ to $A_{34}$ may each independently be a $C_3$-$C_{60}$ carbocyclic group or $C_1$-$C_{60}$ heterocyclic group, $Y_{31}$ to $Y_{34}$ may each independently be a single bond, a double bond, a $C_6$-$C_{30}$ arylene group unsubstituted or substituted with at least one $R_{10a}$, a $C_1$-$C_{30}$ heteroarylene group unsubstituted or substituted with at least one $R_{10a}$, *—O—*', *—S—*', *—C(=O)—*', *—S(=O)—*', *—C(R_{35})(R_{36})—*', *—C(R_{35})=C(R_{36})—*', *—C(R_{35})=*', *—Si(R_{35})(R_{36})—*', *—B(R_{35})—*', *—N(R_{35})—*', or *—P(R_{35})—*', a31 to a33 may each independently be an integer from 1 to 3, a34 may be an integer from 0 to 3, when a34 is 0, $A_{32}$ and $A_{34}$ may not be linked to each other, $T_{31}$ to $T_{34}$ may each independently be a chemical bond, *—O—*', *—S—*', *—B(R_{37})—*', *—N(R_{37})—*', *—P(R_{37})—*', *—C(R_{37})(R_{38})—*', *—Si(R_{37})(R_{38})—*', *—Ge(R_{37})(R_{38})—*', *—C(=O)—*', or *—C(=S)—*',

*$_1$, *$_2$, *$_3$, and *$_4$ each indicate a binding site to $M_{31}$, $R_{31}$ to $R_{38}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), —P(=O)($Q_1$)($Q_2$), neighboring groups of $R_{31}$ to $R_{38}$ and $Y_{31}$ to $Y_{34}$ may be optionally linked to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, c31 to c34 may each independently be an integer from 0 to 10, and $R_{10a}$ may be the same as described in the specification.

In an embodiment, $A_{31}$ to $A_{34}$ in Formula 3A to 3C may each independently be a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, a selenophene group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group.

In an embodiment, $Y_{31}$ to $Y_{34}$ in Formula 3A to 3C may each independently be a single bond, a double bond, *—O—*', *—S—*', *—C($R_{35}$)($R_{36}$)—*', or *—N($R_{35}$)—*'.

In an embodiment, $R_{31}$ to $R_{38}$ in Formula 3A to 3C may each independently be:

hydrogen, deuterium, —F, —Cl, —Br, —I, a hydroxyl group, a cyano group, or a nitro group;

a $C_1$-$C_{20}$ alkyl group or a $C_1$-$C_{20}$ alkoxy group unsubstituted or substituted with deuterium, —F, —Cl, —Br, —I, a cyano group, a phenyl group, a biphenyl group, or any combination thereof; or a cyclopentyl group, a cyclohexyl group, a cycloheptyl group, a cyclopentenyl group, a cyclohexenyl group, a phenyl group, a biphenyl group, a terphenyl group, a naphthyl group, a fluorenyl group, a spiro-bifluorenyl group, a spiro-fluorene-benzofluorenyl group, a benzofluorenyl group, a dibenzofluorenyl group, a pyrenyl group, a phenalenyl group, a phenanthrenyl group, an anthracenyl group, a fluoranthenyl group, a triphenylenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, or an azadibenzosilolyl group, each unsubstituted or substituted with deuterium, —F, —Cl, —Br, —I, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a naphthyl group, a fluorenyl group, a spiro-bifluorenyl group, a spiro-fluorene-benzofluorenyl group, a benzofluorenyl group, a dibenzofluorenyl group, a pyrenyl group, a phenalenyl group, a phenanthrenyl group, an anthracenyl group, a fluoranthenyl group, a triphenylenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, a biphenyl group, a terphenyl group, or any combination thereof, wherein $Q_1$ to $Q_3$ may each independently be hydrogen, deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, or a terphenyl group.

$L_{32}$ in Formula 3 may be an organic ligand. For example, $L_{32}$ may include a halogen group, a diketone group (for example, an acetylacetonate group), a carboxylic acid group (for example, a picolinate group), —C(=O), an isonitrile group, a —CN group, a phosphorus group (for example, a phosphine group, a phosphite group, etc.), or any combination thereof.

In an embodiment, the first dopant may include a compound represented by Formula 3-1, a compound represented by Formula 3-2, or any combination thereof:

[Formula 3-1]

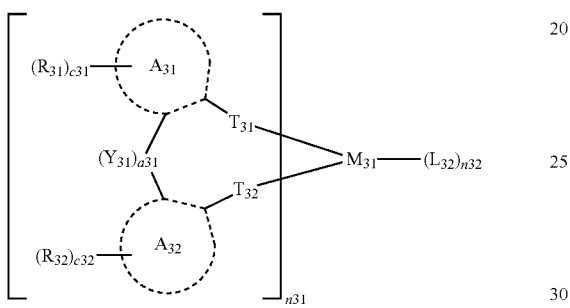

[Formula 3-2]

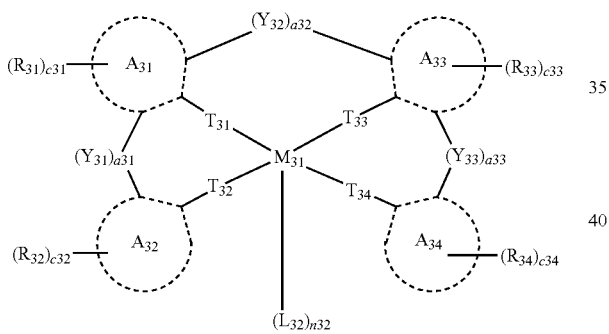

In Formulae 3-1 and 3-2, $M_{31}$, $L_{32}$, n31, n32, $A_{31}$ to $A_{34}$, $Y_{31}$ to $Y_{33}$, a31 to a33, $T_{31}$ to $T_{34}$, $R_{31}$ to $R_{34}$, and c31 to c34 may be the same as described in the specification.

In an embodiment, $M_{31}$ in Formula 3-1 may be Ir.

In an embodiment, $M_{31}$ in Formula 3-2 may be Pt.

For example, the first dopant may be one of Compounds 3-1 to 3-8, but embodiments are not limited thereto:

3-1

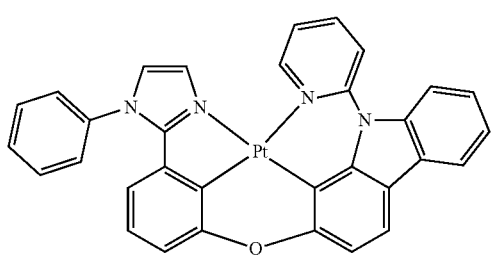

3-2

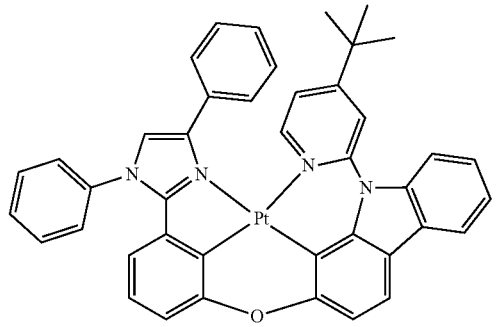

3-3

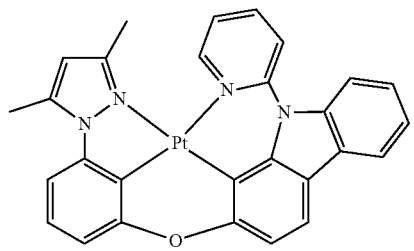

3-4

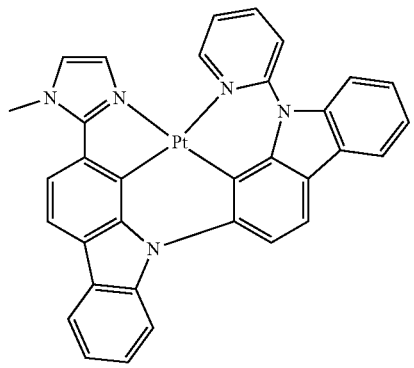

3-5

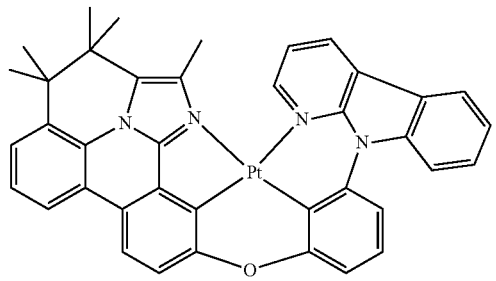

3-6

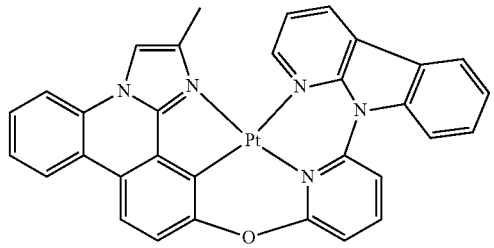

-continued

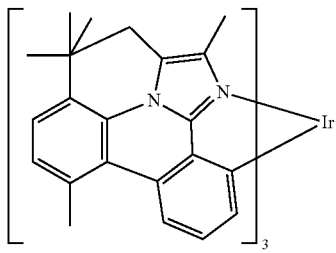

3-7

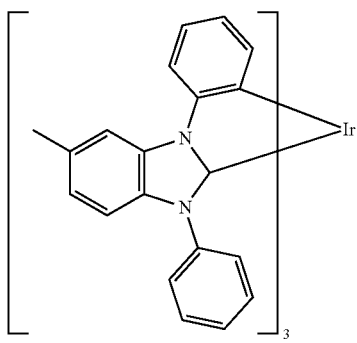

3-8

In an embodiment, the second dopant may include a compound represented by Formula 4-1, a compound represented by Formula 4-2, a compound represented by Formula 4-3, a compound represented by Formula 4-4, a compound represented by Formula 4-5, or any combination thereof:

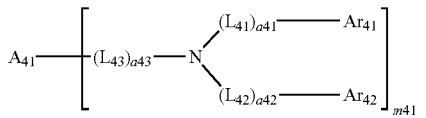

[Formula 4-1]

In Formula 4-1, $A_{41}$ and $L_{41}$ to $L_{43}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, a41 to a43 may each independently be an integer from 0 to 3, $Ar_{41}$ and $Ar_{42}$ may each independently be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, or a $C_6$-$C_{60}$ arylthio group unsubstituted or substituted with at least one $R_{10a}$, and m41 may be an integer from 1 to 6.

In an embodiment, $A_{41}$ in Formula 4-1 may be a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, or an indenophenanthrene group; or a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, or an indenophenanthrene group, each substituted with at least one of deuterium, —F, —Cl, —Br, —I, a hydroxyl group, a cyano group, a nitro group, a $C_1$-$C_{20}$ alkyl group, a $C_1$-$C_{20}$ alkoxy group, a phenyl group, a biphenyl group, a terphenyl group, and a naphthyl group.

In an embodiment, $L_{41}$ to $L_{43}$ in Formula 4-1 may each independently be:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, or a pyridinylene group; or a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, or a pyridinylene group, each substituted with at least one selected from deuterium, —F, —Cl, —Br, —I, a hydroxyl group, a cyano group, a nitro group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

In an embodiment, $Ar_{41}$ and $Ar_{42}$ in Formula 4-1 may each independently be:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, or a pyridinyl group, each unsubstituted or substituted with deuterium, —F, —Cl, —Br, —I, a hydroxyl group, a cyano group, a nitro group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), or any combination thereof, wherein $Q_{31}$ to $Q_{33}$ may each independently be hydrogen, deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, or a terphenyl group.

For example, m41 in Formula 4-1 may be 2, but embodiments are not limited thereto.

[Formula 4-2]

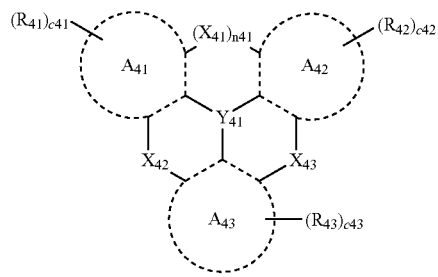

[Formula 4-3]

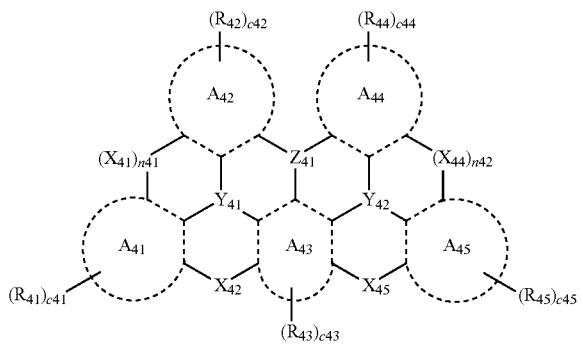

[Formula 4-4]

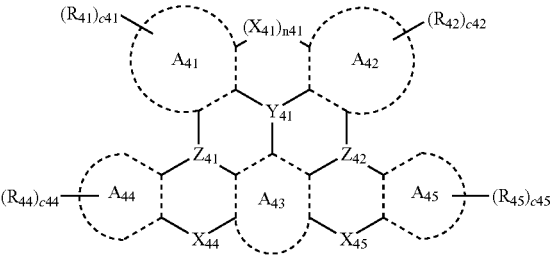

[Formula 4-5]

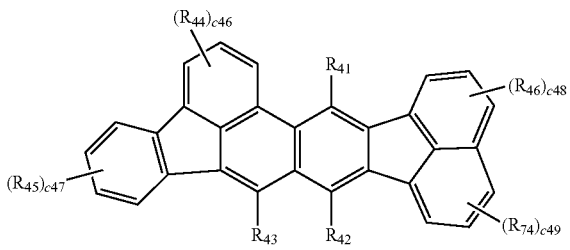

In Formulae 4-2 to 4-5, $X_{41}$ to $X_{45}$ may each independently be a single bond, O, S, N($R_{46}$), C($R_{46}$)($R_{47}$), or Si($R_{46}$)($R_{47}$), $Y_{41}$ and $Y_{42}$ may each independently be N, B, or P, $Z_{41}$ and $Z_{42}$ may each independently be N, C($R_{46}$), or Si($R_{46}$), n41 and n42 may each independently be 0, 1, or 2, and when n41 is 0, $A_{41}$ and $A_{42}$ may not be linked to each other, and when n42 is 0, $A_{44}$ and $A_{45}$ may not be linked to each other, $A_{41}$ to $A_{45}$ may each independently be a $C_3$-$C_{60}$ carbocyclic group or a $C_1$-$C_{60}$ heterocyclic group, $R_{41}$ to $R_{47}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), c41 to c45 may each independently be an integer from 1 to 10, c46, c48, and c49 may each independently be an integer from 1 to 3, and c47 may be an integer from 1 to 4.

$R_{10a}$ and $Q_1$ to $Q_3$ may each be the same as described in the specification.

In an embodiment, the second dopant may be one of Compounds 4-1 to 4-12, but embodiments are not limited thereto.

-continued
4-1
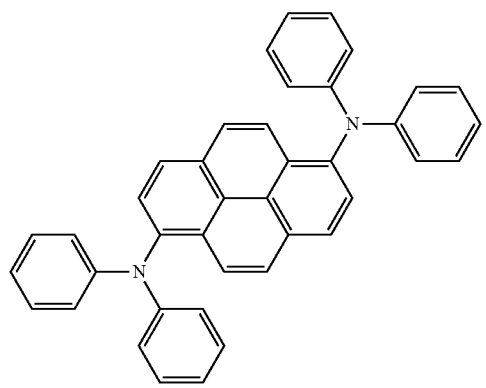
4-5
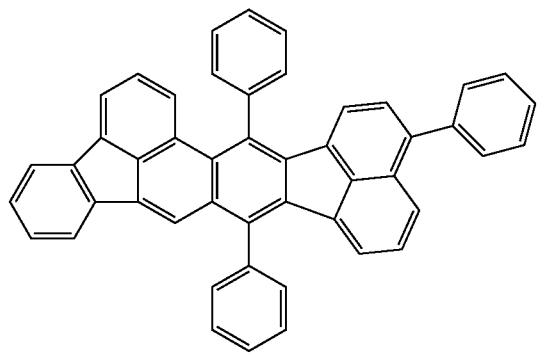
4-2
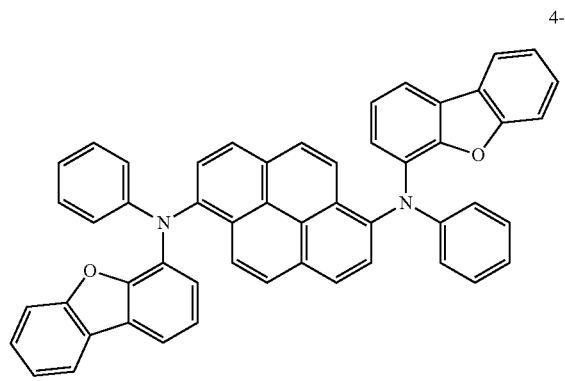
4-6
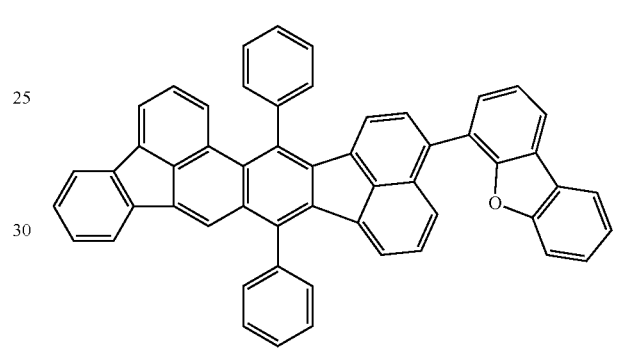
4-3
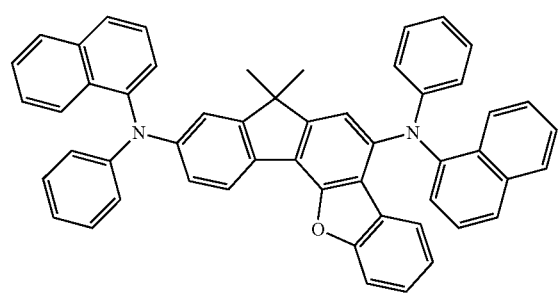
4-7
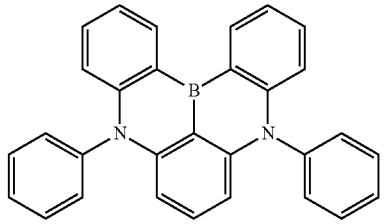
4-4
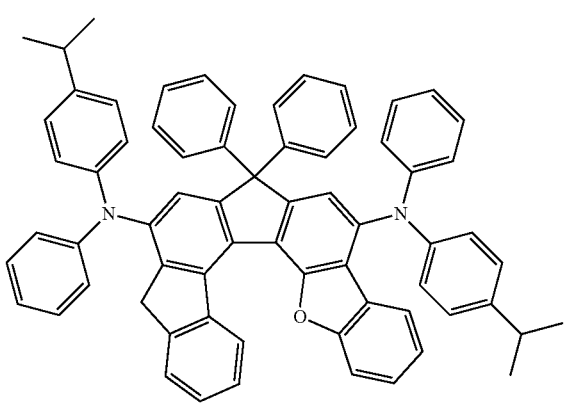
4-8
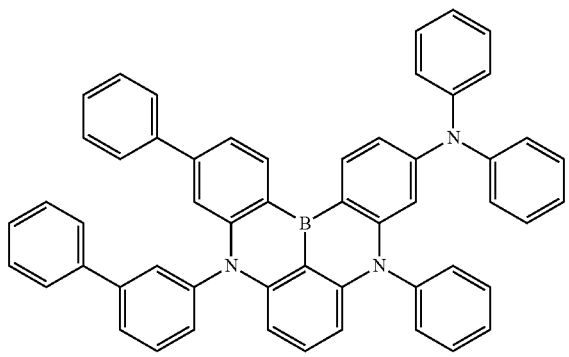

4-9

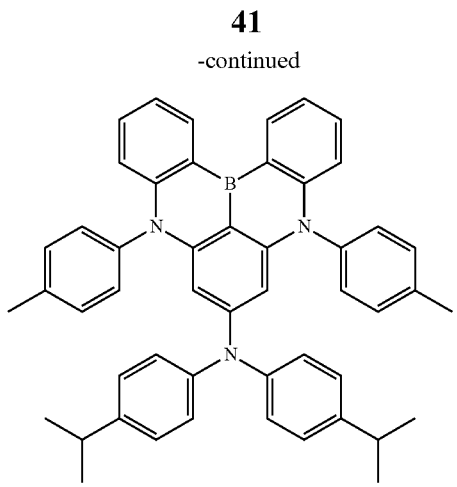

4-10

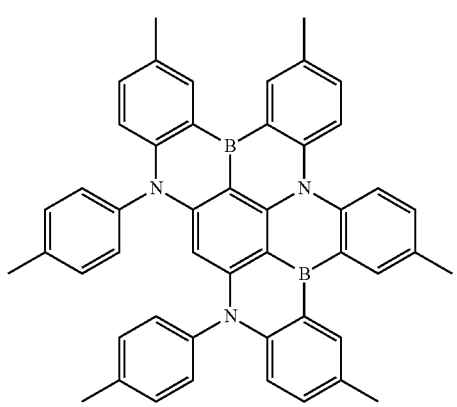

4-11

4-12

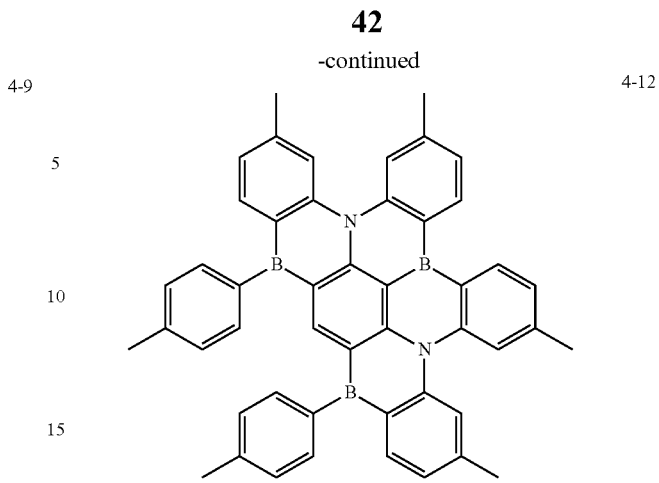

In an embodiment, a full width at half maximum (FWHM) of the second dopant may be in a range of about 5 nm to about 35 nm, but embodiments are not limited thereto. For example, the FWHM of the second dopant may be obtained from the PL spectrum of the second dopant.

In an embodiment, the light-emitting dopant in the emission layer 133 may include the first dopant.

In an embodiment, the light-emitting dopant in the emission layer 133 may include the second dopant.

In an embodiment, the light-emitting dopant in the emission layer 133 may include the first dopant, the second dopant, or any combination thereof, and may further include a fluorescence dopant.

The fluorescence dopant may include an amine group-containing compound, a styryl group-containing compound, or any combination thereof.

In embodiments, the fluorescence dopant may include a compound represented by Formula 501:

[Formula 501]

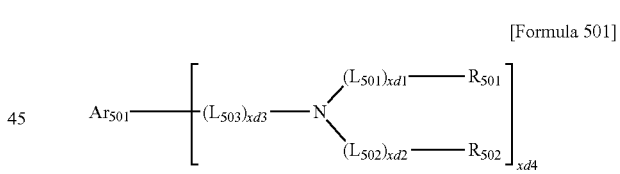

In Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, xd4 may be 1, 2, 3, 4, 5, or 6.

In embodiments, $Ar_{501}$ in Formula 501 may be a condensed cyclic group (for example, an anthracene group, a chrysene group, or a pyrene group) in which three or more monocyclic groups are condensed together.

In embodiments, xd4 in Formula 501 may be 2.

In embodiments, the fluorescence dopant may include one of Compounds FD1 to FD36, DPVBi, DPAVBi, or any combination thereof:

43
44
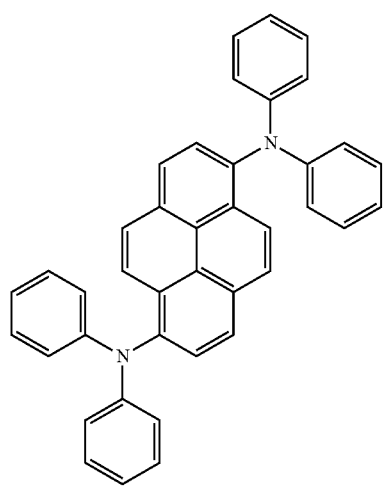
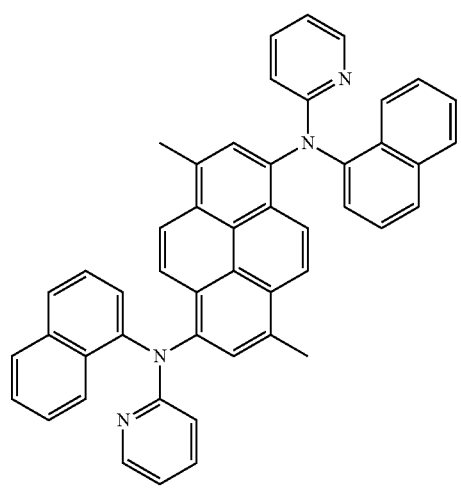
FD1
FD2
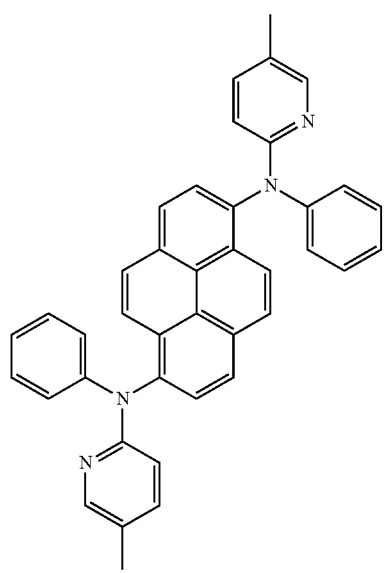
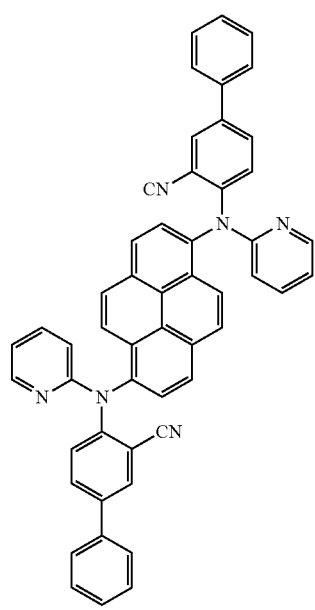
FD3
FD4
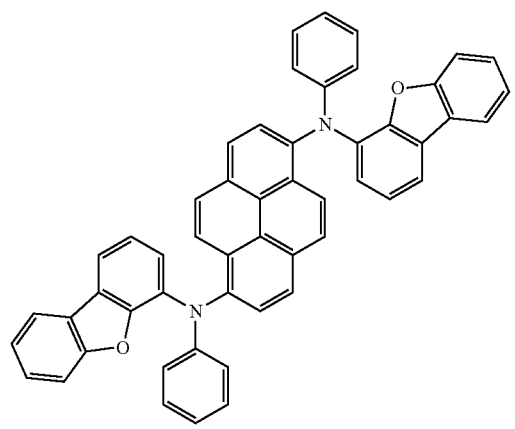
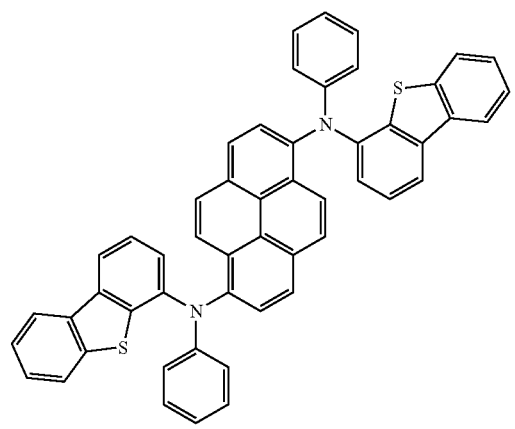
FD5
FD6

-continued
FD7
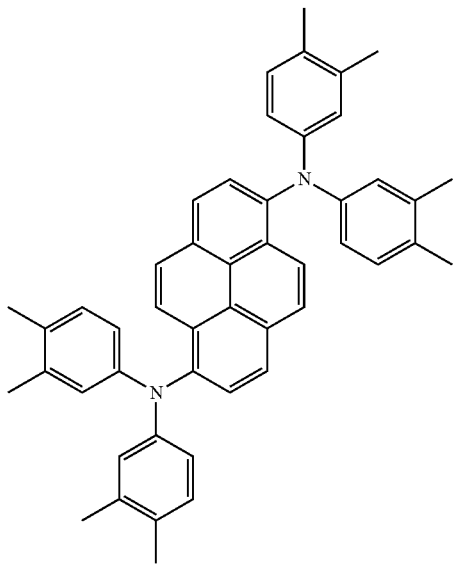
FD8
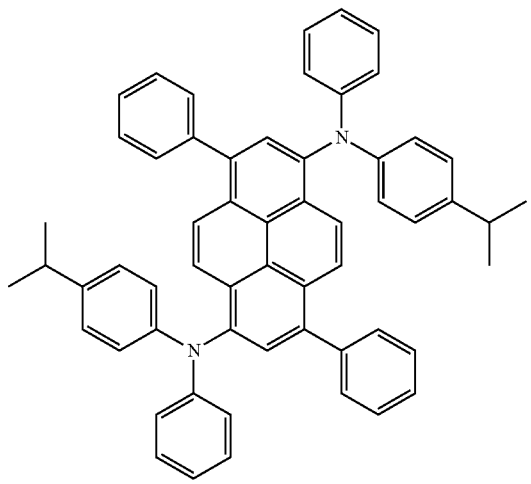
FD9
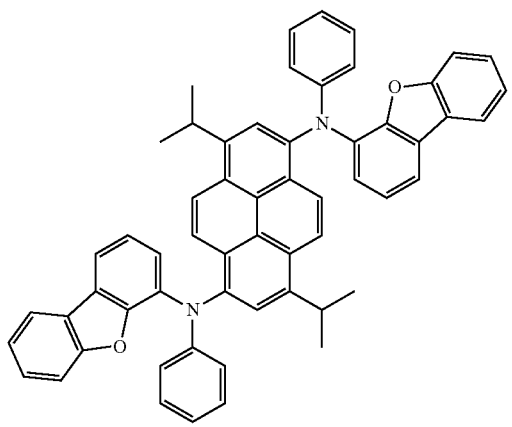
FD10
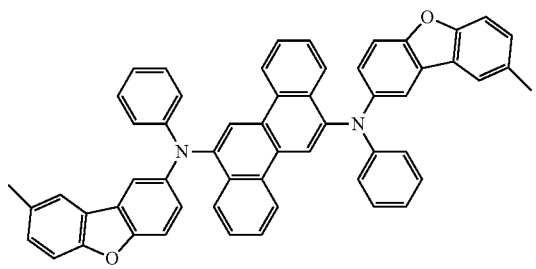
FD11
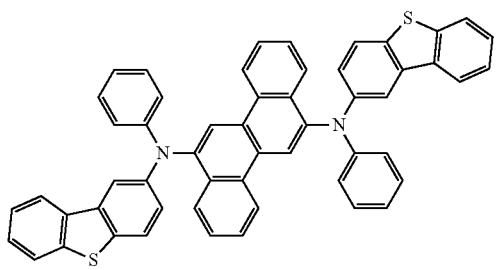
FD12
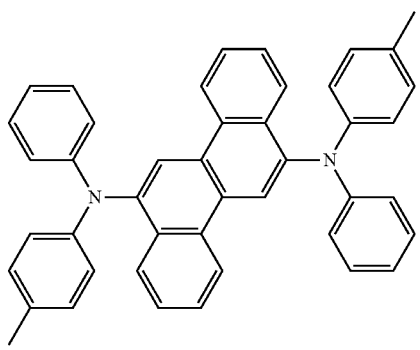
FD13
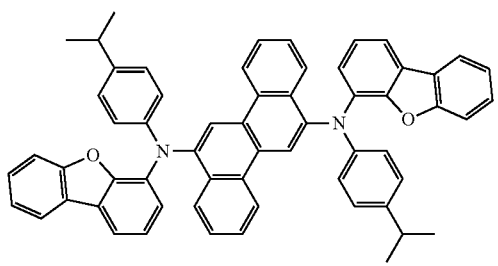
FD14
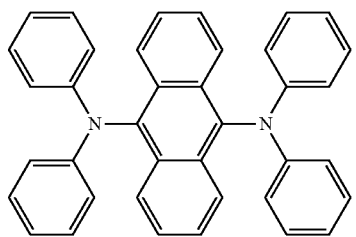

-continued
FD15
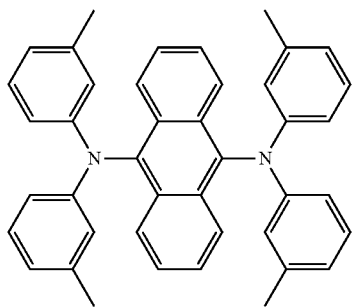
FD16
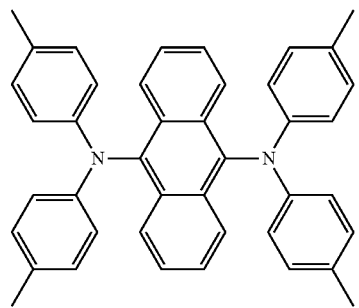
FD17
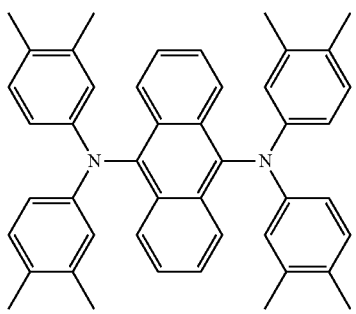
FD18
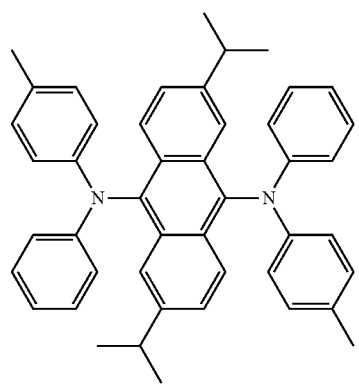
FD19
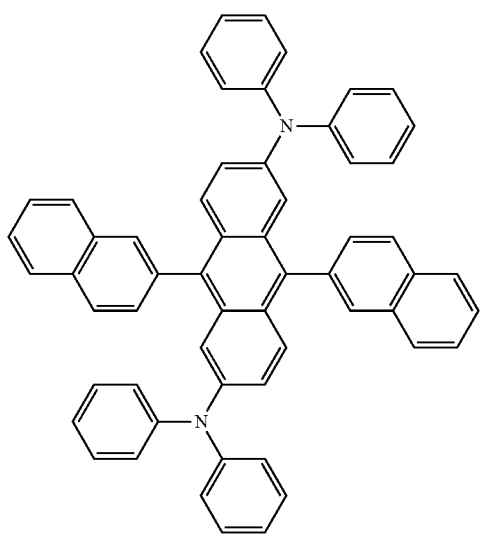
FD20
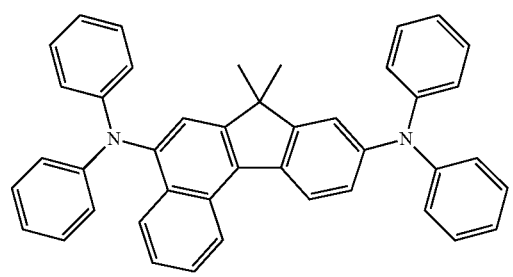
FD21
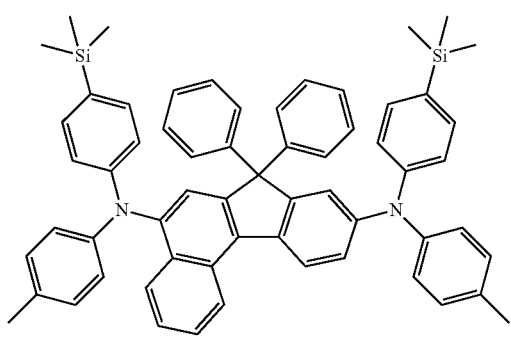
FD22
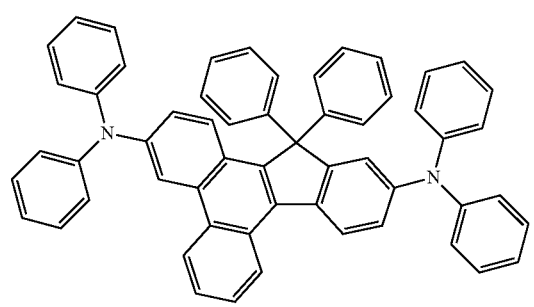

-continued
FD23
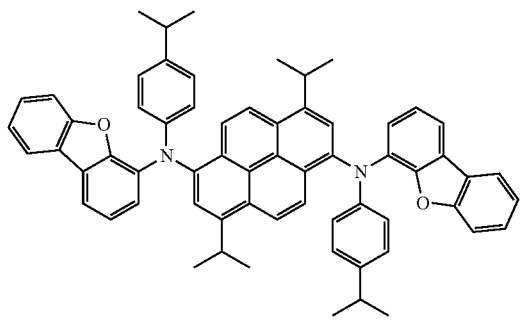
FD24
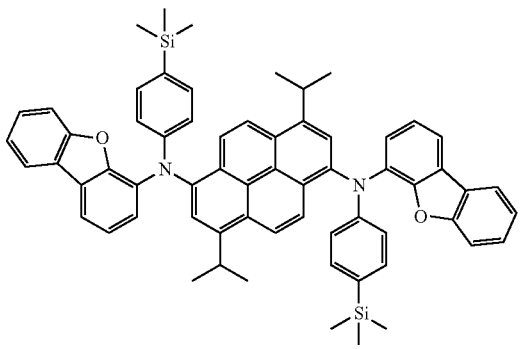
FD25
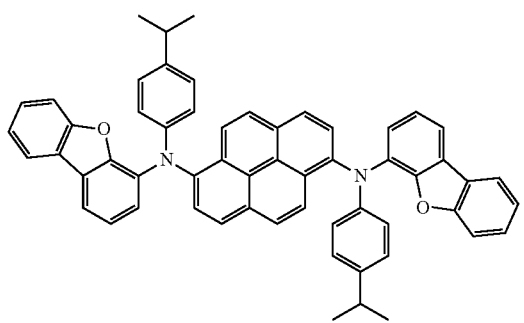
FD26
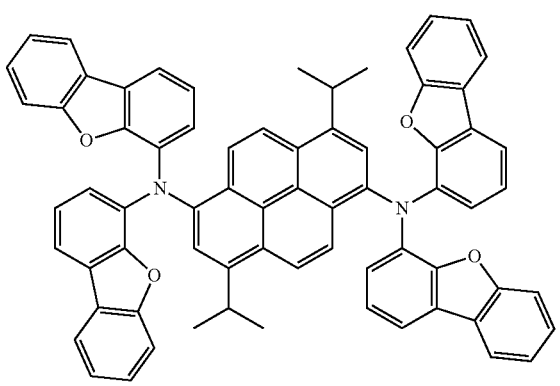
FD27
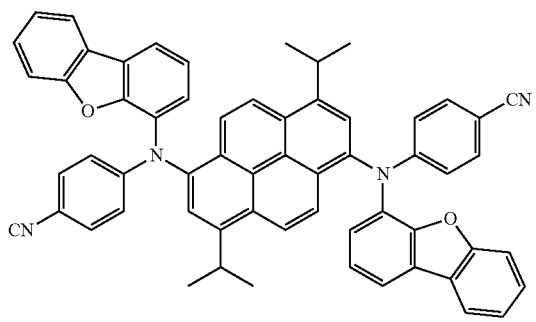
FD28
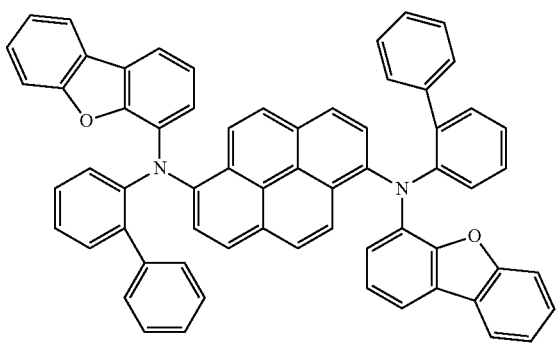
FD29
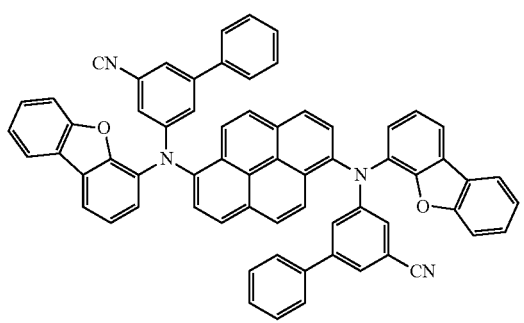
FD30
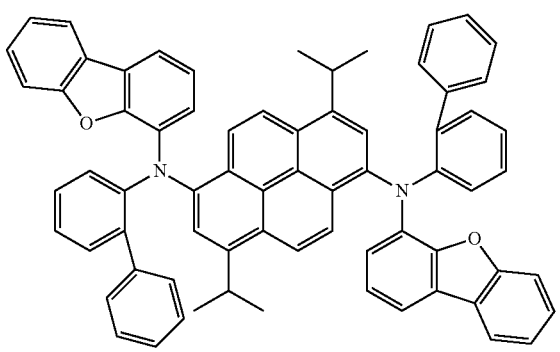

-continued
FD31
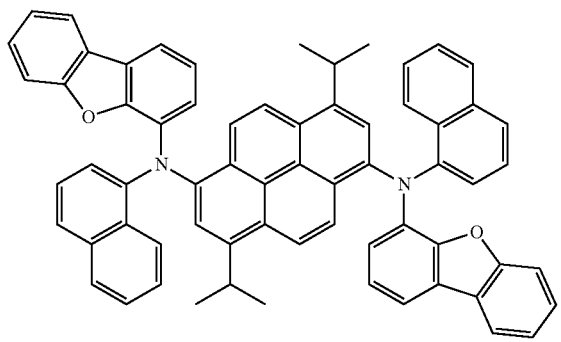
FD32
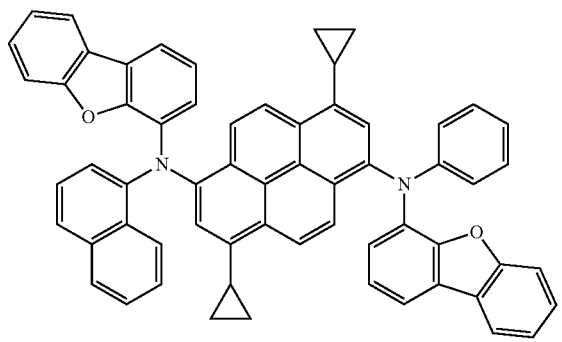
FD33
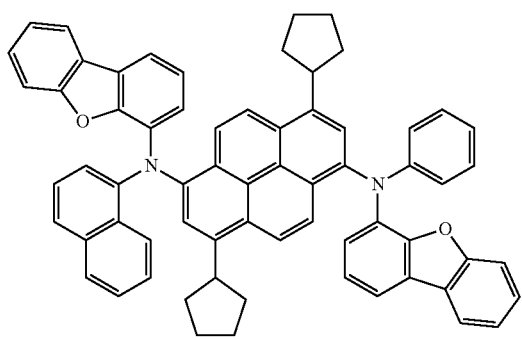
FD34
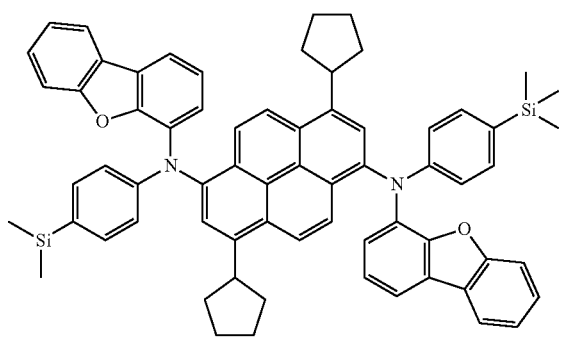
FD35
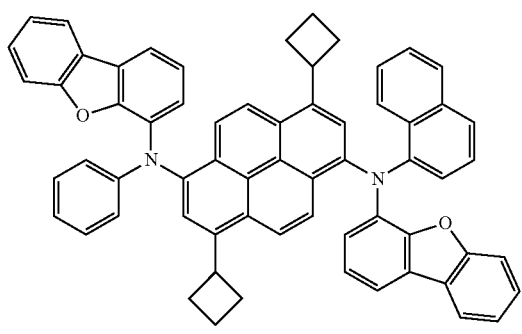
FD36
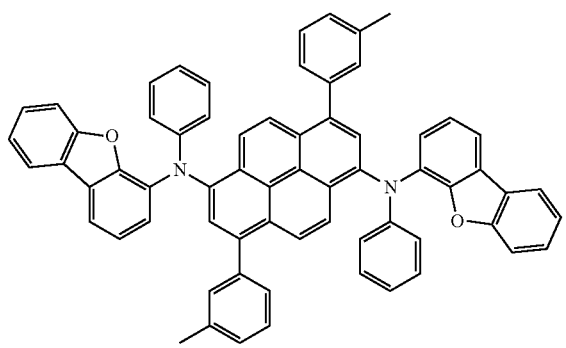
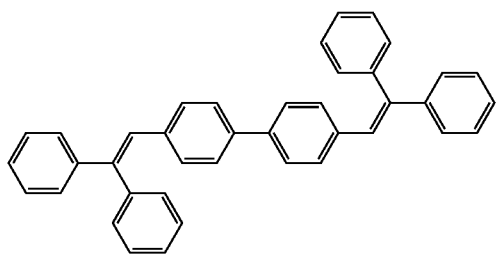
DPVBi

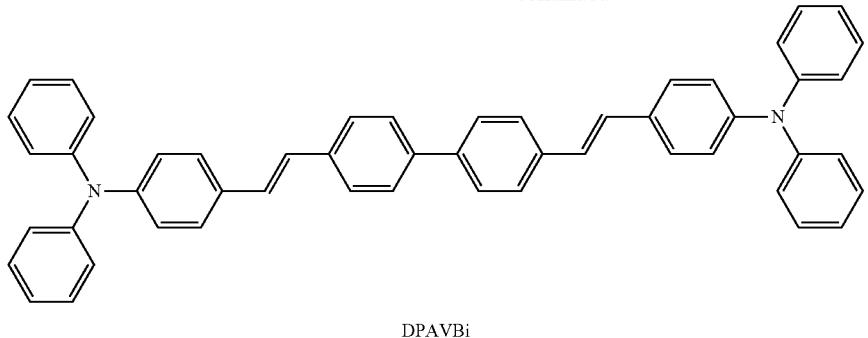
DPAVBi

In an embodiment, the first compound and the second compound in the emission layer 133 may not substantially emit light.

For example, the light-emitting dopant in the emission layer 133 may emit light. When the light-emitting dopant includes the first dopant, the second dopant, or any combination thereof, the first dopant, the second dopant, or any combination thereof may emit light.

For example, the light-emitting dopant in the emission layer 133 may receive energy from a formed exciton and may emit blue delayed fluorescence or blue phosphorescence, without directly participating in forming excitons.

In an embodiment, light having a maximum emission wavelength in a range of about 440 nm to about 470 nm may be emitted from the emission layer 133.

[n-Doping Layer 133N]

The interlayer 130 may include an n-doping layer 133N between the emission layer 133 and the second electrode 150.

The n-doping layer 133N may include a third compound and an n-dopant, and may not include a light-emitting dopant.

When the n-doping layer 133N includes the light-emitting dopant of the emission layer, the third compound and the light-emitting dopant may form an exciplex, and excitons formed in the emission layer may be diffused into the n-doping layer 133N, thereby hindering the light-emitting dopant included in the emission layer from emitting light. However, in the light-emitting device 10 according to an embodiment, because the n-doping layer 133N does not include the light-emitting dopant, most of the excitons formed in the emission layer 133 may be used in emitting light, and thus the emission efficiency of the light-emitting device 10 may be improved.

The third compound in the n-doping layer 133N may include an electron transport host, a bipolar host, or any combination thereof. The third compound included in the n-doping layer 133N and the second compound included in the emission layer 133 may be identical to or different from each other.

The electron transport host and the bipolar host of the third compound may be the same as described in the specification.

For example, the third compound may include a compound represented by Formula 2-1, a compound represented by Formula 2-2, a compound represented by Formula 2-3, or any combination thereof.

In an embodiment, the third compound included in the n-doping layer 133N and the second compound included in the emission layer 133 may be identical to each other.

For example, the third compound may be one of Compounds 2-1 to 2-29, but embodiments are not limited thereto:

2-1

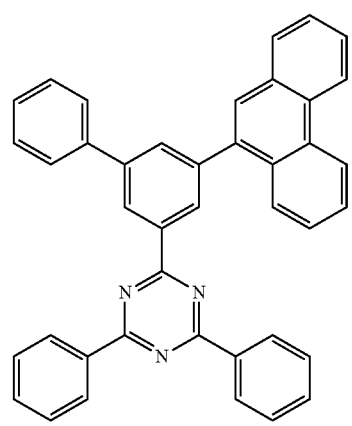

2-2

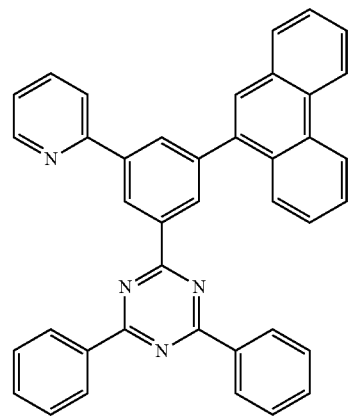

-continued
2-3
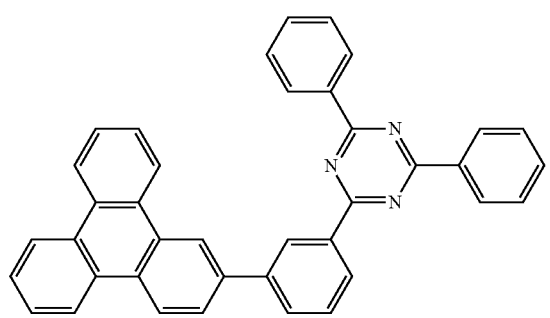
2-4
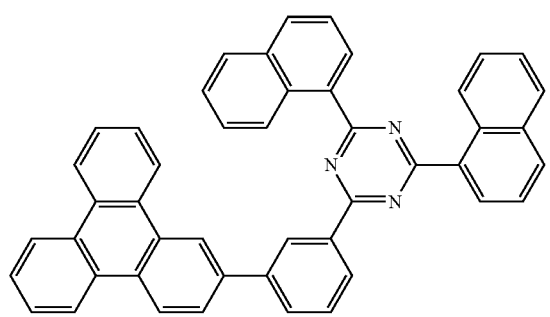
2-5
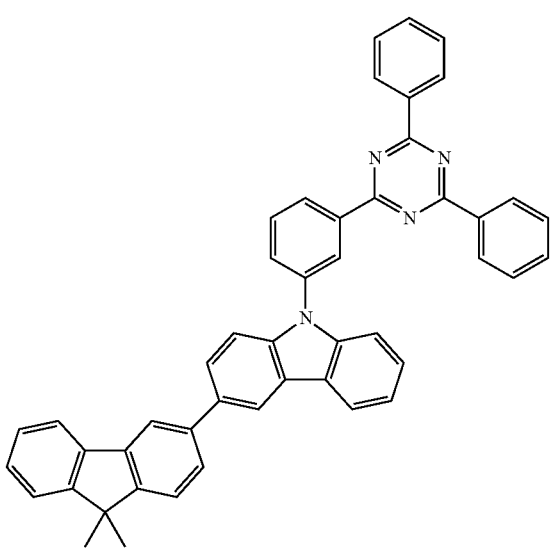
-continued
2-6
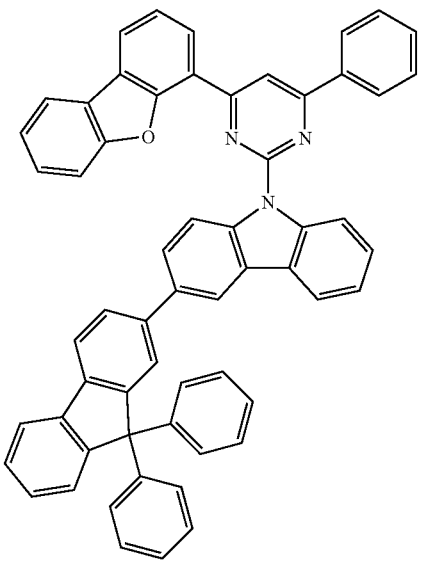
2-7
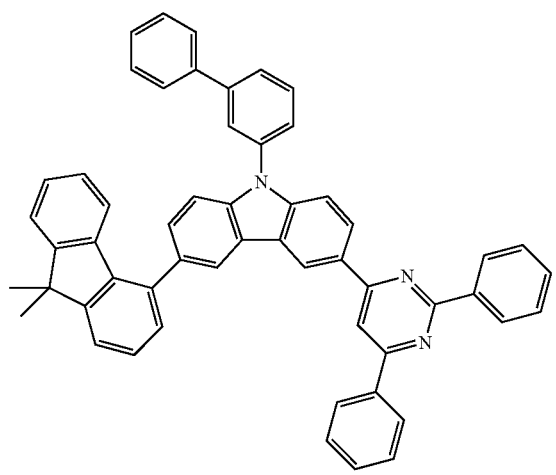
2-8
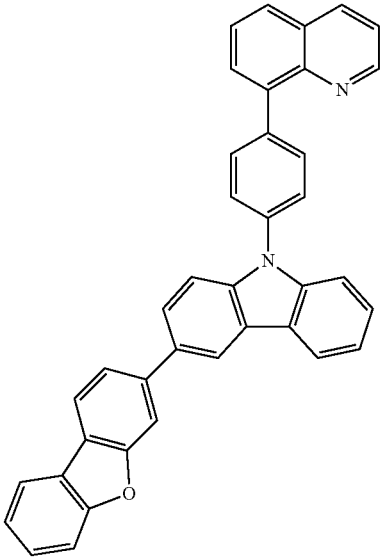

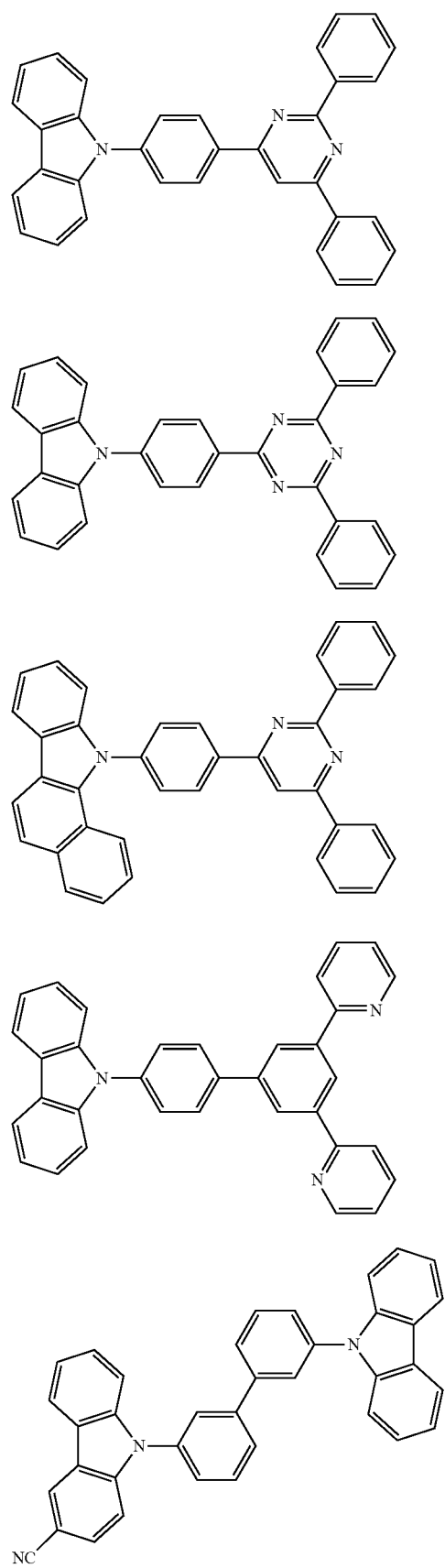
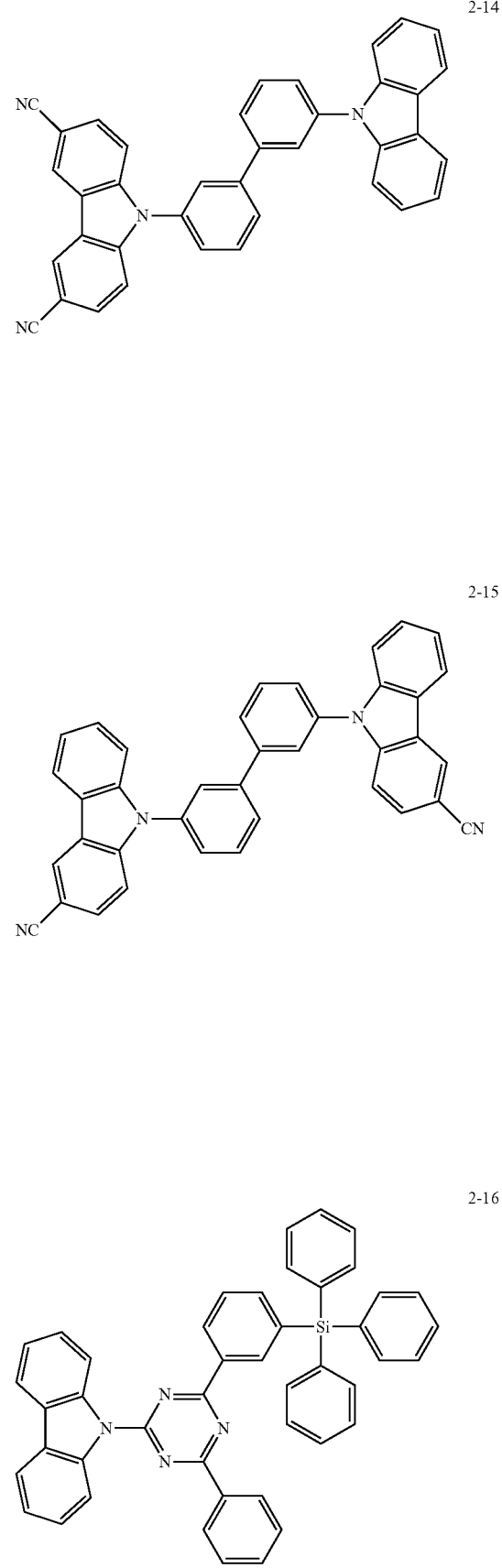

2-17
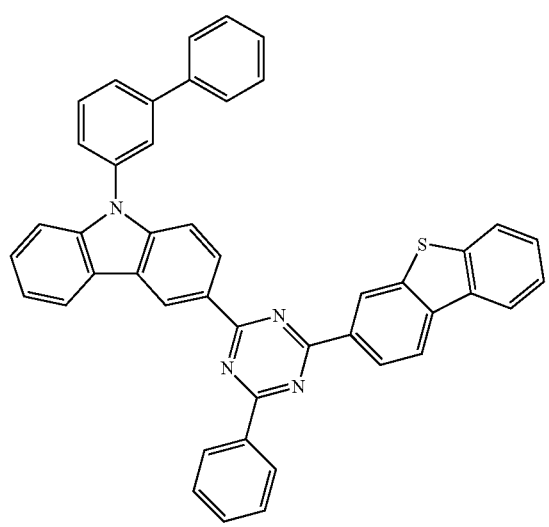
2-18
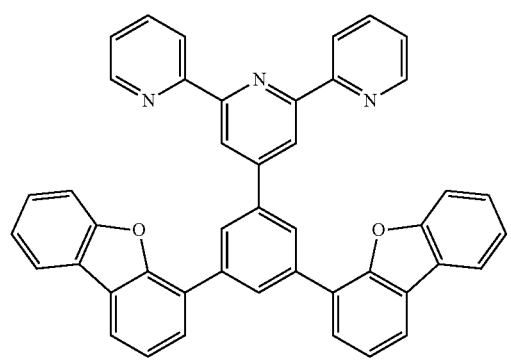
2-19
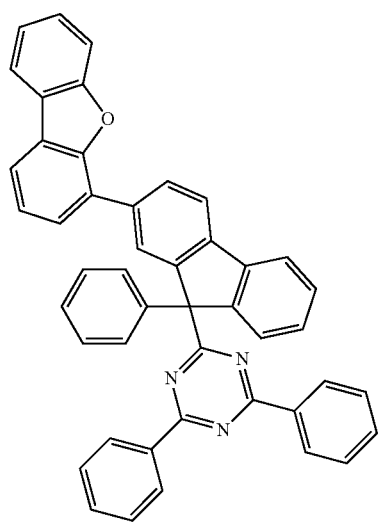
2-20
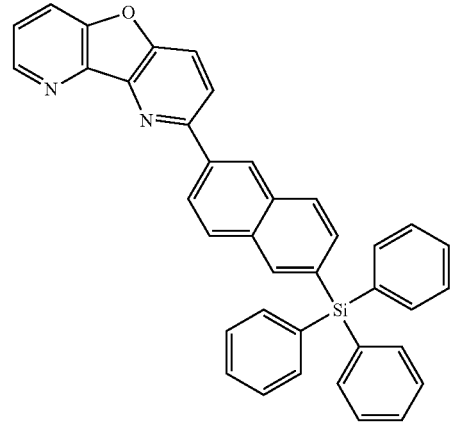
2-21
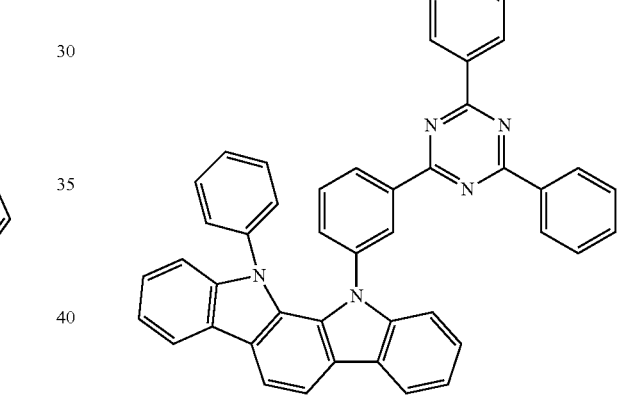
2-22
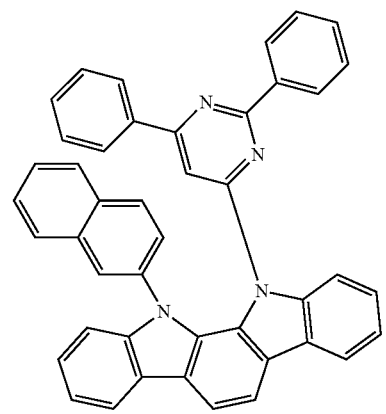

2-23
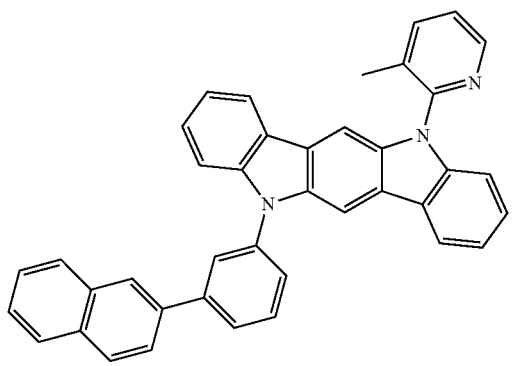
2-24
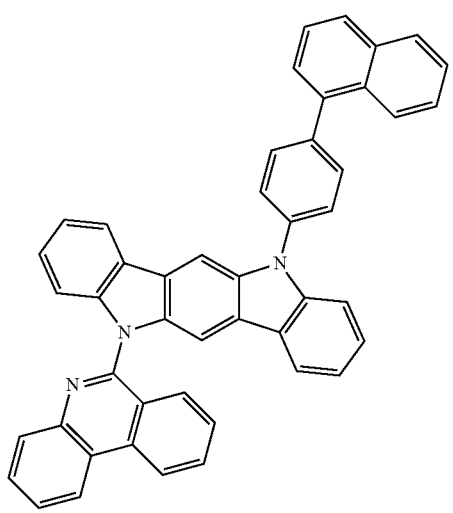
2-25
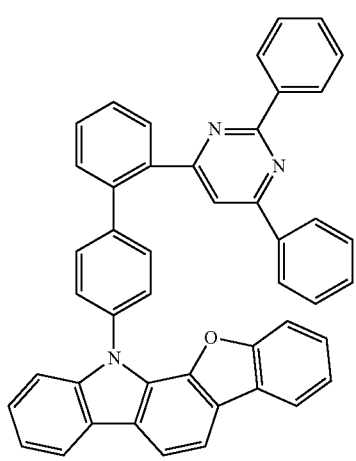
2-26
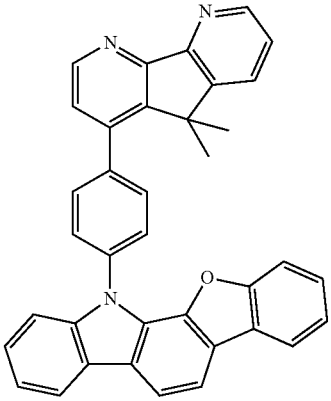
2-27
2-28
2-29
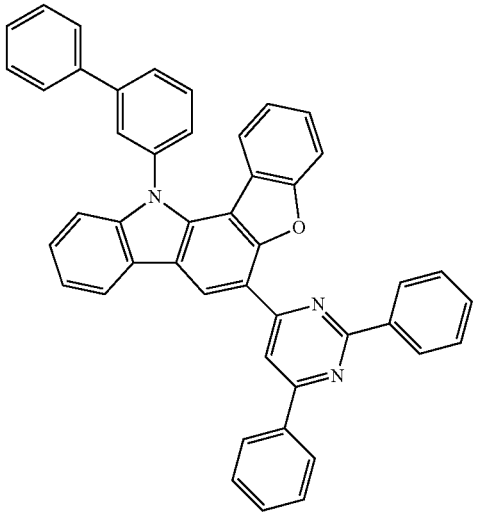

In an embodiment, the n-dopant in the n-doping layer 133N may include a metal-containing material including an alkali metal complex, an alkaline earth metal complex, or any combination thereof.

The metal ion of an alkali metal complex may be a Li ion, a Na ion, a K ion, a Rb ion, or a Cs ion, and the metal ion of alkaline earth metal complex may be a Be ion, a Mg ion, a Ca ion, a Sr ion, or a Ba ion. A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

For example, the n-dopant may include a Li complex. For example, the n-dopant may include Compound ET-D1(LiQ) or ET-D2:

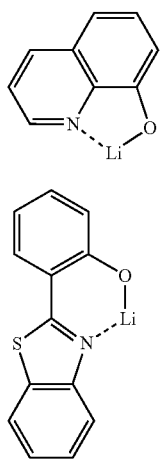

ET-D1

ET-D2

In an embodiment, an amount of the third compound in the n-doping layer 133N may be greater than the amount of the n-dopant in the n-doping layer 133N.

For example, an amount of the n-dopant in the n-doping layer 133N may be in a range of about 5 wt % to about 49.99 wt %, based on the total weight of the n-doping layer 133N. For example, an amount of the n-dopant in the n-doping layer 133N may be in a range of about 5 wt % to about 10 wt %, based on the total weight of the n-doping layer 133N.

In an embodiment, the n-doping layer 133N may directly contact the emission layer 133.

In an embodiment, a thickness of the n-doping layer 133N may be in a range of about 1 nm to about 20 nm. For example, the thickness of the n-doping layer 133N may be in a range of about 1 nm to about 10 nm.

Because the light-emitting device 10 according to an embodiment includes an n-doping layer 133N, the charge balance of the emission layer 133 may be improved, and thus, excitons may be effectively formed in the emission layer 133, and the formed excitons may be confined in the emission layer 133. The occurrence of leakage current caused by holes or electrons flowing into neighboring layers may be prevented or reduced.

When the light-emitting dopant is in the emission layer 133, hole trapping may occur and charge transfer may be delayed, thereby causing difficulty in maintaining charge balance, and thus, a lifespan of the light-emitting device may be decreased. In the light-emitting device 10 according to an embodiment, as the n-doping layer 133N including the n-dopant may directly contact the emission layer 133, controlling the excitons in the emission layer 133 and maintaining charge balance may be possible.

Accordingly, the driving voltage of the light-emitting device 10 may be improved (e.g., lowered), and the emission efficiency and lifespan may be improved.

[Hole Transport Region]

The hole transport region may have a structure consisting of a layer consisting of a single material, a structure consisting of a layer consisting of different materials, or a multi-layered structure including layers including different materials.

The hole transport region may include a hole injection layer 131, a hole transport layer 132, an emission auxiliary layer, an electron blocking layer, or any combination thereof.

For example, the hole transport region may have a multi-layered structure having a hole injection layer 131/hole transport layer 132 structure, a hole injection layer 131/hole transport layer 132/emission auxiliary layer structure, a hole injection layer 131/emission auxiliary layer structure, a hole transport layer 132/emission auxiliary layer structure, or a hole injection layer 131/hole transport layer 132/electron blocking layer structure, wherein for each structure, constituting layers may be stacked from the first electrode 110 in its respective stated order.

The hole transport region may include a compound represented by Formula 201, a compound represented by Formula 202, or any combination thereof:

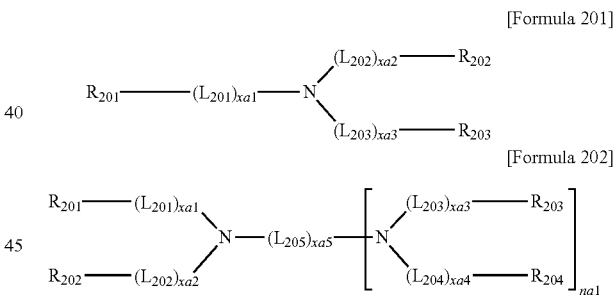

[Formula 201]

[Formula 202]

In Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)—*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, 3R$_{201}$ and R$_{202}$ may optionally be linked to each other via a single bond, a C$_1$-C$_5$ alkylene group unsubstituted or substituted with at least one R$_{10a}$, or a C$_2$-C$_5$ alkenylene group unsubstituted or substituted with at least one R$_{10a}$, to form a C$_8$-C$_{60}$ polycyclic group (for example, a carbazole group or the like) unsubstituted or substituted with at least one R$_{10a}$ (for example, Compound HT16), R$_{203}$ and R$_{204}$ may optionally be linked to each other via a single bond, a C$_1$-C$_5$ alkylene group unsubstituted or substituted with at least one R$_{10a}$, or a C$_2$-C$_5$ alkenylene group unsubstituted or substituted with at least one R$_{10a}$, to form a C$_8$-C$_{60}$ polycyclic group unsubstituted or substituted with at least one R$_{10a}$, and na1 may be an integer from 1 to 4.

In embodiments, each of Formulae 201 and 202 may include at least one of groups represented by Formulae CY201 to CY217.

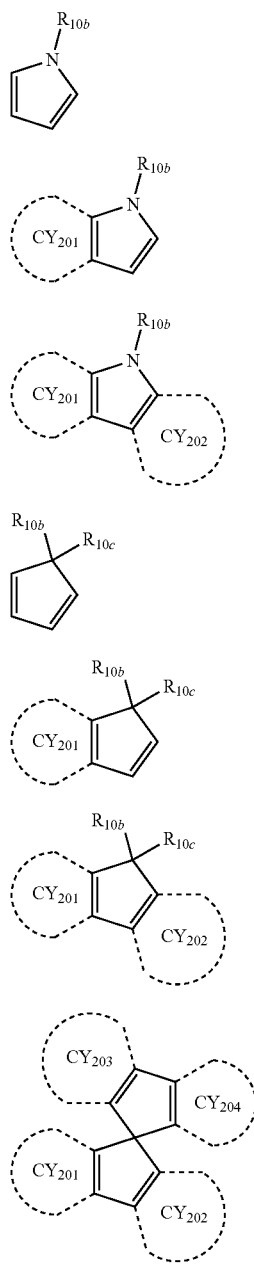

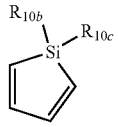
CY208

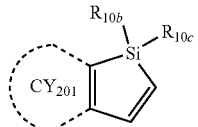
CY209

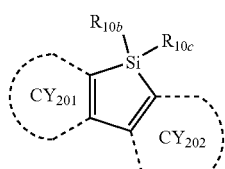
CY210

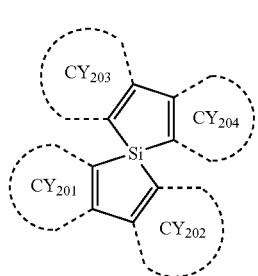
CY211

CY212

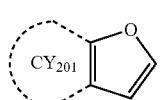
CY213

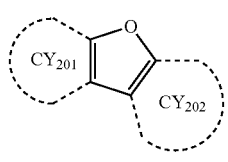
CY214

CY215

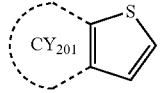
CY216

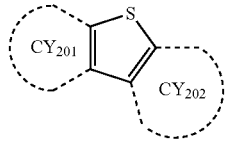
CY217

In Formulae CY201 to CY217, R$_{10b}$ and R$_{10c}$ may each independently be the same as described in connection with R$_{10a}$, ring CY$_{201}$ to ring CY$_{204}$ may each independently be a C$_3$-C$_{20}$ carbocyclic group or a C$_1$-C$_{20}$ heterocyclic group, and at least one hydrogen in Formulae CY201 to CY217 may be unsubstituted or substituted with R$_{10a}$.

In an embodiment, ring $CY_{201}$ to ring $CY_{204}$ in Formulae CY201 to CY217 may each independently be a benzene group, a naphthalene group, a phenanthrene group, or an anthracene group.

In embodiments, each of Formulae 201 and 202 may include at least one of groups represented by Formulae CY201 to CY203.

In embodiments, Formula 201 may include at least one of groups represented by Formulae CY201 to CY203 and at least one of groups represented by Formulae CY204 to CY217.

In embodiments, xa1 in Formula 201 may be 1, $R_{201}$ may be a group represented by one of Formulae CY201 to CY203, xa2 may be 0, and $R_{202}$ may be a group represented by one of Formulae CY204 to CY207.

In embodiments, each of Formulae 201 and 202 may not include a group represented by one of Formulae CY201 to CY203.

In embodiments, each of Formulae 201 and 202 may not include a group represented by one of Formulae CY201 to CY203, and may include at least one of groups represented by Formulae CY204 to CY217.

In embodiments, each of Formulae 201 and 202 may not include a group represented by one of Formulae CY201 to CY217.

In an embodiment, the hole transport region may include one of Compounds HT1 to HT46, m-MTDATA, TDATA, 2-TNATA, NPB(NPD), β-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

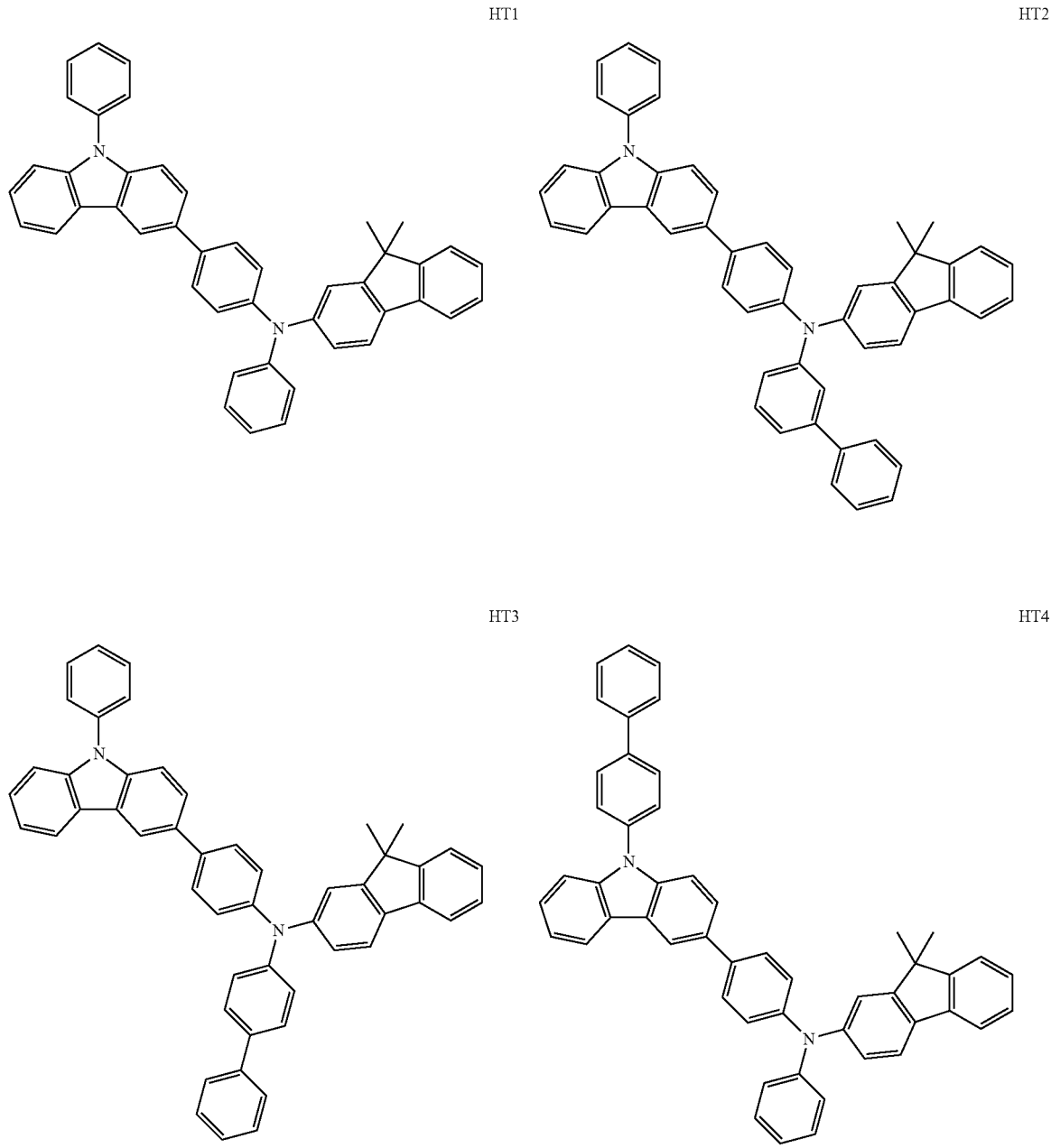

-continued
HT5
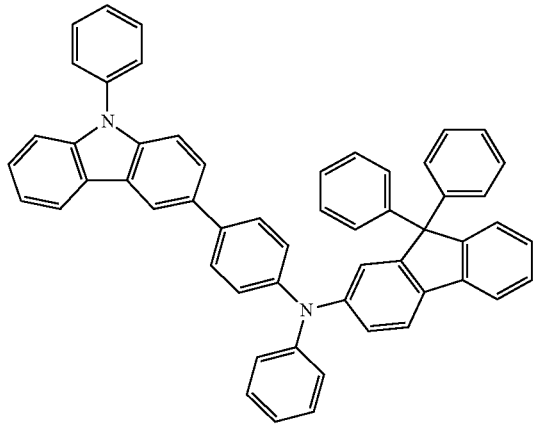
HT6
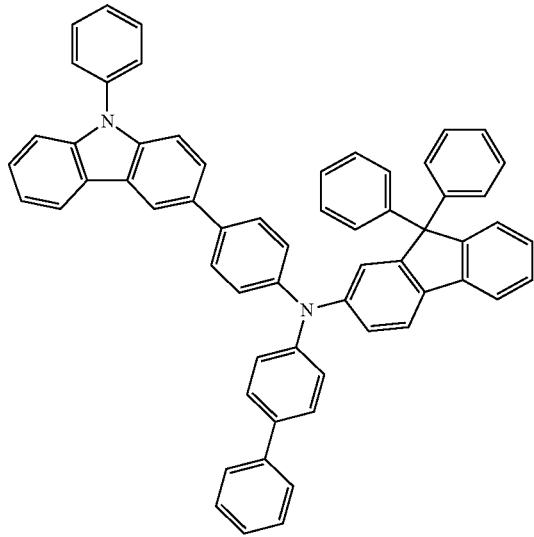
HT7
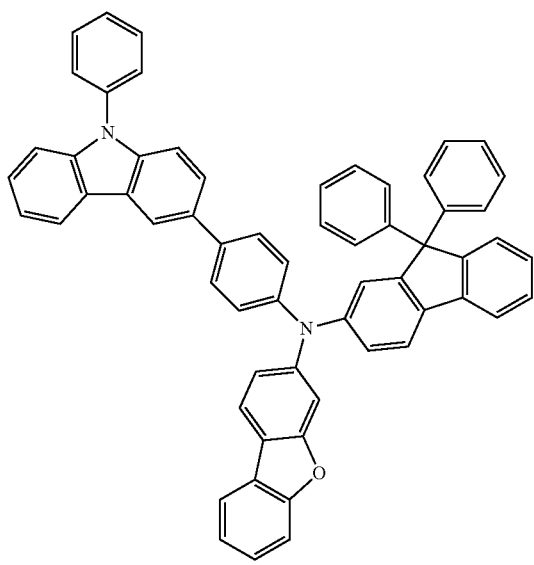
HT8
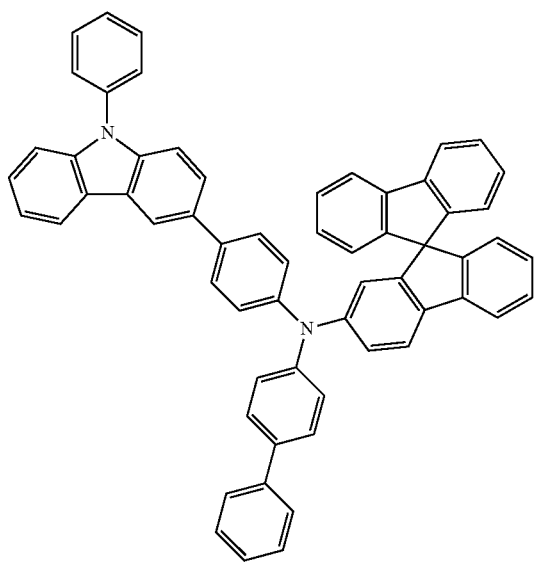

-continued
HT9
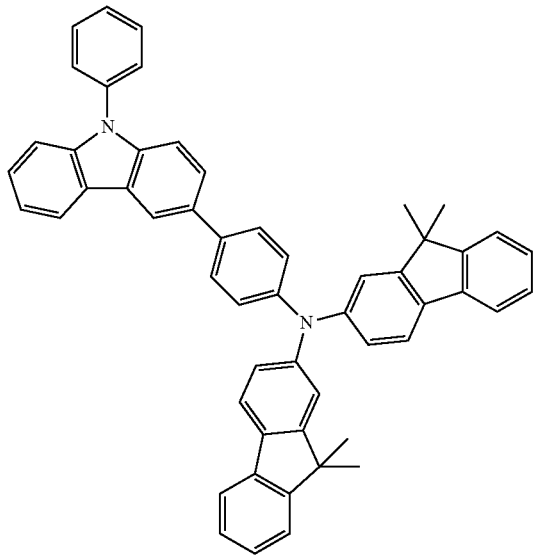
HT10
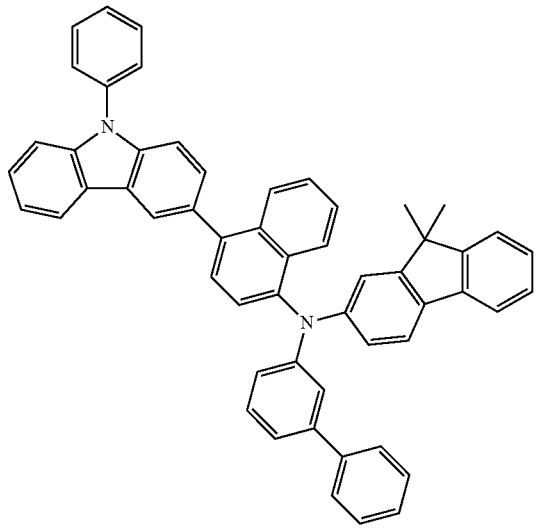
HT11
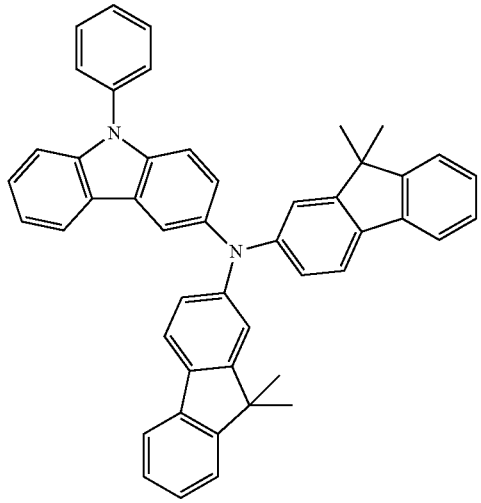
HT12
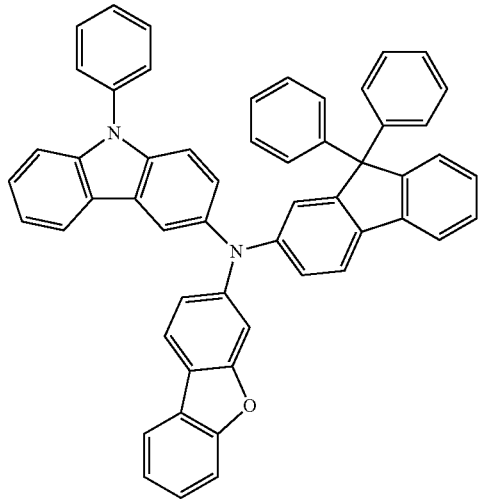
HT13
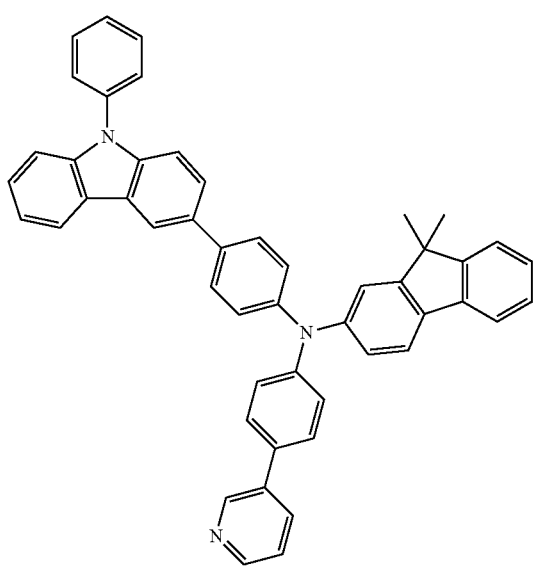
HT14
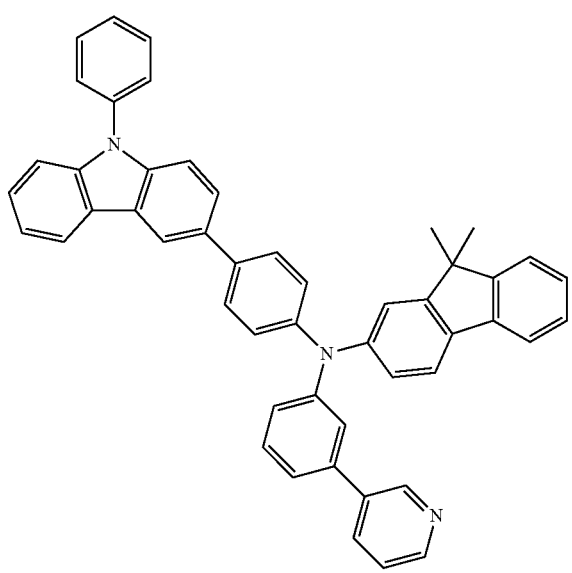

-continued
HT15
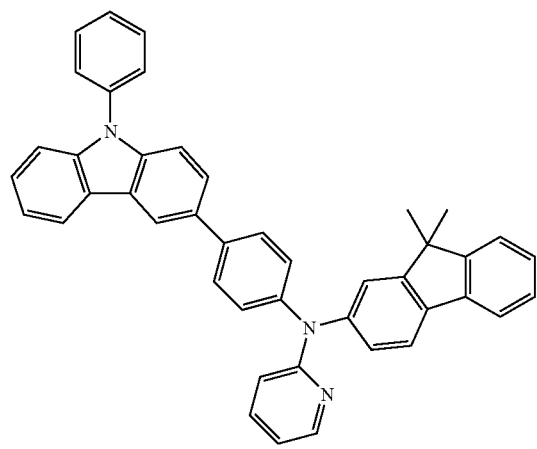
HT16
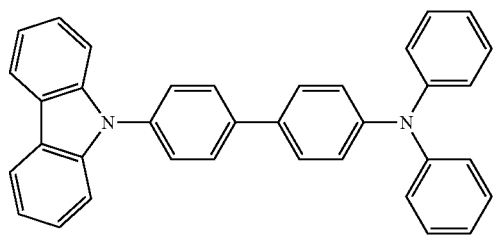
HT17
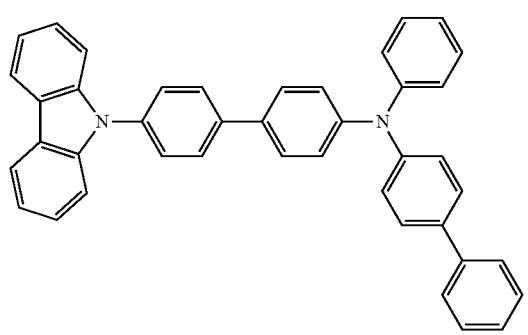
HT18
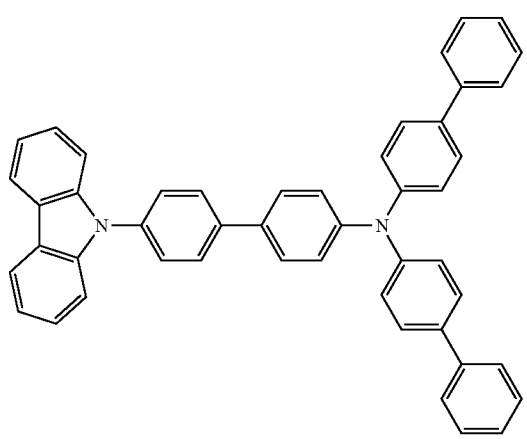
HT19
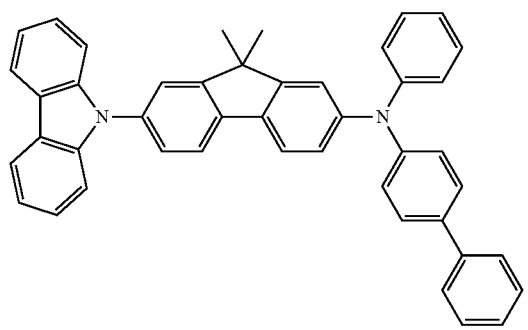
HT20
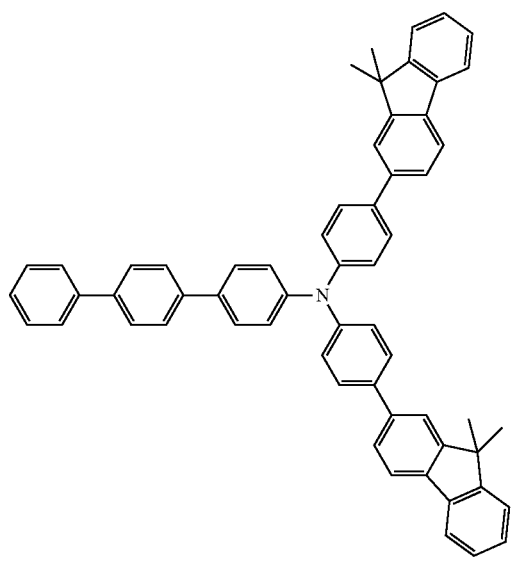

-continued
HT21
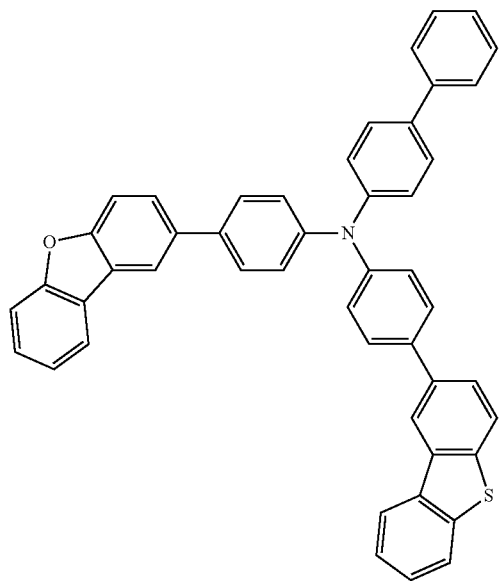
HT22
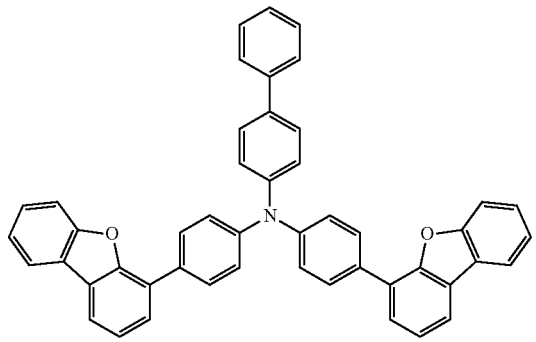
HT23
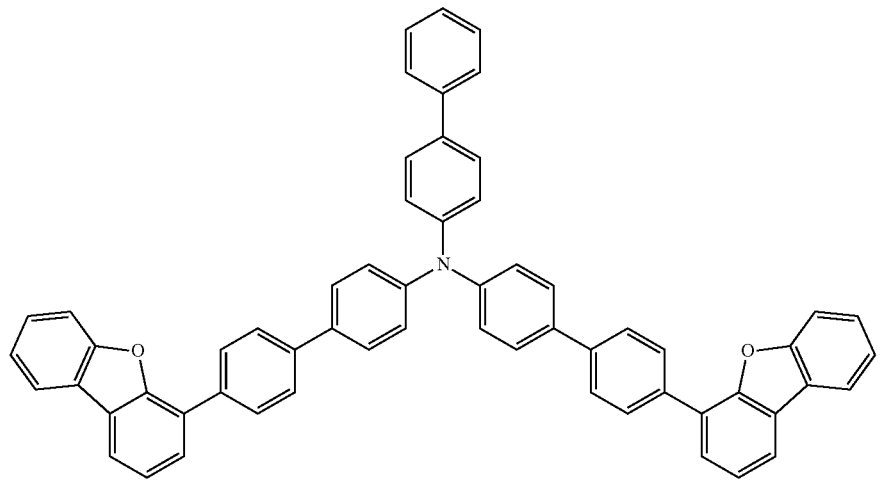
HT24
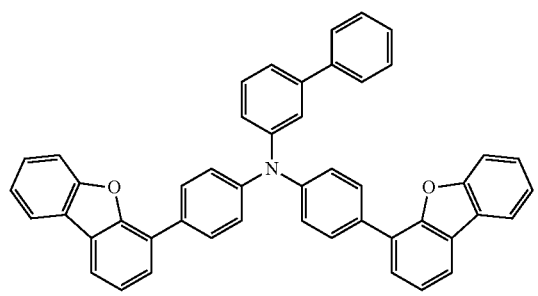
HT25
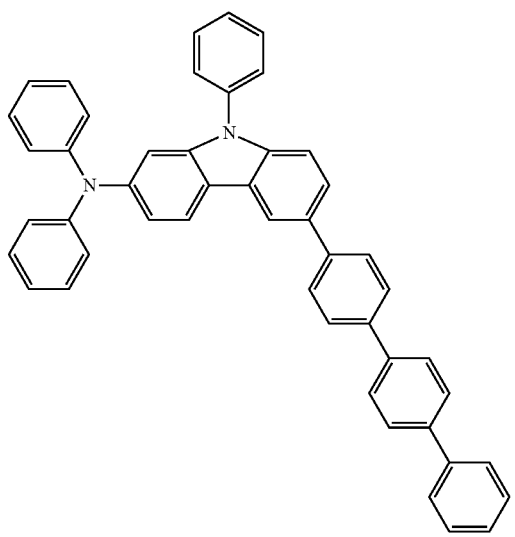

-continued
HT26
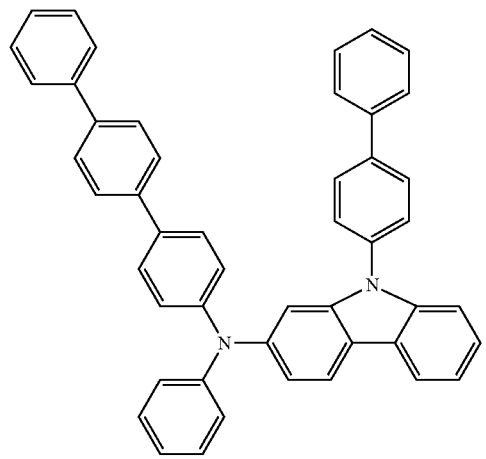
HT27
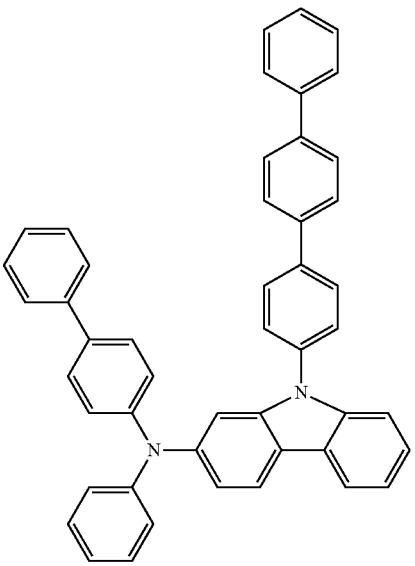
HT28
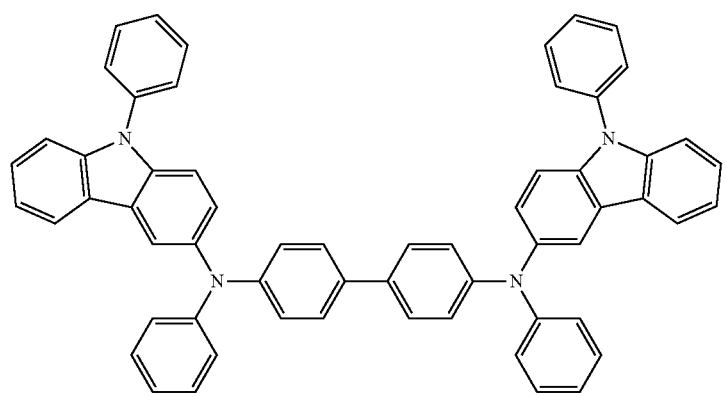
HT29
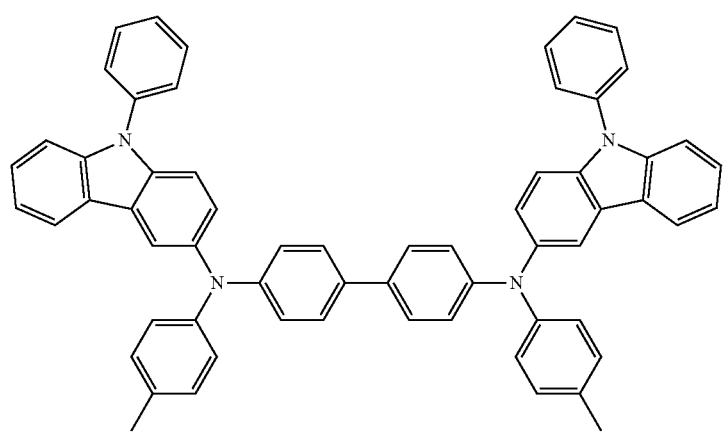

-continued
HT30
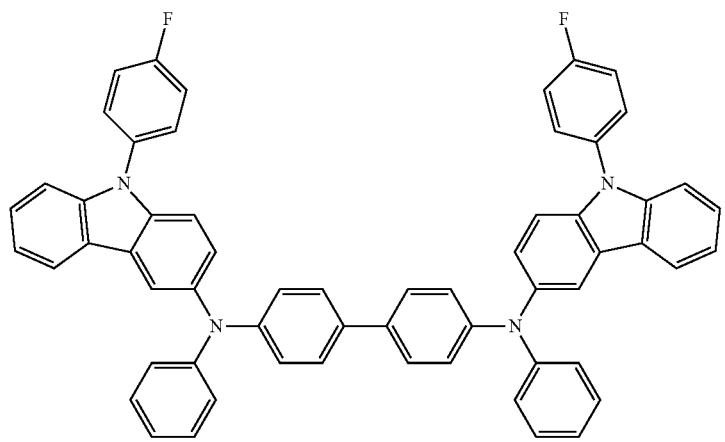
HT31
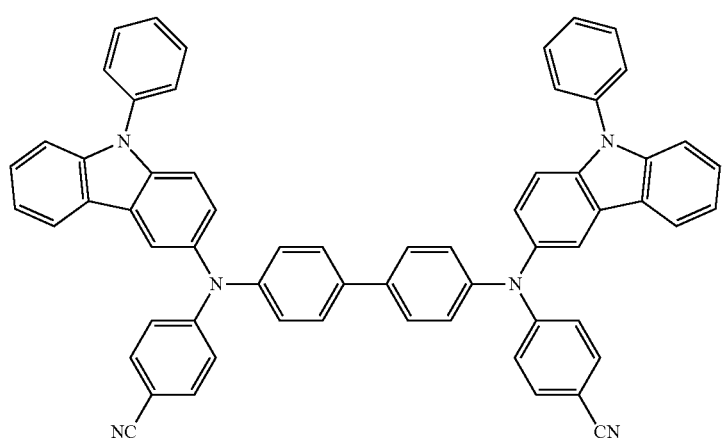
HT32
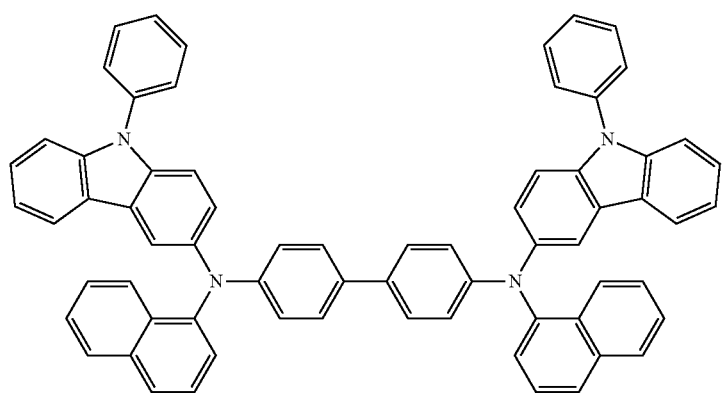

HT33
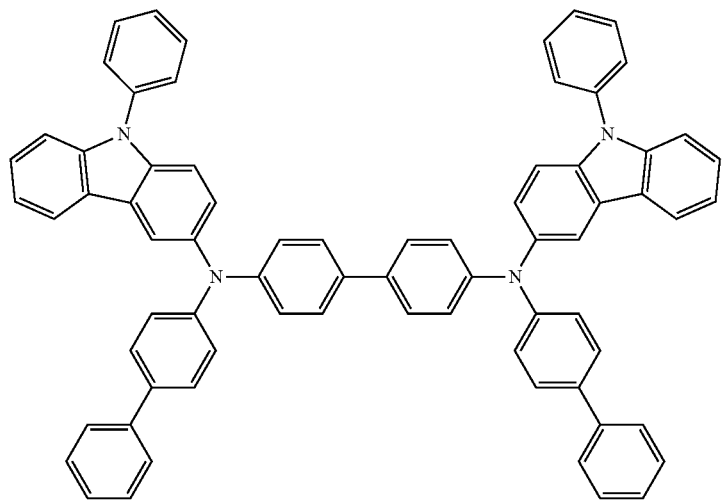
HT34
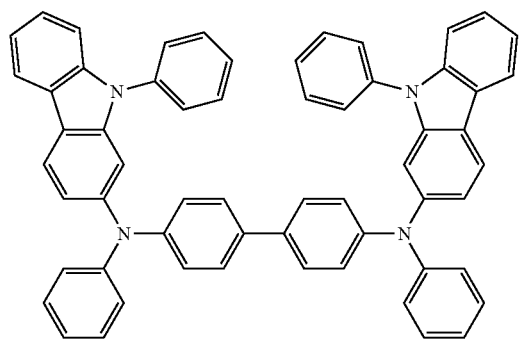
HT35
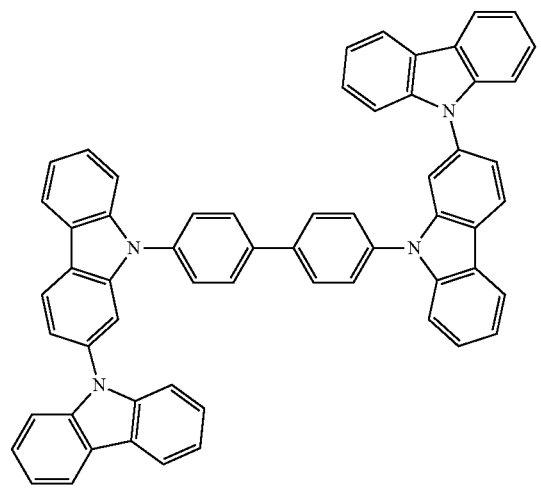
HT36
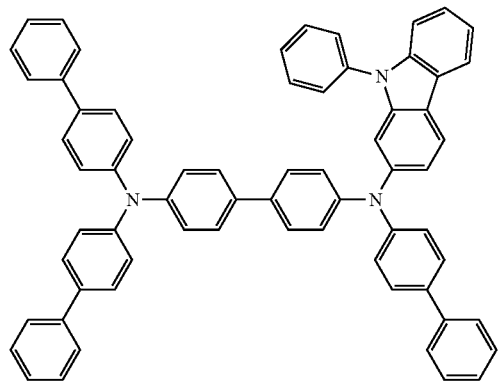
HT37
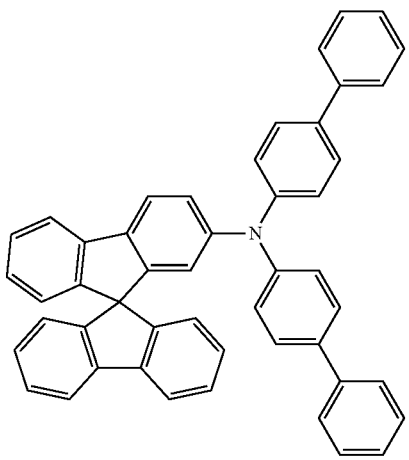

-continued
HT38
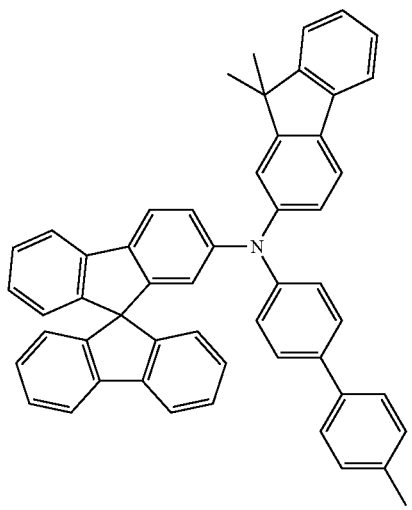
HT39
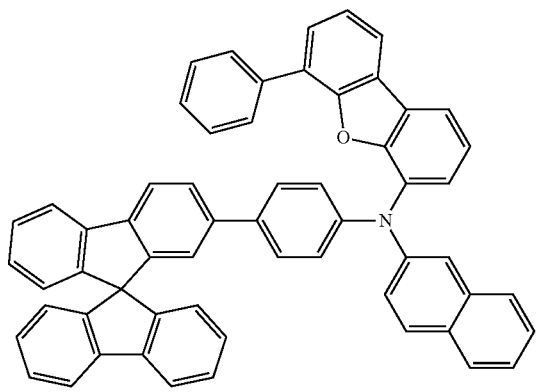
HT40
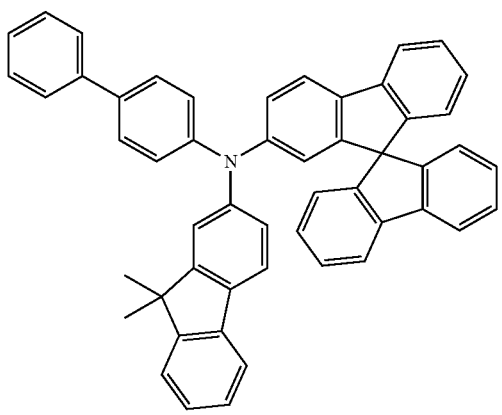
HT41
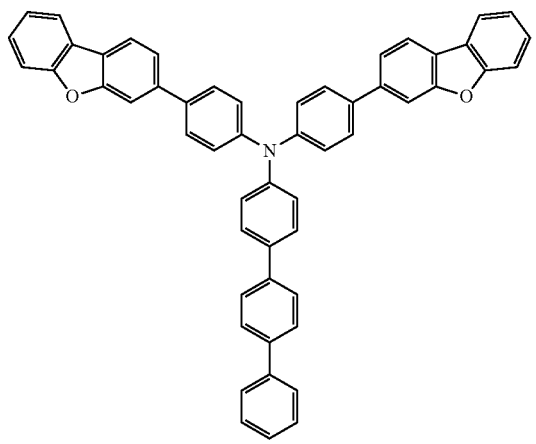
HT42
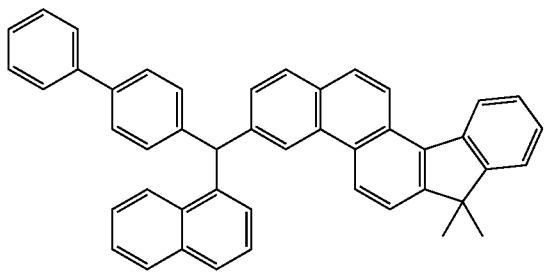
HT43
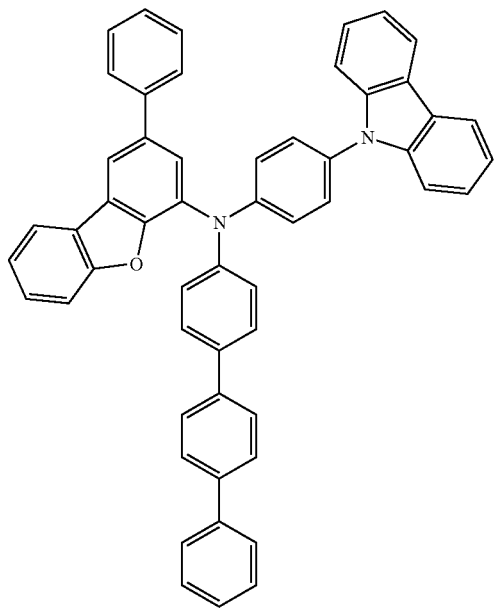

-continued
HT44
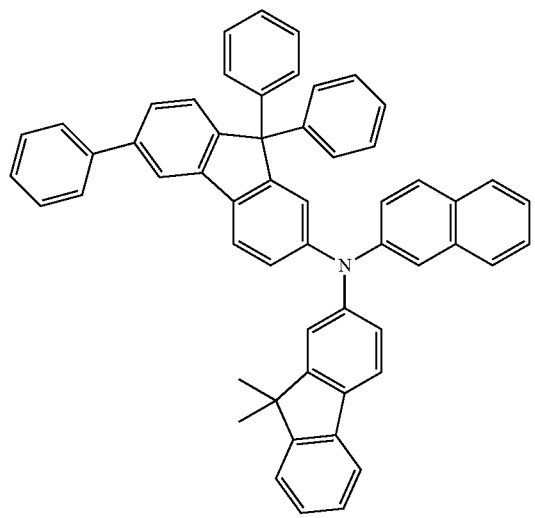
HT45
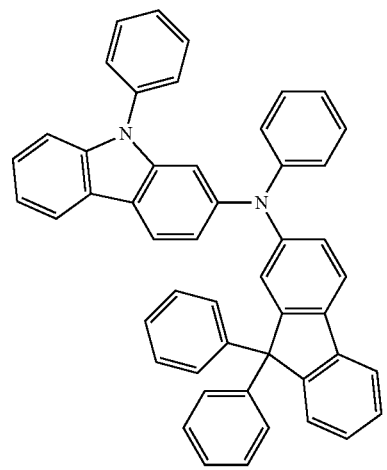
HT46
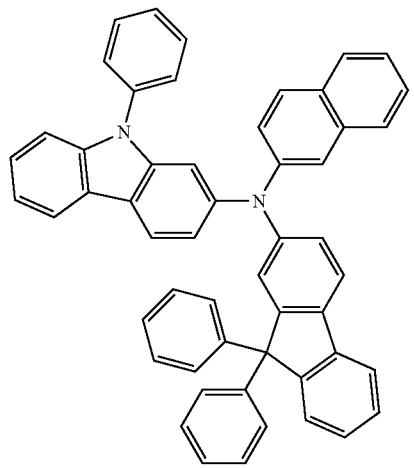
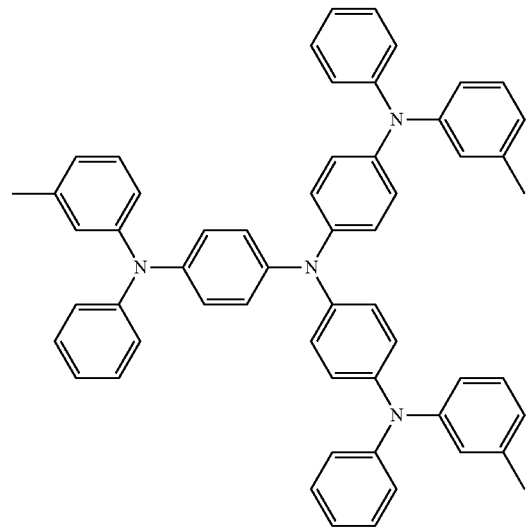
m-MTDATA -continued
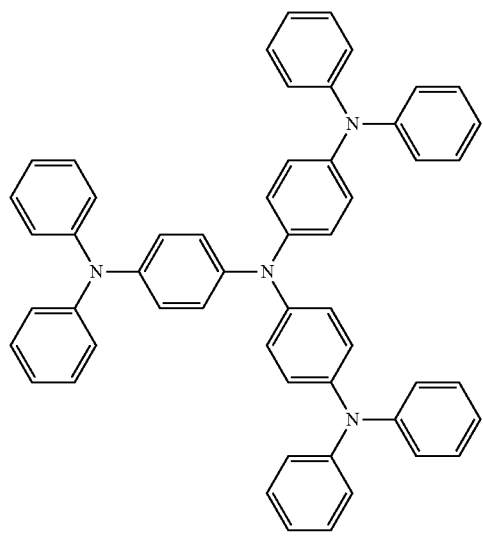
TDATA
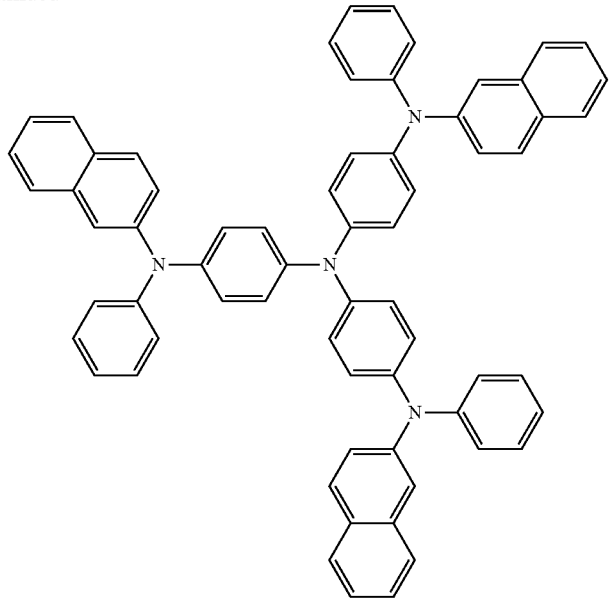
2-TNATA
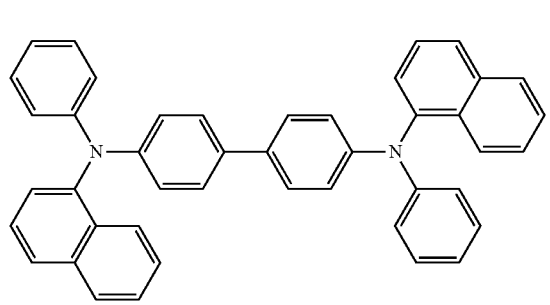
NPB
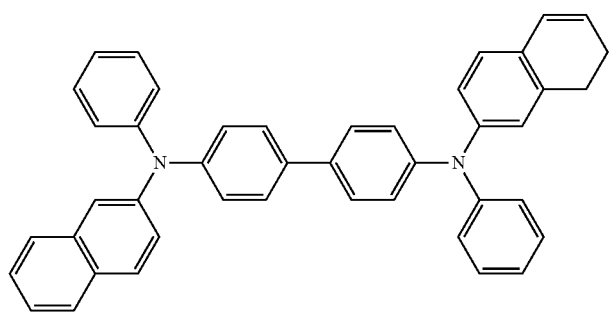
β-NPB
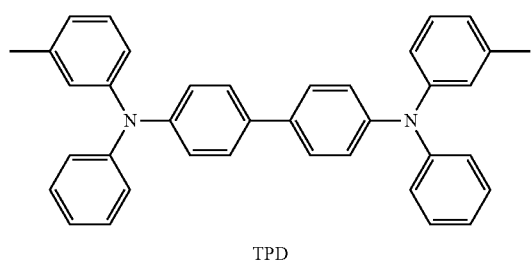
TPD
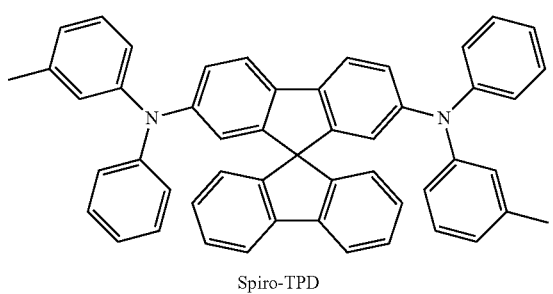
Spiro-TPD
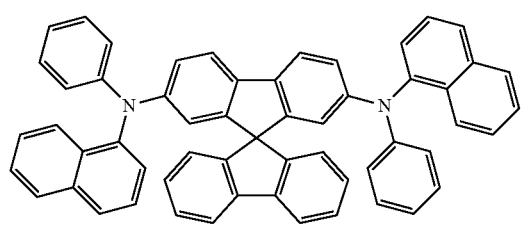
Spiro-NPB

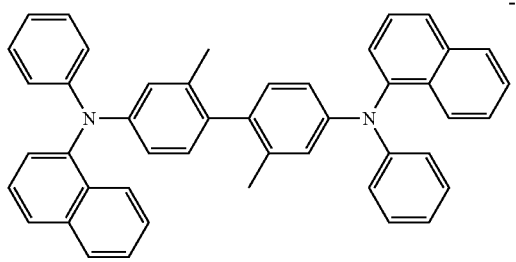

methylated-NPB

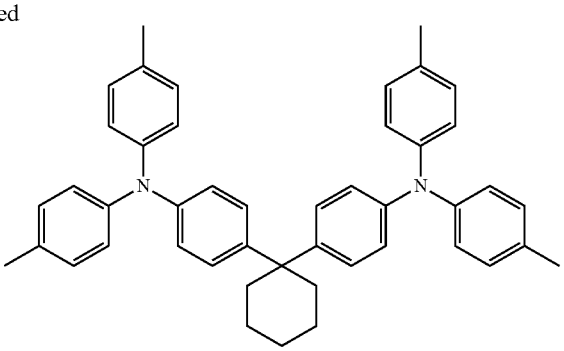

TAPC

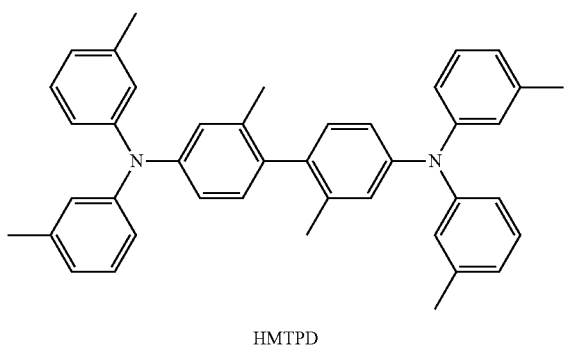

HMTPD

In an embodiment, the hole transport region may include a hole transport material, and the hole transport material included in the hole transport region and the first compound included in the emission layer 133 may be identical to each other. For example, the hole transport region may include the hole transport layer 132, the hole transport layer 132 may include the hole transport material, and the hole transport material included in the hole transport layer 132 and the first compound included in the emission layer 133 may be identical to each other.

A thickness of the hole transport region may be in a range of about 50 Å to about 10,000 Å. For example, the thickness of the hole transport region may be in a range of about 100 Å to about 4,000 Å. When the hole transport region includes a hole injection layer 131, a hole transport layer 132, or any combination thereof, a thickness of the hole injection layer 131 may be in a range of about 100 Å to about 9,000 Å, and a thickness of the hole transport layer 132 may be in a range of about 50 Å to about 2,000 Å. For example, the thickness of the hole injection layer 131 may be in a range of about 100 Å to about 1,500 Å. For example, the thickness of the hole transport layer 132 may be in a range of about 100 Å to about 1,500 Å. When the thicknesses of the hole transport region, the hole injection layer 131, and the hole transport layer 132 are within these ranges, satisfactory hole transporting characteristics may be obtained without a substantial increase in driving voltage.

The emission auxiliary layer may increase light-emission efficiency by compensating for an optical resonance distance according to a wavelength of light emitted by an emission layer, and the electron blocking layer may block the leakage of electrons from an emission layer to a hole transport region. Materials that may be included in the hole transport region may be included in the emission auxiliary layer and the electron blocking layer.

[p-Dopant]

The hole transport region may further include, in addition to these materials, a charge-generation material for the improvement of conductive properties. The charge-generation material may be uniformly or non-uniformly dispersed in the hole transport region (for example, in the form of a single layer consisting of a charge-generation material).

The charge-generation material may be, for example, a p-dopant.

In embodiments, a lowest unoccupied molecular orbital (LUMO) energy level of the p-dopant may be equal to or less than about −3.5 eV.

In embodiments, the p-dopant may include a quinone derivative, a cyano group-containing compound, a compound containing element EL1 and element EL2, or any combination thereof.

Examples of the quinone derivative may include TCNQ, F4-TCNQ, etc.

Examples of the cyano group-containing compound may include HAT-CN, and a compound represented by Formula 221 below.

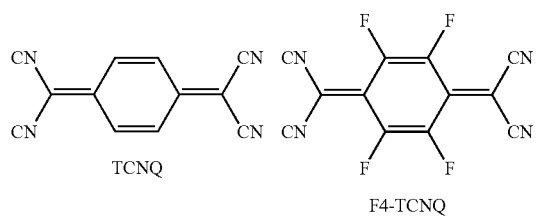

TCNQ

F4-TCNQ

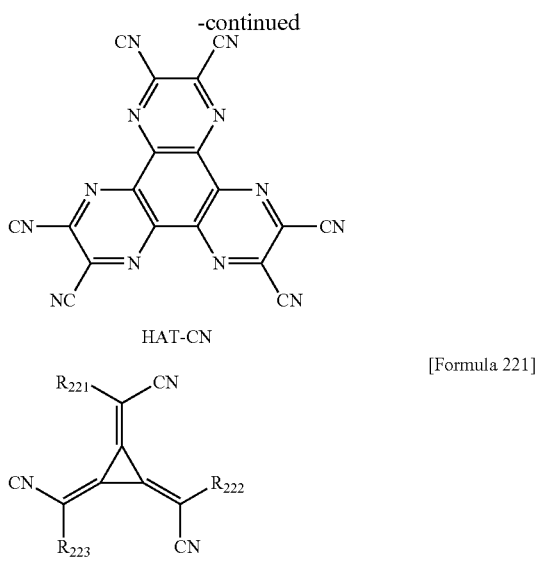

HAT-CN

[Formula 221]

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with a cyano group; —F; —Cl; —Br; —I; a $C_1$-$C_{20}$ alkyl group substituted with a cyano group, —F, —Cl, —Br, —I, or any combination thereof; or any combination thereof.

In the compound containing element EL1 and element EL2, element EL1 may be a metal, a metalloid, or any combination thereof, and element EL2 may be a non-metal, a metalloid, or any combination thereof.

Examples of the metal may include an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); and a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Examples of the metalloid may include silicon (Si), antimony (Sb), and tellurium (Te).

Examples of the non-metal may include oxygen (O) and a halogen (for example, F, Cl, Br, I, etc.).

In embodiments, examples of the compound containing element EL1 and element EL2 may include a metal oxide, a metal halide (for example, metal fluoride, metal chloride, metal bromide, or metal iodide), a metalloid halide (for example, metalloid fluoride, metalloid chloride, metalloid bromide, or metalloid iodide), a metal telluride, or any combination thereof.

Examples of the metal oxide may include tungsten oxide (for example, $WO$, $W_2O_3$, $WO_2$, $WO_3$, $W_2O_5$, etc.), vanadium oxide (for example, $VO$, $V_2O_3$, $VO_2$, $V_2O_5$, etc.), molybdenum oxide ($MoO$, $Mo_2O_3$, $MoO_2$, $MoO_3$, $Mo_2O_5$, etc.), and rhenium oxide (for example, $ReO_3$, etc.).

Examples of the metal halide may include an alkali metal halide, an alkaline earth metal halide, a transition metal halide, a post-transition metal halide, and a lanthanide metal halide.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, and CsI.

Examples of the alkaline earth metal halide may include $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of the transition metal halide may include titanium halide (for example, $TiF_4$, $TiCl_4$, $TiBr_4$, $TiI_4$, etc.), zirconium halide (for example, $ZrF_4$, $ZrCl_4$, $ZrBr_4$, $ZrI_4$, etc.), hafnium halide (for example, $HfF_4$, $HfCl_4$, $HfBr_4$, $HfI_4$, etc.), vanadium halide (for example, $VF_3$, $VCl_3$, $VBr_3$, $VI_3$, etc.), niobium halide (for example, $NbF_3$, $NbCl_3$, $NbBr_3$, $NbI_3$, etc.), tantalum halide (for example, $TaF_3$, $TaCl_3$, $TaBr_3$, $TaI_3$, etc.), chromium halide (for example, $CrF_3$, $CrCl_3$, $CrBr_3$, $CrI_3$, etc.), molybdenum halide (for example, $MoF_3$, $MoCl_3$, $MoBr_3$, $MoI_3$, etc.), tungsten halide (for example, $WF_3$, $WCl_3$, $WBr_3$, $WI_3$, etc.), manganese halide (for example, $MnF_2$, $MnCl_2$, $MnBr_2$, $MnI_2$, etc.), technetium halide (for example, $TcF_2$, $TcCl_2$, $TcBr_2$, $TcI_2$, etc.), rhenium halide (for example, $ReF_2$, $ReCl_2$, $ReBr_2$, $ReI_2$, etc.), iron halide (for example, $FeF_2$, $FeCl_2$, $FeBr_2$, $FeI_2$, etc.), ruthenium halide (for example, $RuF_2$, $RuCl_2$, $RuBr_2$, $RuI_2$, etc.), osmium halide (for example, $OsF_2$, $OsCl_2$, $OsBr_2$, $OsI_2$, etc.), cobalt halide (for example, $CoF_2$, $CoCl_2$, $CoBr_2$, $CoI_2$, etc.), rhodium halide (for example, $RhF_2$, $RhCl_2$, $RhBr_2$, $RhI_2$, etc.), iridium halide (for example, $IrF_2$, $IrCl_2$, $IrBr_2$, $IrI_2$, etc.), nickel halide (for example, $NiF_2$, $NiCl_2$, $NiBr_2$, $NiI_2$, etc.), palladium halide (for example, $PdF_2$, $PdCl_2$, $PdBr_2$, $PdI_2$, etc.), platinum halide (for example, $PtF_2$, $PtCl_2$, $PtBr_2$, $PtI_2$, etc.), copper halide (for example, CuF, CuCl, CuBr, CuI, etc.), silver halide (for example, AgF, AgCl, AgBr, AgI, etc.), and gold halide (for example, AuF, AuCl, AuBr, AuI, etc.).

Examples of the post-transition metal halide may include zinc halide (for example, $ZnF_2$, $ZnCl_2$, $ZnBr_2$, $ZnI_2$, etc.), indium halide (for example, $InI_3$, etc.), and tin halide (for example, $SnI_2$, etc.).

Examples of the lanthanide metal halide may include YbF, $YbF_2$, $YbF_3$, $SmF_3$, YbCl, $YbCl_2$, $YbCl_3$, $SmCl_3$, YbBr, $YbBr_2$, $YbBr_3$ $SmBr_3$, YbI, $YbI_2$, $YbI_3$, and $SmI_3$.

An example of the metalloid halide may include antimony halide (for example, $SbCl_5$, etc.).

Examples of the metal telluride may include an alkali metal telluride (for example, $Li_2Te$, $Na_2Te$, $K_2Te$, $Rb_2Te$, $Cs_2Te$, etc.), an alkaline earth metal telluride (for example, BeTe, MgTe, CaTe, SrTe, BaTe, etc.), a transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), a post-transition metal telluride (for example, ZnTe, etc.), and a lanthanide metal telluride (for example, LaTe, CeTe, PrTe, NdTe, PmTe, EuTe, GdTe, TbTe, DyTe, HoTe, ErTe, TmTe, YbTe, LuTe, etc.).

[Electron Transport Region]

The electron transport region may have a structure consisting of a layer consisting of a single material, a structure consisting of a layer consisting of different materials, or a multi-layered structure including layers including different materials.

The electron transport region may include a buffer layer, a hole blocking layer, an electron control layer, an electron transport layer 134, an electron injection layer 135, or any combination thereof.

For example, the electron transport region may have a structure having an electron transport layer 134/electron injection layer 135 structure, a hole blocking layer/electron transport layer 134/electron injection layer 135 structure, an electron control layer/electron transport layer 134/electron injection layer 135 structure, or a buffer layer/electron transport layer 134/electron injection layer 135 structure, wherein for each structure, constituting layers may be stacked from the emission layer 133 in its respective stated order.

In an embodiment, the electron transport region may include two or more organic layers different from each other. For example, the electron transport region may include an electron transport layer 134 and an electron injection layer 135.

As the electron transport region includes two or more organic layers different from each other, the electron transport speed may be easily adjusted to balance the holes and electrons, resulting in a decrease of driving current and increase of driving lifespan.

In an embodiment, the electron transport region may include the electron transport layer 134, the n-doping layer 133N may be disposed between the emission layer 133 and the electron transport layer 134, and the n-doping layer 133N may directly contact the emission layer 133 and may directly contact the electron transport layer 134.

The electron transport region may include a metal-free compound including at least one π electron-deficient nitrogen-containing $C_1$-$C_{60}$ cyclic group.

In an embodiment, the electron transport region may include a compound represented by Formula 601 below:

$$[Ar_{601}]_{xe11}\text{-}[(L_{601})_{xe1}\text{-}R_{601}]_{xe21}$$ [Formula 601]

In Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si$(Q_{601})(Q_{602})(Q_{603})$, —C(=O)$(Q_{601})$, —S(=O)$_2(Q_{601})$, or —P(=O)$(Q_{601})(Q_{602})$, $Q_{601}$ to $Q_{603}$ may each independently be the same as described in connection with $Q_1$, xe21 may be 1, 2, 3, 4, or 5, at least one of $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

For example, when xe11 in Formula 601 is 2 or more, two or more of $Ar_{601}$(s) may be linked via a single bond.

In embodiments, $Ar_{601}$ in Formula 601 may be a substituted or unsubstituted anthracene group.

In an embodiment, the electron transport region may include a compound represented by Formula 601-1:

[Formula 601-1]

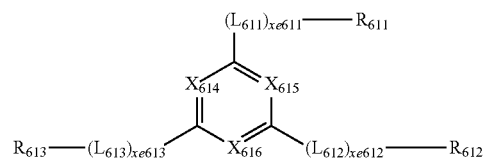

In Formula 601-1, $X_{614}$ may be N or C($R_{614}$), $X_{615}$ may be N or C($R_{615}$), $X_{616}$ may be N or C($R_{616}$), wherein at least one of $X_{614}$ to $X_{616}$ may be N, $L_{611}$ to $L_{613}$ may each independently be the same as described in connection with $L_{601}$, xe611 to xe613 may each independently be the same as described in connection with xe1, $R_{611}$ to $R_{613}$ may each independently be the same as described in connection with $R_{601}$, $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

For example, xe1 and xe611 to xe613 in Formulae 601 and 601-1 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), Alq3, BAlq, TAZ, NTAZ, or any combination thereof:

ET1

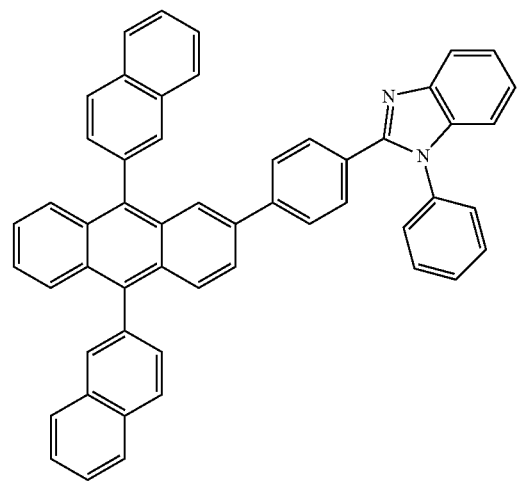

ET2
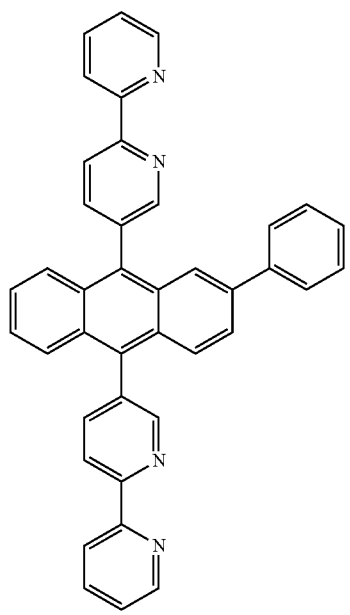
ET3
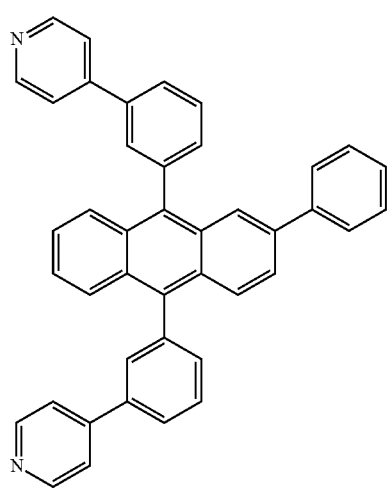
ET4
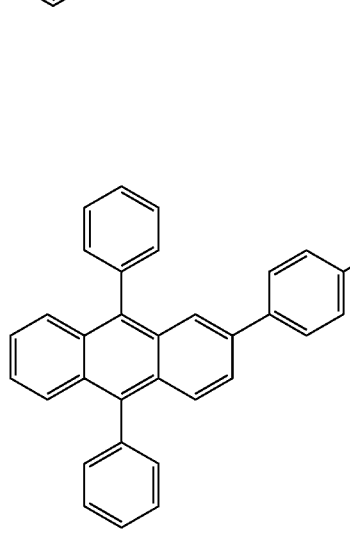
ET5
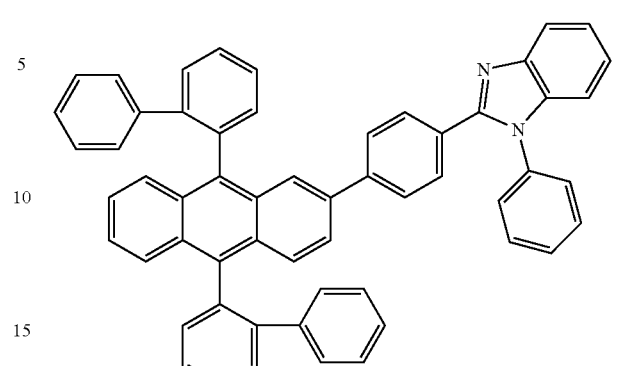
ET6
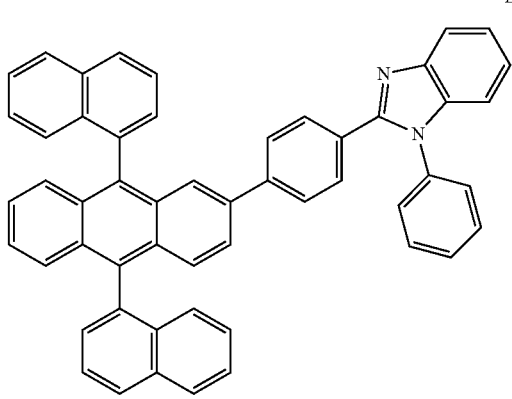
ET7
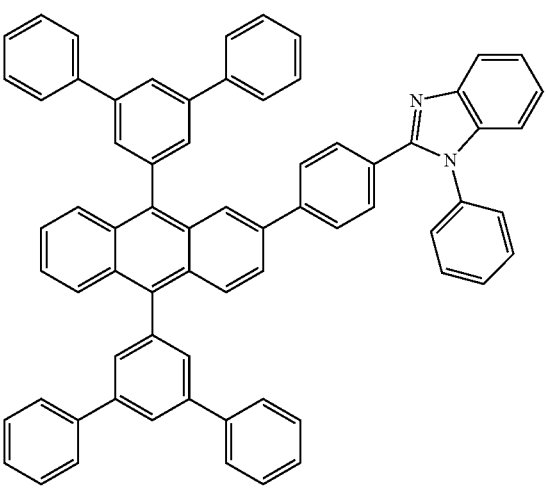

ET8
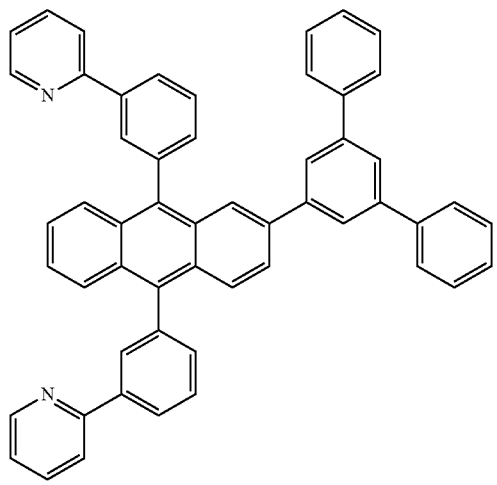
ET10
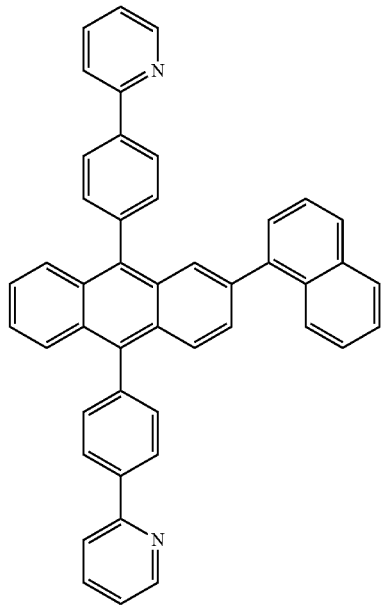
ET11
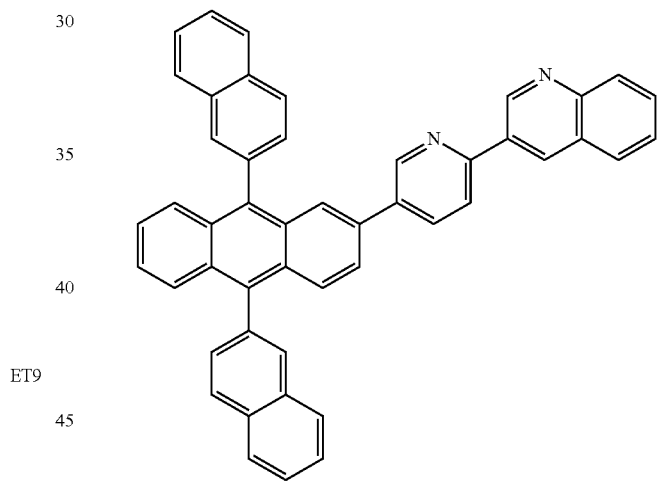
ET9
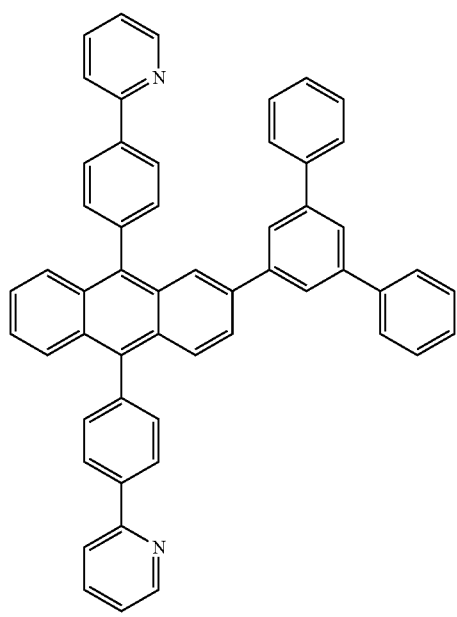
ET12
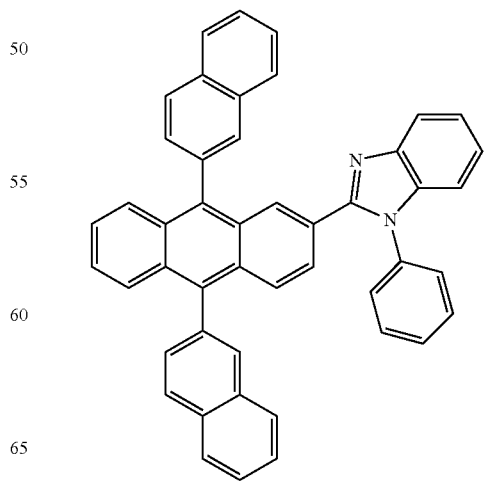

ET13
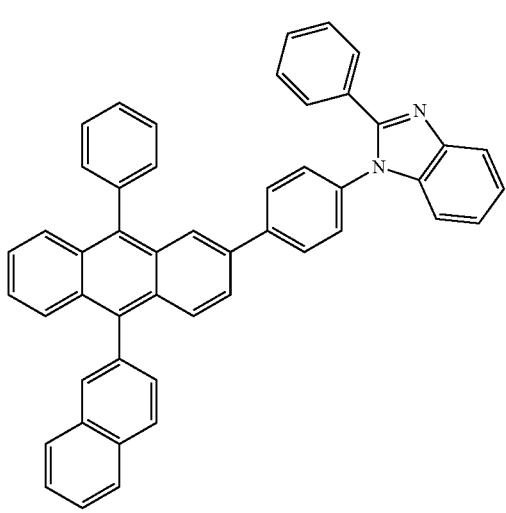
ET16
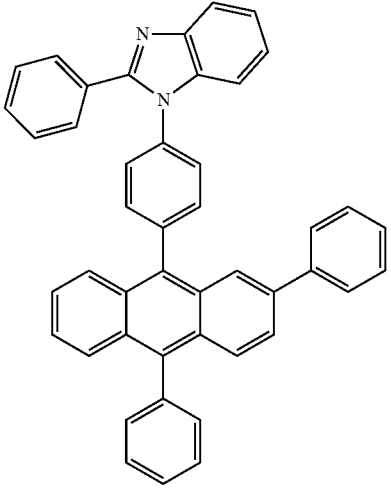
ET14
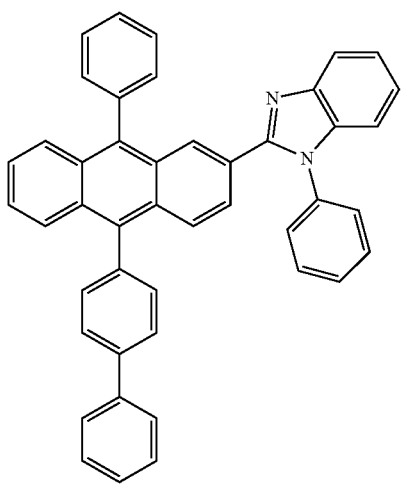
ET17
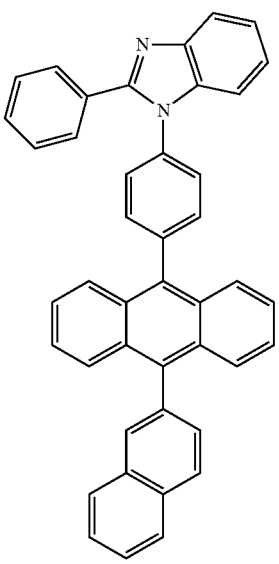
ET15
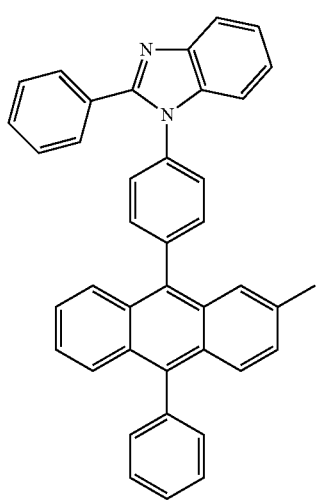
ET18
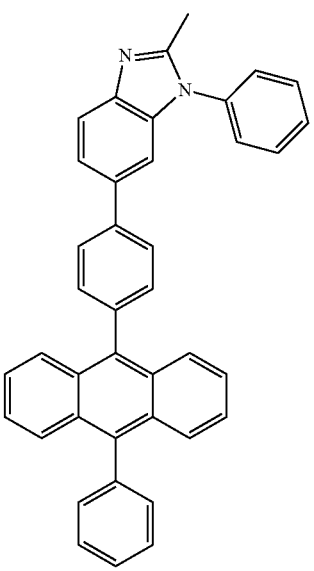

-continued
ET19
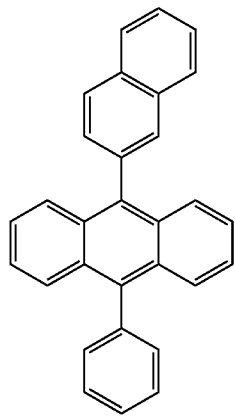
ET20
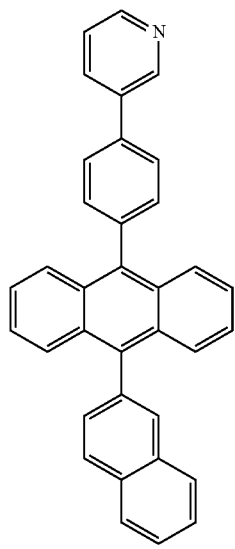
ET21
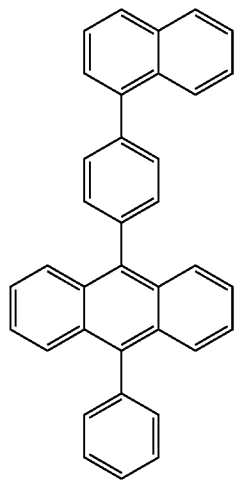
-continued
ET22
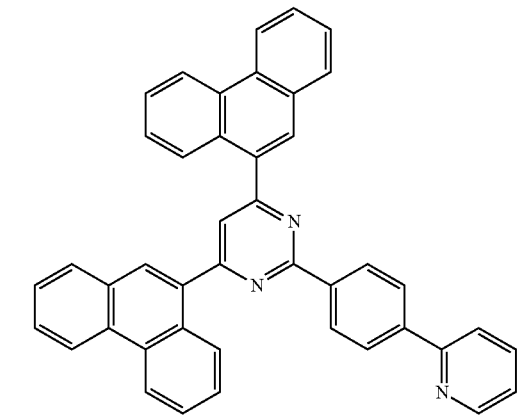
ET23
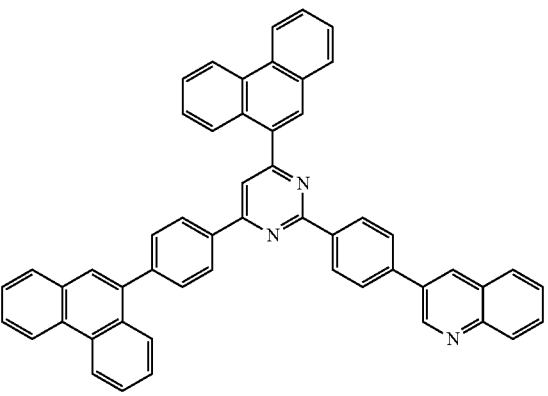
ET24
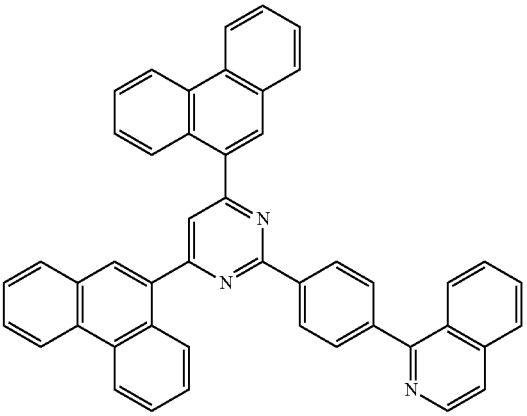

ET25
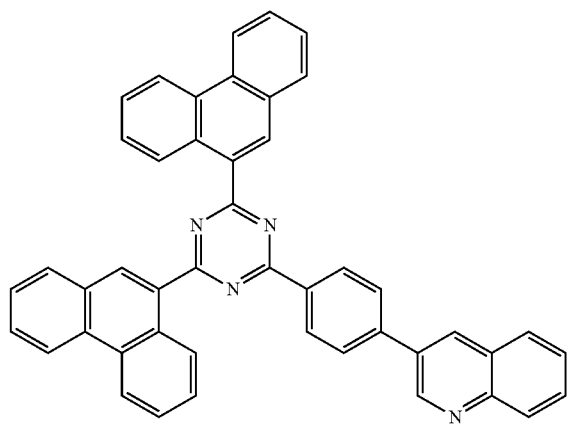
ET26
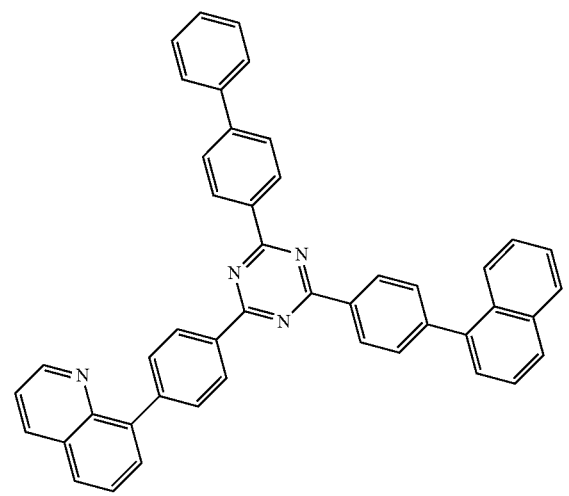
ET27
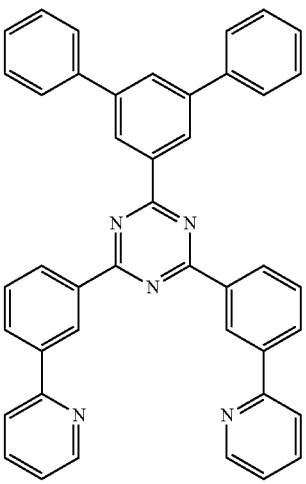
ET28
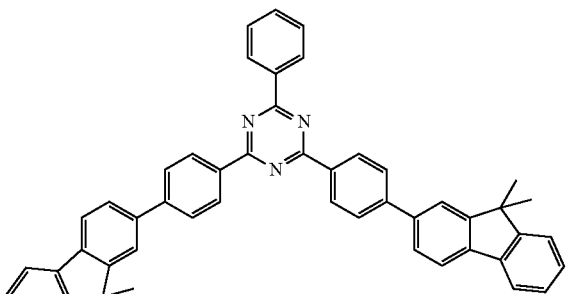
ET29
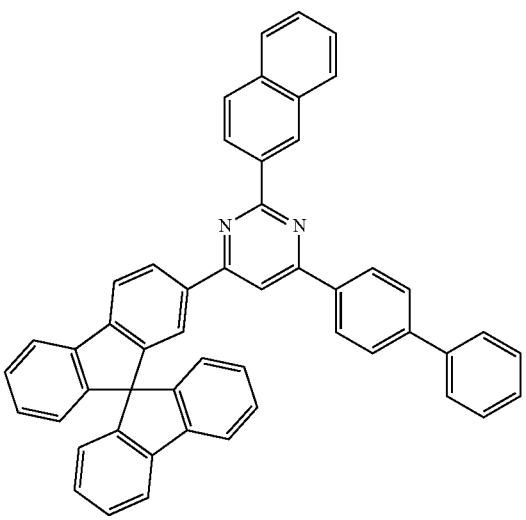
ET30

ET31 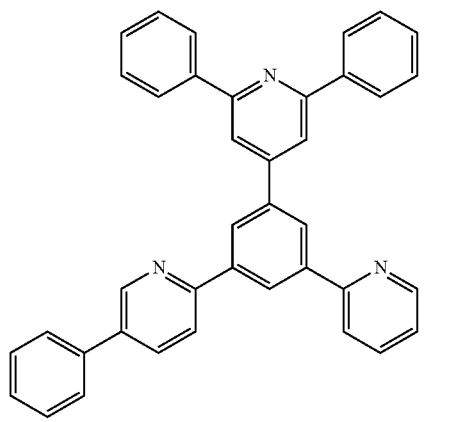
ET32 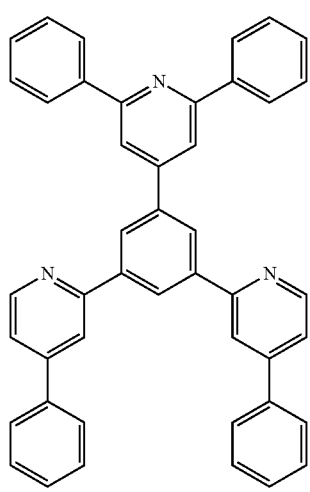
ET33 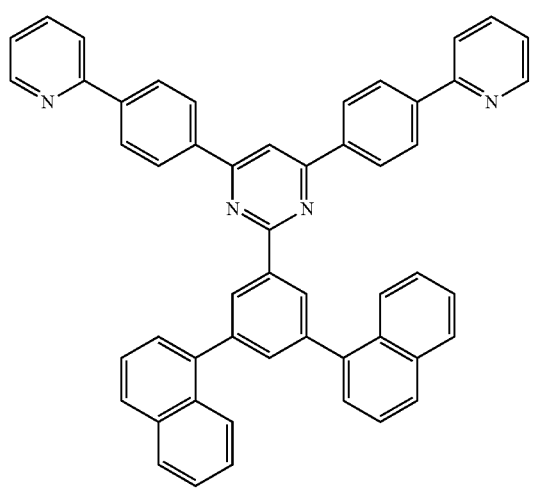
ET34 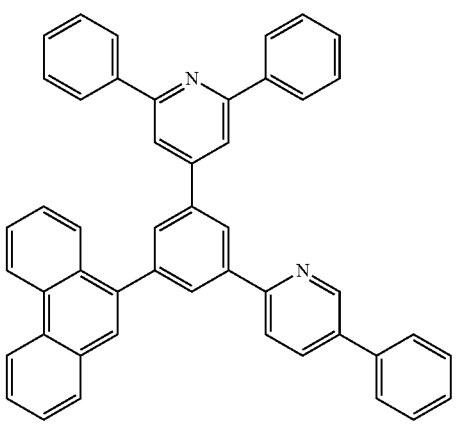
ET35 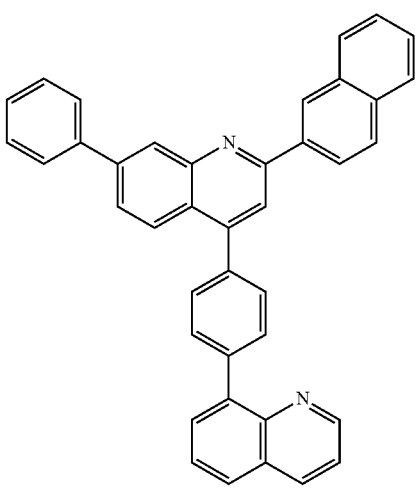
ET36 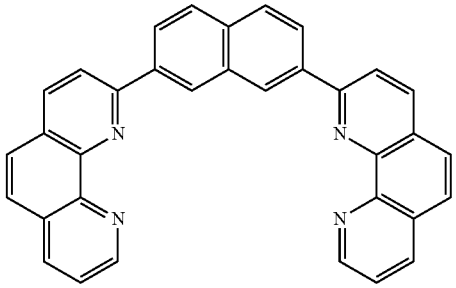
ET37 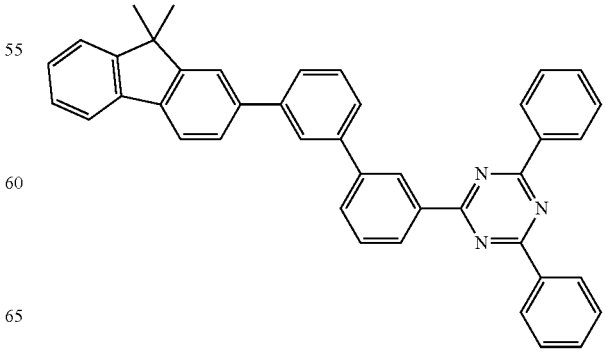

E3T8
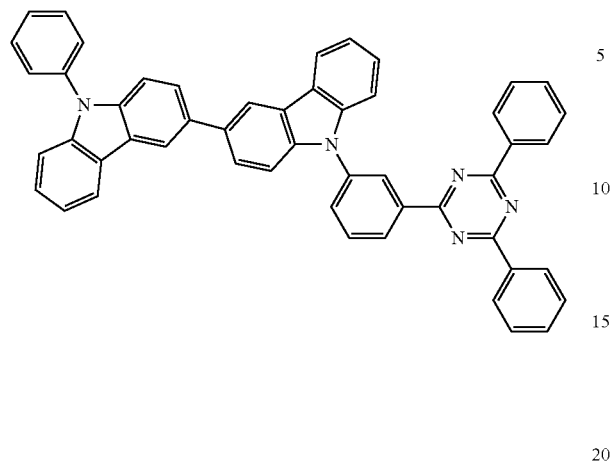
ET41
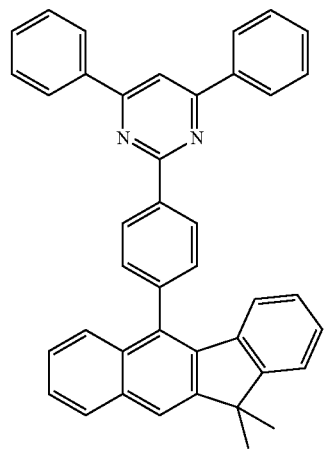
ET39
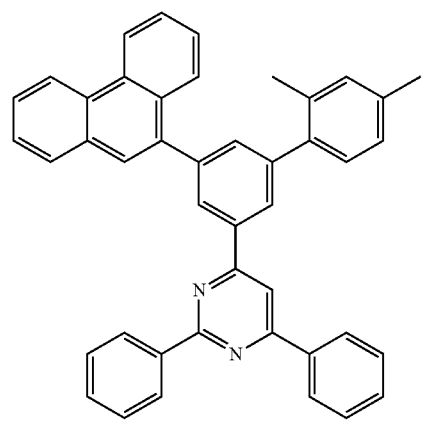
ET42
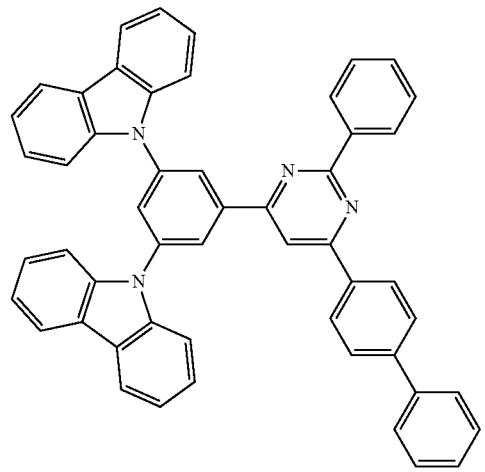
ET40
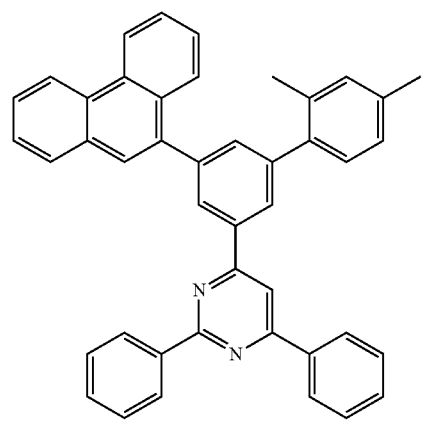
ET43
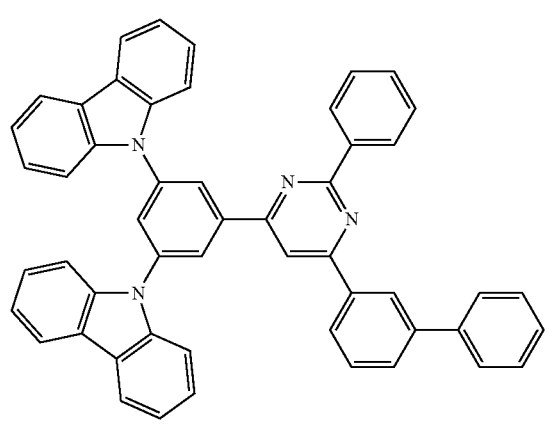

-continued

ET44
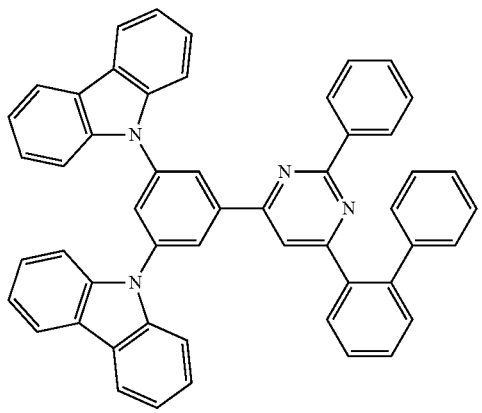

ET45
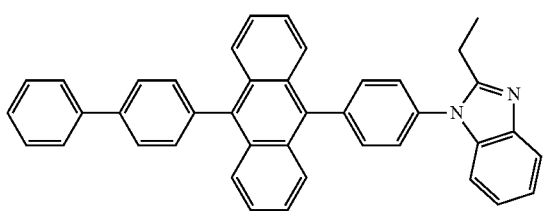

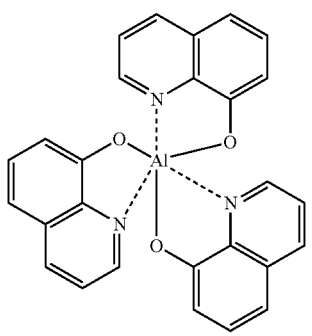

Alq₃

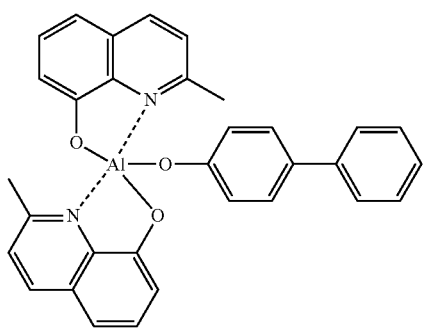

BAlq

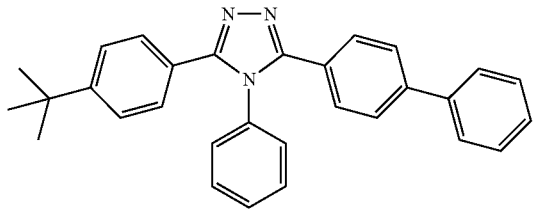

TAZ

-continued
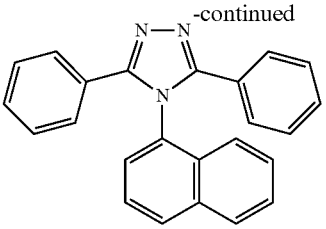

NTAZ

A thickness of the electron transport region may be in a range of about 50 Å to about 5,000 Å. For example, the thickness of the electron transport region may be in a range of about 100 Å to about 4,000 Å. When the electron transport region includes a buffer layer, a hole blocking layer, an electron control layer, an electron transport layer 134, or any combination thereof, a thickness of the buffer layer, the hole blocking layer, and the electron control layer may each independently be in a range of about 20 Å to about 1,000 Å, and a thickness of the electron transport layer 134 may be in a range of about 100 Å to about 1000 Å. For example, the thickness of the buffer layer, the hole blocking layer, and the electron control layer may each independently be in a range of about 30 Å to about 300 Å. For example, the thickness of the electron transport layer 134 may be in a range of about 150 Å to about 500 Å. When the thicknesses of the buffer layer, hole blocking layer, electron control layer, and/or electron transport layer 134 are within these ranges, satisfactory electron transporting characteristics may be obtained without a substantial increase in driving voltage.

The electron transport region (for example, the electron transport layer 134 in the electron transport region) may further include, in addition to the materials described above, a metal-containing material.

The metal-containing material may be the same as described in connection with the n-dopant. For example, the metal-containing material may include a Li complex. For example, in an embodiment, the electron transport region may include a Li complex.

In an embodiment, the electron transport region may include an electron transport layer 134, and the electron transport layer 134 may include a metal-containing material, for example, a Li complex.

The electron transport region may include an electron injection layer 135 that facilitates the injection of electrons from the second electrode 150. The electron injection layer 135 may directly contact the second electrode 150.

The electron injection layer 135 may have a structure consisting of a layer consisting of a single material, a structure consisting of a layer consisting of different materials, or a multi-layered structure including layers including different materials.

The electron injection layer 135 may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may be oxides, halides (for example, fluorides, chlorides, bromides, or iodides), or tellurides of the alkali metal, the alkaline earth metal, and the rare earth metal, or any combination thereof.

The alkali metal-containing compound may include alkali metal oxides, such as $Li_2O$, $Cs_2O$, or $K_2O$, alkali metal halides, such as LiF, NaF, CsF, KF, LiI, NaI, CsI, or KI, or any combination thereof. The alkaline earth metal-containing compound may include an alkaline earth metal compound, such as BaO, SrO, CaO, $Ba_xSr_{1-x}O$ (x is a real number satisfying the condition of 0<x<1), $Ba_xCa_{1-x}O$ (x is a real number satisfying the condition of 0<x<1), or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In embodiments, the rare earth metal-containing compound may include a lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include one of ions of the alkali metal, ions of the alkaline earth metal, and ions of the rare earth metal, and a ligand bonded to the metal ion, for example, hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenyl benzimidazole, hydroxyphenylbenzothiazole, bipyridine, phenanthroline, cyclopentadiene, or any combination thereof.

The electron injection layer 135 may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In an embodiment, the electron injection layer 135 may further include an organic material (for example, a compound represented by Formula 601).

In an embodiment, the electron injection layer 135 may consist of an alkali metal-containing compound (for example, an alkali metal halide); or the electron injection layer may consist of alkali metal-containing compound (for example, an alkali metal halide), and an alkali metal, an alkaline earth metal, a rare earth metal, or any combination thereof. In an embodiment, the electron injection layer 135 may be a KI:Yb co-deposited layer, an RbI:Yb co-deposited layer, or the like.

When the electron injection layer 135 further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof may be homogeneously or non-homogeneously dispersed in a matrix including the organic material.

A thickness of the electron injection layer 135 may be in a range of about 1 Å to about 100 Å. For example, the thickness of the electron injection layer 135 may be in a range of about 3 Å to about 90 Å. When the thickness of the electron transport layer 135 is within the ranges described above, satisfactory electron transport characteristics may be obtained without a substantial increase in driving voltage.

[Second Electrode 150]

The second electrode 150 may be disposed on the interlayer 130 having such a structure. The second electrode 150 may be a cathode, which is an electron injection electrode, and as the material for the second electrode 150, a metal, an alloy, an electrically conductive compound, or any combination thereof, each having a low work function, may be used.

In embodiments, the second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layered structure or a multi-layered structure including two or more layers.

[Capping Layer]

A first capping layer may be located outside the first electrode 110, and/or a second capping layer may be located outside the second electrode 150. In embodiments, the light-emitting device 10 may have a structure in which the first capping layer, the first electrode 110, the interlayer 130, and the second electrode 150 are stacked in this stated order, a structure in which the first electrode 110, the interlayer 130, the second electrode 150, and the second capping layer are stacked in this stated order, or a structure in which the first capping layer, the first electrode 110, the interlayer 130, the second electrode 150, and the second capping layer are stacked in this stated order.

Light generated in an emission layer 133 of the interlayer 130 of the light-emitting device 10 may be extracted toward the outside through the first electrode 110, which may be a semi-transmissive electrode or a transmissive electrode, and through the first capping layer or light generated in an emission layer 133 of the interlayer 130 of the light-emitting device 10 may be extracted toward the outside through the second electrode 150, which may be a semi-transmissive electrode or a transmissive electrode, and through the second capping layer.

The first capping layer and the second capping layer may each increase external emission efficiency according to the principle of constructive interference. Accordingly, the light extraction efficiency of the light-emitting device 10 may be increased, so that the emission efficiency of the light-emitting device 10 may be improved.

Each of the first capping layer and second capping layer may include a material having a refractive index (at a wavelength of about 589 nm) equal to or greater than about 1.6.

The first capping layer and the second capping layer may each independently be an organic capping layer including an organic material, an inorganic capping layer including an inorganic material, or an organic-inorganic composite capping layer including an organic material and an inorganic material.

At least one of the first capping layer and the second capping layer may each independently include carbocyclic compounds, heterocyclic compounds, amine group-containing compounds, porphyrin derivatives, phthalocyanine derivatives, naphthalocyanine derivatives, alkali metal complexes, alkaline earth metal complexes, or any combination thereof. The carbocyclic compound, the heterocyclic compound, and the amine group-containing compound may be optionally substituted with a substituent containing O, N, S, Se, Si, F, Cl, Br, I, or any combination thereof. In embodiments, at least one of the first capping layer and the second capping layer may each independently include an amine group-containing compound.

In embodiments, at least one of the first capping layer and the second capping layer may each independently include a compound represented by Formula 201, a compound represented by Formula 202, or any combination thereof.

In embodiments, at least one of the first capping layer and the second capping layer may each independently include one of Compounds HT28 to HT33, one of Compounds CP1 to CP6, β-NPB, or any combination thereof:

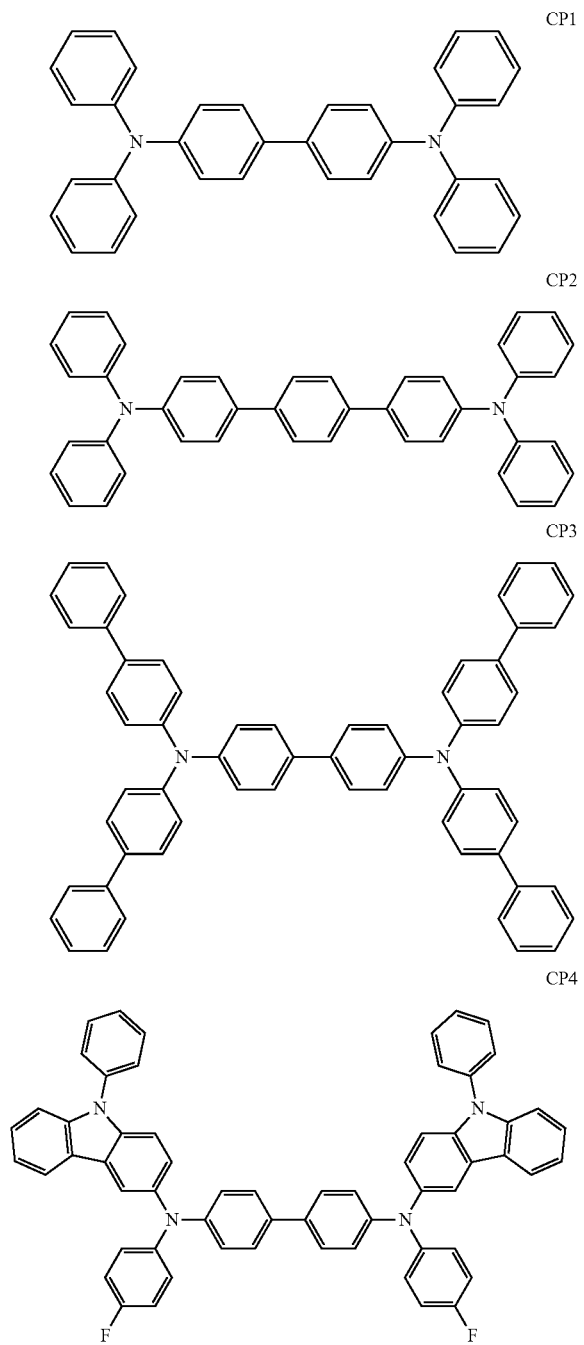

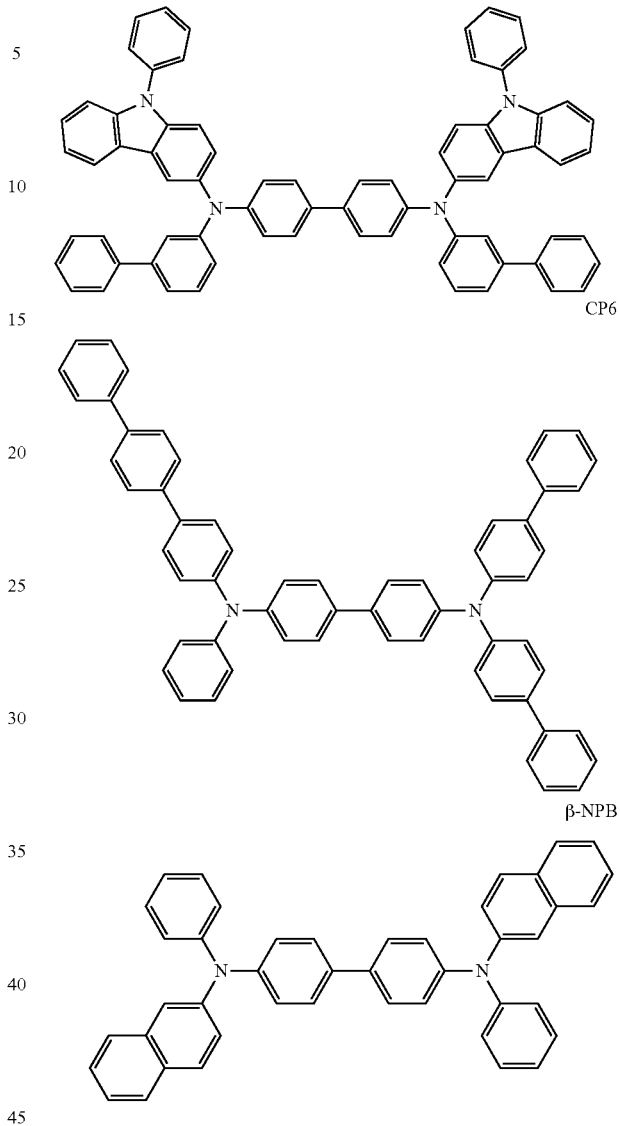

[Electronic Apparatus]

The light-emitting device 10 may be included in various electronic apparatuses. For example, the electronic apparatus including the light-emitting device 10 may be a light-emitting apparatus, an authentication apparatus, or the like.

The electronic apparatus (for example, a light-emitting apparatus) may further include, in addition to the light-emitting device 10, a color filter, a color conversion layer, or a color filter and a color conversion layer. The color filter and/or the color conversion layer may be located in at least one traveling direction of light emitted from the light-emitting device 10. For example, the light emitted from the light-emitting device 10 may be blue light or white light. The light-emitting device 10 may be the same as described above. In embodiments, the color conversion layer may include quantum dots. The quantum dot may be, for example, a quantum dot as described herein.

The electronic device may include a first substrate. The first substrate may include subpixels, the color filter may include color filter areas respectively corresponding to the subpixels, and the color conversion layer may include color conversion areas respectively corresponding to the subpixels.

A pixel-defining film may be located among the subpixels to define each of the subpixels.

The color filter may further include color filter areas and light-shielding patterns located among the color filter areas, and the color conversion layer may include color conversion areas and light-shielding patterns located among the color conversion areas.

The color filter areas (or the color conversion areas) may include a first area emitting first color light, a second area emitting second color light, and/or a third area emitting third color light, and the first color light, the second color light, and/or the third color light may have different maximum emission wavelengths from one another. In embodiments, the first color light may be red light, the second color light may be green light, and the third color light may be blue light. In embodiments, the color filter areas (or the color conversion areas) may include quantum dots. For example, the first area may include a red quantum dot, the second area may include a green quantum dot, and the third area may not include a quantum dot. The quantum dot may be the same as described in the specification. The first area, the second area, and/or the third area may each include a scatterer.

In an embodiment, the light-emitting device 10 may emit first light, the first area may absorb the first light to emit a first first-color light, the second area may absorb the first light to emit a second first-color light, and the third area may absorb the first light to emit a third first-color light. In this regard, the first first-color light, the second first-color light, and the third first-color light may each have different maximum emission wavelengths. For example, the first light may be blue light, the first first-color light may be red light, the second first-color light may be green light, and the third first-color light may be blue light.

The electronic apparatus may further include a thin-film transistor, in addition to the light-emitting device 10 as described above. The thin-film transistor may include a source electrode, a drain electrode, and an active layer, and any one of the source electrode and the drain electrode may be electrically connected to one of the first electrode 110 and the second electrode 150 of the light-emitting device 10.

The thin-film transistor may further include a gate electrode, a gate insulating film, etc.

The active layer may include crystalline silicon, amorphous silicon, organic semiconductor, oxide semiconductor, or the like.

The electronic apparatus may further include an encapsulation portion for sealing the light-emitting device 10. The encapsulation portion may be located between the color filter and/or the color conversion layer and the light-emitting device 10. The encapsulation portion may allow light from the light-emitting device 10 to be extracted to the outside, and may simultaneously prevent or reduce ambient air and moisture from penetrating into the light-emitting device 10. The encapsulation portion may be a sealing substrate including a transparent glass substrate or a plastic substrate. The encapsulation portion may be a thin-film encapsulation layer including at least one of an organic layer and/or an inorganic layer. When the encapsulation portion is a thin film encapsulation layer, the electronic device may be flexible.

Various functional layers may be additionally located on the encapsulation portion, in addition to the color filter and/or the color conversion layer, according to the use of the electronic device. The functional layers may include a touch screen layer, a polarizing layer, an authentication apparatus, and the like. The touch screen layer may be a pressure-sensitive touch screen layer, a capacitive touch screen layer, or an infrared touch screen layer. The authentication apparatus may be, for example, a biometric authentication apparatus that authenticates an individual by using biometric information of a living body (for example, fingertips, pupils, etc.).

The authentication apparatus may further include, in addition to the light-emitting device 10, a biometric information collector.

The electronic device may be applied to various displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, and the like.

Figure 2:
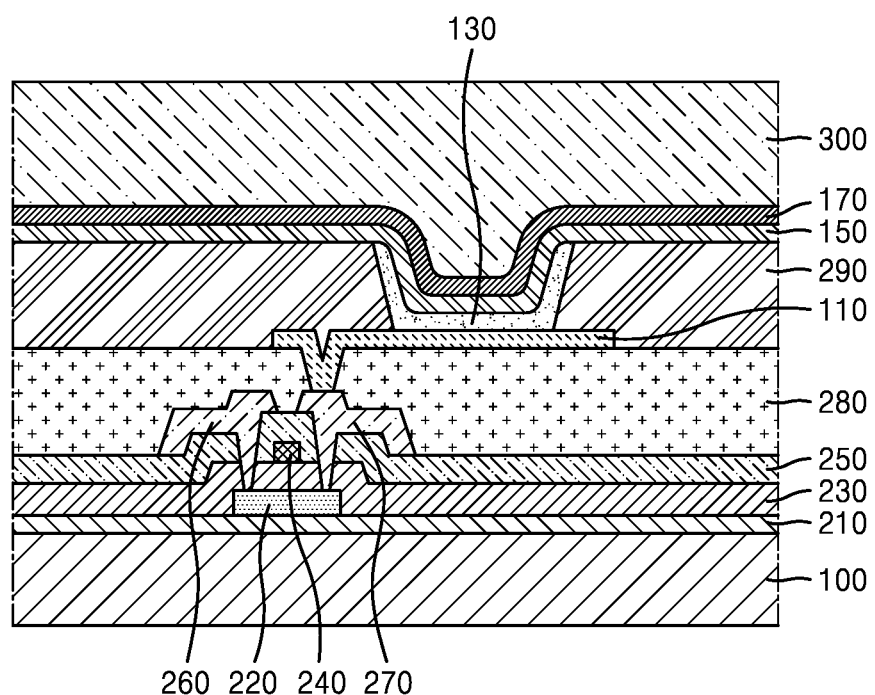
FIG. 2 is a schematic cross-sectional view of an electronic apparatus according to an embodiment.
Figure 3:
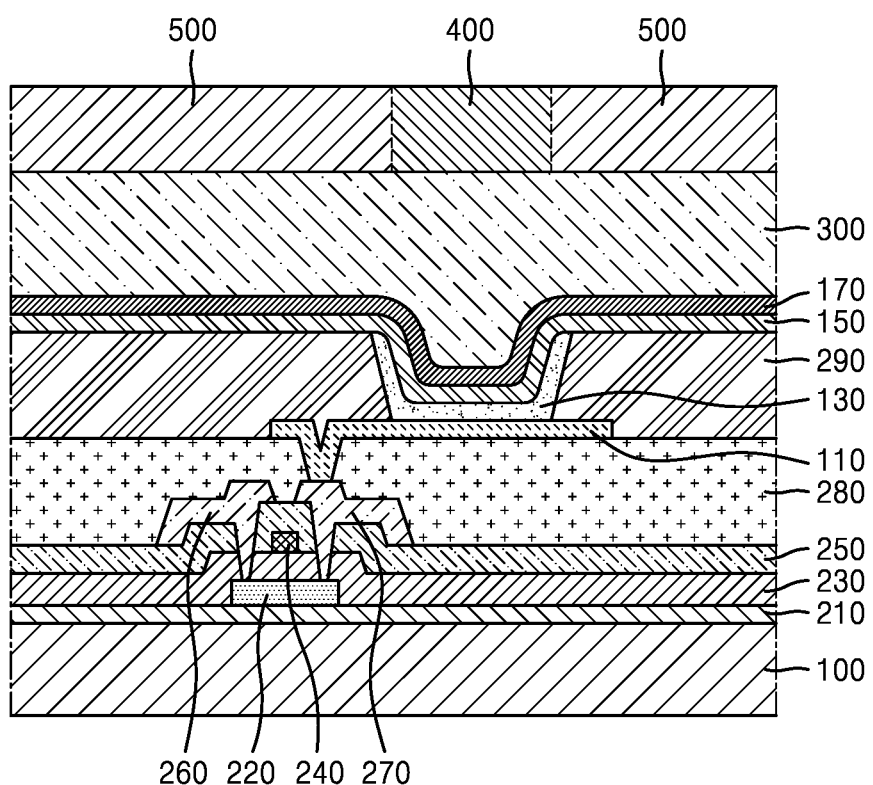
FIG. 3 is a schematic cross-sectional view of an electronic apparatus according to another embodiment.

[Description of FIGS. 2 and 3]

FIG. 2 is a schematic cross-sectional view showing an electronic apparatus according to an embodiment.

The electronic apparatus of FIG. 2 includes a substrate 100, a thin-film transistor (TFT), a light-emitting device, and an encapsulation portion 300 that seals the light-emitting device.

The substrate 100 may be a flexible substrate, a glass substrate, or a metal substrate. A buffer layer 210 may be formed on the substrate 100. The buffer layer 210 may prevent or reduce penetration of impurities through the substrate 100 and may provide a flat surface on the substrate 100.

A TFT may be located on the buffer layer 210. The TFT may include an active layer 220, a gate electrode 240, a source electrode 260, and a drain electrode 270.

The active layer 220 may include an inorganic semiconductor such as silicon or polysilicon, an organic semiconductor, or an oxide semiconductor, and may include a source region, a drain region, and a channel region.

A gate insulating film 230 for insulating the active layer 220 from the gate electrode 240 may be located on the active layer 220, and the gate electrode 240 may be located on the gate insulating film 230.

An interlayer insulating film 250 is located on the gate electrode 240. The interlayer insulating film 250 may be placed between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be located on the interlayer insulating film 250. The interlayer insulating film 250 and the gate insulating film 230 may be formed to expose the source region and the drain region of the active layer 220, and the source electrode 260 and the drain electrode 270 may electrically contact the exposed portions of the source region and the drain region of the active layer 220.

The TFT is electrically connected to a light-emitting device to drive the light-emitting device, and is covered by a passivation layer 280. The passivation layer 280 may include an inorganic insulating film, an organic insulating film, or any combination thereof. A light-emitting device is provided on the passivation layer 280. The light-emitting device may include a first electrode 110, an interlayer 130, and a second electrode 150.

The first electrode 110 may be formed on the passivation layer 280. The passivation layer 280 does not completely cover the drain electrode 270 and may expose a portion of the drain electrode 270, and the first electrode 110 may be electrically connected to the exposed portion of the drain electrode 270.

A pixel defining layer 290 containing an insulating material may be located on the first electrode 110. The pixel defining layer 290 may expose a region of the first electrode 110, and an interlayer 130 may be formed in the exposed region of the first electrode 110. The pixel defining layer 290 may be a polyimide or polyacrylic organic film. In an embodiment, at least some layers of the interlayer 130 may extend beyond the upper portion of the pixel defining layer 290 to be disposed in the form of a common layer.

The second electrode 150 may be located on the interlayer 130, and a capping layer 170 may be additionally formed on the second electrode 150. The capping layer 170 may be formed to cover the second electrode 150.

The encapsulation portion 300 may be located on the capping layer 170. The encapsulation portion 300 may be located on a light-emitting device to protect the light-emitting device from moisture and/or oxygen. The encapsulation portion 300 may include: an inorganic film including silicon nitride ($SiN_x$), silicon oxide ($SiO_x$), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, or the like), an epoxy-based resin (for example, aliphatic glycidyl ether (AGE), or the like), or any combination thereof; or any combination of the inorganic film and the organic film.

FIG. 3 shows a schematic cross-sectional view showing an electronic apparatus according to an embodiment.

The electronic apparatus of FIG. 3 may be the same as the electronic apparatus of FIG. 2, except that a light-shielding pattern 500 and a functional region 400 are additionally located on the encapsulation portion 300. The functional region 400 may be a color filter area, a color conversion area, or a combination of the color filter area and the color conversion area. In embodiments, the light-emitting device included in the electronic apparatus of FIG. 3 may be a tandem light-emitting device.

[Manufacture Method]

Respective layers included in the hole transport region, the emission layer, and respective layers included in the electron transport region may be formed in a specified region by using one or more suitable methods selected from vacuum deposition, spin coating, casting, Langmuir-Blodgett (LB) deposition, ink-jet printing, laser-printing, and laser-induced thermal imaging.

When layers constituting the hole transport region, an emission layer, and layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on a material to be included in a layer to be formed and the structure of a layer to be formed.

Definitions of Terms

The term "$C_3$-$C_{60}$ carbocyclic group" as used herein may be a cyclic group consisting only of carbon atoms as a ring-forming atom and having three to sixty carbon atoms, and the term "$C_1$-$C_{60}$ heterocyclic group" as used herein may be a cyclic group that has one to sixty carbon atoms and further has, in addition to carbon, at least one heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are condensed with each other. For example, the $C_1$-$C_{60}$ heterocyclic group may gave 3 to 61 ring-forming atoms.

The term "cyclic group" as used herein may include the $C_3$-$C_{60}$ carbocyclic group, and the $C_1$-$C_{60}$ heterocyclic group.

The term "π electron-rich $C_3$-$C_{60}$ cyclic group" as used herein may be a cyclic group that has three to sixty carbon atoms and may not include *—N=*' as a ring-forming moiety, and the term "π electron-deficient nitrogen-containing $C_1$-$C_{60}$ cyclic group" as used herein may be a heterocyclic group that has one to sixty carbon atoms and may include *—N=*' as a ring-forming moiety.

For example, the $C_3$-$C_{60}$ carbocyclic group may be a T1 group or a condensed cyclic group in which two or more T1 groups are condensed with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be a T2 group, a condensed cyclic group in which two or more T2 groups are condensed with each other, or a condensed cyclic group in which at least one T2 group and at least one T1 group are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the π electron-rich $C_3$-$C_{60}$ cyclic group may be a T1 group, a condensed cyclic group in which two or more T1 groups are condensed with each other, a T3 group, a condensed cyclic group in which two or more T3 groups are condensed with each other, or a condensed cyclic group in which at least one T3 group and at least one T1 group are condensed with each other (for example, the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), the π electron-deficient nitrogen-containing $C_1$-$C_{60}$ cyclic group may be a T4 group, a condensed cyclic group in which two or more T4 groups are condensed with each other, a condensed cyclic group in which at least one T4 group and at least one T1 group are condensed with each other, a condensed cyclic group in which at least one T4 group and at least one T3 group are condensed with each other, or a condensed cyclic group in which at least one T4 group, at least one T1 group, and at least one T3 group are condensed with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), wherein the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group, the $C_3$-$C_{60}$ carbocyclic group, the $C_1$-$C_{60}$ heterocyclic group, the π electron-rich $C_3$-$C_{60}$ cyclic group, or the π electron-deficient nitrogen-containing $C_1$-$C_{60}$ cyclic group" as used herein may be a group condensed to any cyclic group, a monovalent group, or a polyvalent group (for example, a divalent group, a trivalent group, a tetravalent group, etc.), depending on the structure of a formula in connection with which the terms are used. In embodiments, "a benzene group" may be a benzene ring, a phenyl group, a phenylene group, or the like, which may be easily understood by one of ordinary skill in the art according to the structure of a formula including the "benzene group."

Examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and examples of the divalent $C_3$-$C_{60}$ carbocyclic group and the monovalent $C_1$-$C_{60}$ heterocyclic group are a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as used herein may be a linear or branched aliphatic hydrocarbon monovalent group that has one to sixty carbon atoms, and examples thereof may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein may be a divalent group having a same structure as the $C_1$-$C_{60}$ alkyl group.

The term "$C_2$-$C_{60}$ alkenyl group" as used herein may be a monovalent hydrocarbon group having at least one carbon-carbon double bond in the middle or at the terminus of the $C_2$-$C_{60}$ alkyl group, and examples thereof may include an ethenyl group, a propenyl group, and a butenyl group. The term "$C_2$-$C_{60}$ alkenylene group" as used herein may be a divalent group having a same structure as the $C_2$-$C_{60}$ alkenyl group.

The term "$C_2$-$C_{60}$ alkynyl group" as used herein may be a monovalent hydrocarbon group having at least one carbon-carbon triple bond in the middle or at the terminus of the $C_2$-$C_{60}$ alkyl group, and examples thereof may include an ethynyl group and a propynyl group. The term "$C_2$-$C_{60}$ alkynylene group" as used herein may be a divalent group having a same structure as the $C_2$-$C_{60}$ alkynyl group.

The term "$C_1$-$C_{60}$ alkoxy group" as used herein may be a monovalent group represented by —$OA_{101}$ (wherein $A_{101}$ is a $C_1$-$C_{60}$ alkyl group), and examples thereof may include a methoxy group, an ethoxy group, and an isopropyloxy group.

The term "$C_3$-$C_{10}$ cycloalkyl group" as used herein may be a monovalent saturated hydrocarbon cyclic group having 3 to 10 carbon atoms, and examples thereof may include a cyclopropyl group, a cyclobutyl group, a cyclopentyl group, a cyclohexyl group, a cycloheptyl group, a cyclooctyl group, an adamantyl group, a norbornyl group (or a bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein may be a divalent group having a same structure as the $C_3$-$C_{10}$ cycloalkyl group.

The term "$C_1$-$C_{10}$ heterocycloalkyl group" as used herein may be a monovalent cyclic group that further includes, in addition to a carbon atom, at least one heteroatom as a ring-forming atom and has 1 to 10 carbon atoms, and examples thereof may include a 1,2,3,4-oxatriazolidinyl group, a tetrahydrofuranyl group, and a tetrahydrothiophenyl group. The term "$C_1$-$C_{10}$ heterocycloalkylene group" as used herein may be a divalent group having a same structure as the $C_1$-$C_{10}$ heterocycloalkyl group.

The term "$C_3$-$C_{10}$ cycloalkenyl group" as used herein may be a monovalent cyclic group that has three to ten carbon atoms and at least one carbon-carbon double bond in the ring thereof and no aromaticity, and examples thereof may include a cyclopentenyl group, a cyclohexenyl group, and a cycloheptenyl group. The term "$C_3$-$C_{10}$ cycloalkenylene group" as used herein may be a divalent group having a same structure as the $C_3$-$C_{10}$ cycloalkenyl group.

The term "$C_1$-$C_{10}$ heterocycloalkenyl group" as used herein may be a monovalent cyclic group that has, in addition to a carbon atom, at least one heteroatom as a ring-forming atom, 1 to 10 carbon atoms, and at least one double bond in the cyclic structure thereof. Examples of the $C_1$-$C_{10}$ heterocycloalkenyl group may include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein may be a divalent group having a same structure as the $C_1$-$C_{10}$ heterocycloalkenyl group.

The term "$C_6$-$C_{60}$ aryl group" as used herein may be a monovalent group having a carbocyclic aromatic system having six to sixty carbon atoms, and the term "$C_6$-$C_{60}$ arylene group" as used herein may be a divalent group having a carbocyclic aromatic system having six to sixty carbon atoms. Examples of the $C_6$-$C_{60}$ aryl group may include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the rings may be condensed with each other.

The term "$C_1$-$C_{60}$ heteroaryl group" as used herein may be a monovalent group having a heterocyclic aromatic system that has, in addition to a carbon atom, at least one heteroatom as a ring-forming atom, and 1 to 60 carbon atoms. The term "$C_1$-$C_{60}$ heteroarylene group" as used herein may be a divalent group having a heterocyclic aromatic system that has, in addition to a carbon atom, at least one heteroatom as a ring-forming atom, and 1 to 60 carbon atoms. Examples of the $C_1$-$C_{60}$ heteroaryl group may include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the rings may be condensed with each other.

The term "monovalent non-aromatic condensed polycyclic group" as used herein may be a monovalent group having two or more rings condensed with each other, with only carbon atoms (for example, having 8 to 60 carbon atoms) as ring-forming atoms, and non-aromaticity in its molecular structure when considered as a whole. Examples of the monovalent non-aromatic condensed polycyclic group may include an indenyl group, a fluorenyl group, a spiro-bifluorenyl group, a benzofluorenyl group, an indenophenanthrenyl group, and an indeno anthracenyl group. The term "divalent non-aromatic condensed polycyclic group" as used herein may be a divalent group having a same structure as a monovalent non-aromatic condensed polycyclic group.

The term "monovalent non-aromatic condensed heteropolycyclic group" as used herein may be a monovalent having two or more rings condensed with each other, at least one heteroatom other than carbon atoms (for example, having 8 to 60 carbon atoms), as ring-forming atoms, and non-aromaticity in its molecular structure when considered as a whole. Examples of the monovalent non-aromatic condensed heteropolycyclic group may include a 9,9-dihydroacridinyl group and a 9H-xanthenyl group. The term "divalent non-aromatic condensed heteropolycyclic group" as used herein may be a divalent group having a same structure as a monovalent non-aromatic condensed heteropolycyclic group.

The term "$C_6$-$C_{60}$ aryloxy group" as used herein may be a monovalent group represented by —$OA_{102}$ (wherein $A_{102}$ is a $C_6$-$C_{60}$ aryl group), and the term "$C_6$-$C_{60}$ arylthio group"

as used herein may be a monovalent group represented by —SA$_{103}$ (wherein A$_{103}$ is a C$_6$-C$_{60}$ aryl group).

The term "C$_7$-C$_{60}$ aryl alkyl group" as used herein may be a monovalent group represented by -(A$_{104}$)(A$_{105}$) (where A$_{104}$ may be a C$_1$-C$_{54}$ alkylene group, and A$_{105}$ may be a C$_6$-C$_{59}$ aryl group), and the term "C$_2$-C$_{60}$ heteroaryl alkyl group" as used herein may be a monovalent group represented by -(A$_{106}$)(A$_{107}$) (where A$_{106}$ may be a C$_1$-C$_{59}$ alkylene group, and A$_{107}$ may be a C$_1$-C$_{59}$ heteroaryl group).

The term "R$_{10a}$" as used herein may be:
deuterium (-D), —F, —Cl, —Br, —I, a hydroxyl group, a cyano group, or a nitro group;
a C$_1$-C$_{60}$ alkyl group, a C$_2$-C$_{60}$ alkenyl group, a C$_2$-C$_{60}$ alkynyl group, or a C$_1$-C$_{60}$ alkoxy group, each unsubstituted or substituted with deuterium, —F, —Cl, —Br, —I, a hydroxyl group, a cyano group, a nitro group, a C$_3$-C$_{60}$ carbocyclic group, a C$_1$-C$_{60}$ heterocyclic group, a C$_6$-C$_{60}$ aryloxy group, a C$_6$-C$_{60}$ arylthio group, a C$_7$-C$_{60}$ aryl alkyl group, a C$_2$-C$_{60}$ heteroaryl alkyl group, —Si(Q$_{11}$)(Q$_{12}$)(Q$_{13}$), —N(Q$_{11}$)(Q$_{12}$), —B(Q$_{11}$)(Q$_{12}$), —C(=O)(Q$_{11}$), —S(=O)$_2$(Q$_{11}$), —P(=O)(Q$_{11}$)(Q$_{12}$), or any combination thereof;
a C$_3$-C$_{60}$ carbocyclic group, a C$_1$-C$_{60}$ heterocyclic group, a C$_6$-C$_{60}$ aryloxy group, a C$_6$-C$_{60}$ arylthio group, a C$_7$-C$_{60}$ aryl alkyl group, or a C$_2$-C$_{60}$ heteroaryl alkyl group, each unsubstituted or substituted with deuterium, —F, —Cl, —Br, —I, a hydroxyl group, a cyano group, a nitro group, a C$_1$-C$_{60}$ alkyl group, a C$_2$-C$_{60}$ alkenyl group, a C$_2$-C$_{60}$ alkynyl group, a C$_1$-C$_{60}$ alkoxy group, a C$_3$-C$_{60}$ carbocyclic group, a C$_1$-C$_{60}$ heterocyclic group, a C$_6$-C$_{60}$ aryloxy group, a C$_6$-C$_{60}$ arylthio group, a C$_7$-C$_{60}$ aryl alkyl group, a C$_2$-C$_{60}$ heteroaryl alkyl group, —Si(Q$_{21}$)(Q$_{22}$)(Q$_{23}$), —N(Q$_{21}$)(Q$_{22}$), —B(Q$_{21}$)(Q$_{22}$), —C(=O)(Q$_{21}$), —S(=O)$_2$(Q$_{21}$), —P(=O)(Q$_{21}$)(Q$_{22}$), or any combination thereof; or —Si(Q$_{31}$)(Q$_{32}$)(Q$_{33}$), —N(Q$_{31}$)(Q$_{32}$), —B(Q$_{31}$)(Q$_{32}$), —C(=O)(Q$_{31}$), —S(=O)$_2$(Q$_{31}$), or —P(=O)(Q$_{31}$)(Q$_{32}$), Q$_1$ to Q$_3$, Q$_{11}$ to Q$_{13}$, Q$_{21}$ to Q$_{23}$ and Q$_{31}$ to Q$_{33}$ used herein may each independently be: hydrogen; deuterium; —F; —Cl; —Br; —I; a hydroxyl group; a cyano group; a nitro group; a C$_1$-C$_{60}$ alkyl group; a C$_2$-C$_{60}$ alkenyl group; a C$_2$-C$_{60}$ alkynyl group; a C$_1$-C$_{60}$ alkoxy group; a C$_3$-C$_{60}$ carbocyclic group or a C$_1$-C$_{60}$ heterocyclic group, each unsubstituted or substituted with deuterium, —F, a cyano group, a C$_1$-C$_{60}$ alkyl group, a C$_1$-C$_{60}$ alkoxy group, a phenyl group, a biphenyl group, or any combination thereof; a C$_7$-C$_{60}$ aryl alkyl group; or a C$_2$-C$_{60}$ heteroaryl alkyl group.

The term "heteroatom" as used herein may be any atom other than a carbon atom. Examples of the heteroatom may include O, S, N, P, Si, B, Ge, Se, and any combination thereof.

The term "the third-row transition metal" as used herein may include hafnium (Hf), tantalum (Ta), tungsten (W), rhenium (Re), osmium (Os), iridium (Ir), platinum (Pt), gold (Au), etc.

The term "Ph" as used herein refers to a phenyl group, the term "Me" as used herein refers to a methyl group, the term "Et" as used herein refers to an ethyl group, the term "ter-Bu" or "Bu$^t$" as used herein refers to a tert-butyl group, and the term "OMe" as used herein refers to a methoxy group.

The term "biphenyl group" as used herein may be "a phenyl group substituted with a phenyl group." For example, the "biphenyl group" may be a substituted phenyl group having a C$_6$-C$_{60}$ aryl group as a substituent.

The term "terphenyl group" as used herein may be "a phenyl group substituted with a biphenyl group". For example, the "terphenyl group" may be a substituted phenyl group having, as a substituent, a C$_6$-C$_{60}$ aryl group substituted with a C$_6$-C$_{60}$ aryl group.

In the description, * and *' as used herein, unless defined otherwise, each represents a binding site to a neighboring atom in a corresponding formula or moiety.

Hereinafter, a light-emitting device according to embodiments will be described in detail with reference to Examples.

EXAMPLES

Example 1

A Corning 15 Ω/cm$^2$ (1,200 Å) ITO glass substrate (anode) was cut to a size of 50 mm×50 mm×0.5 mm, sonicated with acetone, isopropyl alcohol, and pure water each for 15 minutes, and cleaned by exposure to ultraviolet rays and ozone for 30 minutes. The ITO glass substrate was provided to a vacuum deposition apparatus.

Compound HT3 was vacuum-deposited on the ITO glass substrate to form a hole injection layer having a thickness of 120 nm, and Compound 1-3 was vacuum-deposited on the hole injection layer to form a hole transport layer having a thickness of 5 nm.

Compound 1-3 (the first compound), Compound 2-16 (the second compound), and Compound 3-1 (the first dopant) were co-deposited on the hole transport layer to a weight ratio of 6.3:2.7:1 to form an emission layer having a thickness of 30 nm.

Compound 2-16 and LiQ were co-deposited on the emission layer to a weight ratio of 9.5:0.5 to form an n-doping layer having a thickness of 5 nm.

ET-2 and LiQ were co-deposited on the n-doping layer to a weight ratio of 5:5 to form an electron transport layer having a thickness of 20 nm.

LiQ was vacuum-deposited on the electron transport layer to form an electron injection layer having a thickness of 1 nm, and Mg:Ag were co-deposited thereon to a weight ratio of 5:5 to form a cathode having a thickness of 10 nm, thereby completing the manufacture of the light-emitting device of Example 1.

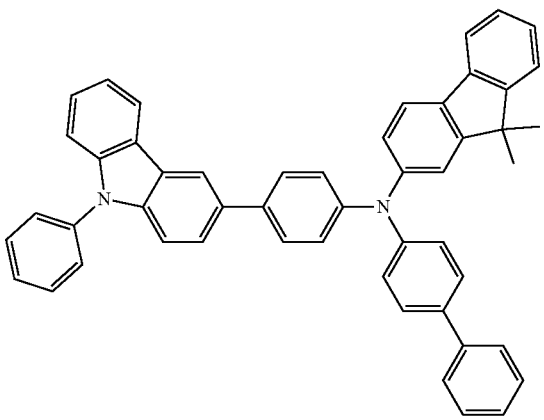

HT3

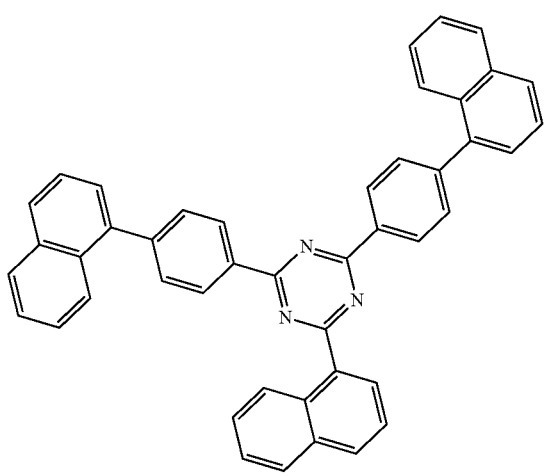

ET-2

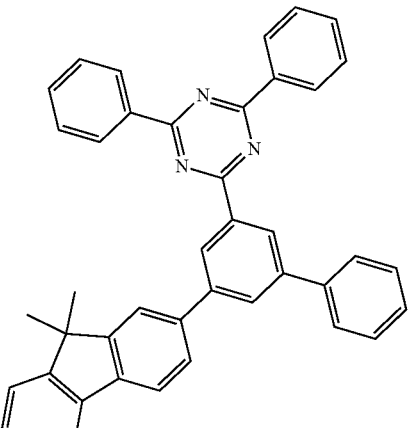

ET-1

Example 2

A light-emitting device was manufactured in the same manner as in Example 1, except that, in forming the n-doping layer, the weight ratio of Compound 2-16 and LiQ was 9:1.

Example 3

A light-emitting device was manufactured in the same manner as in Example 1, except that the n-doping layer was formed to have a thickness of 10 nm.

Example 4

A light-emitting device was manufactured in the same manner as in Example 1, except that, in forming the emission layer, Compound 3-7 was used as a first dopant instead of Compound 3-1.

Example 5

A light-emitting device was manufactured in the same manner as in Example 1, except that, in forming the emission layer, Compound 3-7 was used as a first dopant instead of Compound 3-1, and, in forming the n-doping layer, the weight ratio of Compound 2-16 and LiQ was 9:1.

Example 6

A light-emitting device was manufactured in the same manner as in Example 1, except that, in forming the emission layer, Compound 3-7 was used as a first dopant instead of Compound 3-1, and the n-doping layer was formed to have a thickness of 10 nm.

Comparative Example 1

A light-emitting device was manufactured in the same manner as in Example 1, except that, instead of forming an n-doping layer, Compound ET-1 was deposited alone to form a layer having a thickness of 5 nm.

Comparative Example 2

A light-emitting device was manufactured in the same manner as in Example 1, except that, instead of forming an n-doping layer, Compound ET-1 was deposited alone to form a layer having a thickness of 10 nm.

Comparative Example 3

A light-emitting device was manufactured in the same manner as in Example 1, except that, in forming the emission layer, Compound 3-7 was used as a first dopant instead of Compound 3-1, and, instead of forming an n-doping layer, Compound ET-1 was deposited alone to form a layer having a thickness of 5 nm.

Comparative Example 4

A light-emitting device was manufactured in the same manner as in Example 1, except that, in forming the emission layer, Compound 3-7 was used as a first dopant instead of Compound 3-1, and, instead of forming an n-doping layer, Compound ET-1 was deposited alone to form a layer having a thickness of 10 nm.

Comparative Example 5

A light-emitting device was manufactured in the same manner as in Example 1, except that, in forming the n-doping layer, Compound 2-16, LiQ, and Compound 3-1 were co-deposited to a weight ratio of 9:0.5:0.5.

Comparative Example 6

A light-emitting device was manufactured in the same manner as in Example 4, except that, in forming the n-doping layer, Compound 2-16, LiQ, and Compound 3-7 were co-deposited to a weight ratio of 9:0.5:0.5.

Evaluation Example 1

The emission efficiency, lifespan, and driving voltage of the light-emitting devices manufactured according to Examples 1 to 6 and Comparative Examples 1 to 6 were measured at a current density of 10 mA/cm$^2$ by using Keithley SMU 236 and a luminance meter PR650, and results thereof are shown in Table 1. The emission efficiency (Cd/A) and lifespan (hr) are shown in percentage values relative to Comparative Example 1. The lifespan refers to the amount of time taken when brightness becomes 90% of the initial brightness.

TABLE 1

|  | Emission layer | n-doping layer | Efficiency | Lifespan | Driving voltage |
| --- | --- | --- | --- | --- | --- |
| Example 1 | Compound 1-3: Compound 2-16: Compound 3-1 (6.3:2.7:1) | Compound 2-16: LiQ (9.5:0.5, 5 nm) | 120% | 115% | 5.1 V |
| Example 2 | Compound 1-3: Compound 2-16: Compound 3-1 (6.3:2.7:1) | Compound 2-16: LiQ (9:1, 5 nm) | 130% | 110% | 5.0 V |
| Example 3 | Compound 1-3: Compound 2-16: Compound 3-1 (6.3:2.7:1) | Compound 2-16: LiQ (9.5:0.5, 10 nm) | 110% | 120% | 5.2 V |
| Example 4 | Compound 1-3: Compound 2-16: Compound 3-7 (6.3:2.7:1) | Compound 2-16: LiQ (9.5:0.5, 5 nm) | 135% | 88% | 4.8 V |
| Example 5 | Compound 1-3: Compound 2-16: Compound 3-7 (6.3:2.7:1) | Compound 2-16: LiQ (9:1, 5 nm) | 135% | 85% | 4.6 V |
| Example 6 | Compound 1-3: Compound 2-16: Compound 3-7 (6.3:2.7:1) | Compound 2-16: LiQ (9.5:0.5, 10 nm) | 130% | 90% | 4.9 V |
| Comparative Example 1 | Compound 1-3: Compound 2-16: Compound 3-1 (6.3:2.7:1) | ET-1 (5 nm) | 100% | 100% | 5.4 V |
| Comparative Example 2 | Compound 1-3: Compound 2-16: Compound 3-1 (6.3:2.7:1) | ET-1 (10 nm) | 87% | 105% | 5.5 V |
| Comparative Example 3 | Compound 1-3: Compound 2-16: Compound 3-7 (6.3:2.7:1) | ET-1 (5 nm) | 120% | 75% | 5.1 V |
| Comparative Example 4 | Compound 1-3: Compound 2-16: Compound 3-7 (6.3:2.7:1) | ET-1 (10 nm) | 110% | 79% | 5.3 V |
| Comparative Example 5 | Compound 1-3: Compound 2-16: Compound 3-1 (6.3:2.7:1) | Compound 2-16: LiQ: Compound 3-1 (9:0.5:0.5, 5 nm) | 80% | 86% | 5.5 V |
| Comparative Example 6 | Compound 1-3: Compound 2-16: Compound 3-7 (6.3:2.7:1) | Compound 2-16: LiQ: Compound 3-7 (9:0.5:0.5, 5 nm) | 100% | 64% | 5.3 V |

Table 1 shows that the light-emitting devices of Examples 1 to 3 each have improved efficiency, lifespan, and driving voltage compared to Comparative Examples 1, 2 and 5, and the light-emitting devices of Examples 4 to 6 each have improved efficiency, lifespan, and driving voltage compared to Comparative Examples 3, 4, and 6.

Accordingly, the light-emitting devices including n-doping layers according to embodiments may have improved efficiency and lifespan and excellent driving voltage characteristics.

The light-emitting devices according to embodiments may have low driving voltage, high efficiency, and a long lifespan.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A light-emitting device comprising:
a first electrode;
a second electrode facing the first electrode, and
an interlayer disposed between the first electrode and the second electrode, the interlayer including:
an emission layer; and
an n-doping layer disposed between the emission layer and the second electrode, wherein the emission layer includes a first compound, a second compound, and a light-emitting dopant, the n-doping layer includes a third compound and an n-dopant, and does not include the light-emitting dopant, the first compound includes a hole transport host, the second compound and the third compound each independently include an electron transport host, a bipolar host, or a combination thereof, and the second compound and the third compound are identical to each other.

2. The light-emitting device of claim 1, wherein the n-doping layer directly contacts the emission layer.

3. The light-emitting device of claim 1, wherein the n-dopant includes a metal-containing material including an alkali metal complex, an alkaline earth metal complex, or a combination thereof.

4. The light-emitting device of claim 1, wherein the n-dopant includes a Li complex.

5. The light-emitting device of claim 1, wherein an amount of the n-dopant in the n-doping layer is in a range of about 5 wt % to about 10 wt %, based on the total weight of the n-doping layer.

6. The light-emitting device of claim 1, wherein a thickness of the n-doping layer is in a range of about 1 nm to about 20 nm.

7. The light-emitting device of claim 1, wherein the first compound includes a compound represented by Formula 1-1, a compound represented by Formula 1-2, or a combination thereof:

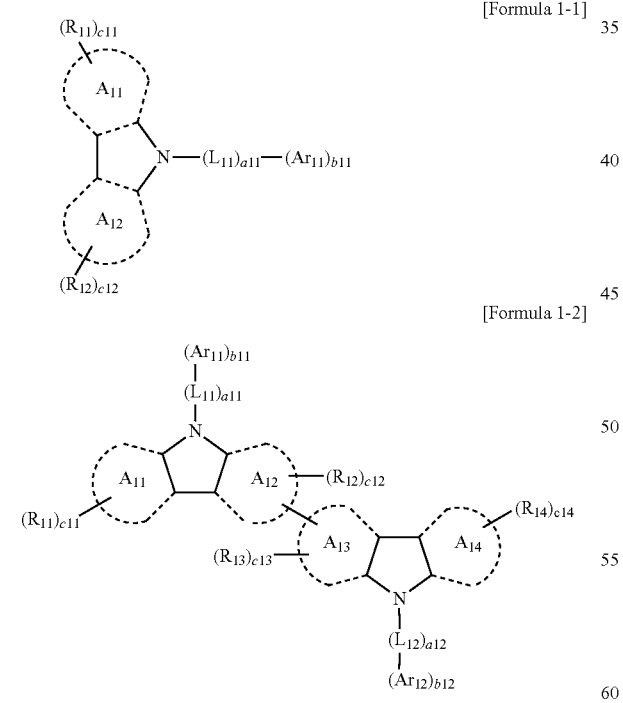

[Formula 1-1]

[Formula 1-2]

wherein in Formulae 1-1 and 1-2, $A_{11}$ to $A_{14}$ are each independently a π electron-rich $C_3$-$C_{60}$ cyclic group, $R_{11}$ to $R_{14}$ are each independently a group represented by *-$(L_{13})_{a13}$-$(Ar_{13})_{b13}$, hydrogen, deuterium, —F, —Cl, —Br, —I, a hydroxyl group, a cyano group, a nitro group, a $C_1$-$C_{60}$ alkyl group unsubstituted or substituted with at least one $R_{10b}$, a $C_2$-$C_{60}$ alkenyl group unsubstituted or substituted with at least one $R_{10b}$, a $C_2$-$C_{60}$ alkynyl group unsubstituted or substituted with at least one $R_{10b}$, a $C_1$-$C_{60}$ alkoxy group unsubstituted or substituted with at least one $R_{10b}$, a π electron-rich $C_3$-$C_{60}$ cyclic group unsubstituted or substituted with at least one $R_{10b}$, —Si$(Q_1)(Q_2)(Q_3)$, —N$(Q_1)(Q_2)$, or —B$(Q_1)(Q_2)$, c11 to c14 are each independently an integer from 1 to 8, $L_{11}$ to $L_{13}$ are each independently:

a single bond; or a π electron-rich $C_3$-$C_{60}$ cyclic group unsubstituted or substituted with deuterium, —F, —Cl, —Br, —I, a hydroxyl group, a cyano group, a nitro group, a $C_1$-$C_{60}$ alkyl group, a $C_1$-$C_{60}$ alkoxy group, a π electron-rich $C_3$-$C_{60}$ cyclic group, or a combination thereof, a11 to a13 are each independently an integer from 1 to 5, $Ar_{11}$ to $Ar_{13}$ are each independently:

a π electron-rich $C_3$-$C_{60}$ cyclic group unsubstituted or substituted with deuterium, —F, —Cl, —Br, —I, a hydroxyl group, a cyano group, a nitro group, a $C_1$-$C_{60}$ alkyl group, a $C_1$-$C_{60}$ alkoxy group, a π electron-rich $C_3$-$C_{60}$ cyano group, or any combination thereof, or —Si$(Q_1)(Q_2)(Q_3)$ or —N$(Q_1)(Q_2)$, b11 to b13 are each independently an integer from 1 to 5, and $R_{10}b$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a π electron-rich $C_3$-$C_{60}$ cyclic group, a $C_6$-$C_{60}$ aryloxy group, a $C_6$-$C_{60}$ arylthio group, —Si$(Q_{11})(Q_{12})(Q_{13})$, —N$(Q_{11})(Q_{12})$, —B$(Q_{11})(Q_{12})$, or a combination thereof;

a π electron-rich $C_3$-$C_{60}$ cyclic group, a $C_6$-$C_{60}$ aryloxy group, or $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a π electron-rich $C_3$-$C_{60}$ cyclic group, a $C_6$-$C_{60}$ aryloxy group, a $C_6$-$C_{60}$ arylthio group, —Si$(Q_{21})(Q_{22})(Q_{23})$, —N$(Q_{21})(Q_{22})$, —B$(Q_{21})(Q_{22})$, or a combination thereof; or —Si$(Q_{31})(Q_{32})(Q_{33})$, —N$(Q_{31})(Q_{32})$, or —B$(Q_{31})(Q_{32})$, wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a x electron-rich $C_3$-$C_{60}$ cyclic group unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

8. The light-emitting device of claim 1, wherein the electron transport host is a compound that contains at least one electron withdrawing group, the bipolar host is a compound that includes at least one electron withdrawing group and at least one electron donating group, the electron withdrawing group is:
—F, —CFH$_2$, —CF$_2$H, —CF$_3$, —CN, or —NO$_2$;
a C$_1$-C$_{60}$ alkyl group substituted with —F, —CFH$_2$, —CF$_2$H, —CF$_3$, —CN, —NO$_2$, or any combination thereof; or
a π electron-deficient nitrogen-containing C$_1$-C$_{60}$ cyclic group, the electron donating group is a carbazole group, a dibenzofuran group, a dibenzothiophene group, an indolocarbazole group, a benzofurocarbazole group, a benzothienocarbazole group, or —N(Q$_1$)(Q$_2$), wherein Q$_1$ to Q$_2$ are each independently: hydrogen; deuterium; —F; —Cl; —Br; —I; a hydroxyl group; a cyano group; a nitro group; a C$_1$-C$_{60}$ alkyl group; a C$_2$-C$_{60}$ alkenyl group; a C$_2$-C$_{60}$ alkynyl group; a C$_1$-C$_{60}$ alkoxy group; or a π electron-rich C$_3$-C$_{60}$ cyclic group unsubstituted or substituted with deuterium, —F, a cyano group, a C$_1$-C$_{60}$ alkyl group, a C$_1$-C$_{60}$ alkoxy group, a phenyl group, a biphenyl group, or a combination thereof.

9. The light-emitting device of claim 1, wherein the second compound includes a compound represented by Formula 2-1, a compound represented by Formula 2-2, a compound represented by Formula 2-3, or a combination thereof:

[Formula 2-1]

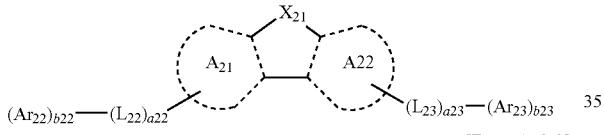

[Formula 2-2]

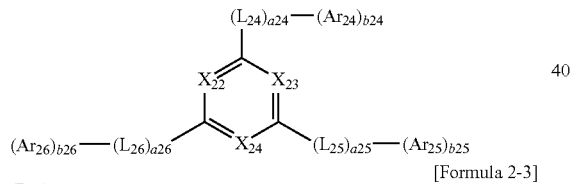

[Formula 2-3]

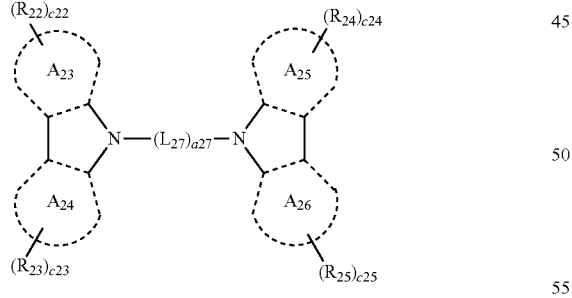

wherein in Formulae 2-1 to 2-3,

A$_{21}$ to A$_{26}$ are each independently a C$_3$-C$_{60}$ carbocyclic group or a C$_1$-C$_{60}$ heterocyclic group, X$_{21}$ is N-[(L$_{21}$)$_{a21}$-(Ar$_{21}$)$_{b21}$], O, or S, X$_{22}$ to X$_{24}$ are each independently N or C(R$_{21}$), at least one of X$_{22}$ to X$_{24}$ is N, L$_{21}$ to L$_{27}$ are each independently a single bond, a C$_3$-C$_{60}$ carbocyclic group unsubstituted or substituted with at least one R$_{10a}$, or a C$_1$-C$_{60}$ heterocyclic group unsubstituted or substituted with at least one R$_{10a}$, a21 to a27 are each independently an integer from 1 to 3, Ar$_{21}$ to Ar$_{26}$ and R$_{21}$ to R$_{25}$ are each independently hydrogen, deuterium, —F, —Cl, —Br, —I, a hydroxyl group, a cyano group, a nitro group, a C$_1$-C$_{60}$ alkyl group unsubstituted or substituted with at least one R$_{10a}$, a C$_2$-C$_{60}$ alkenyl group unsubstituted or substituted with at least one R$_{10a}$, a C$_2$-C$_{60}$ alkynyl group unsubstituted or substituted with at least one R$_{10a}$, a C$_1$-C$_{60}$ alkoxy group unsubstituted or substituted with at least one R$_{10a}$, a C$_3$-C$_{60}$ carbocyclic group unsubstituted or substituted with at least one R$_{10a}$, a C$_1$-C$_{60}$ heterocyclic group unsubstituted or substituted with at least one R$_{10a}$, a C$_6$-C$_{60}$ aryloxy group unsubstituted or substituted with at least one R$_{10a}$, a C$_6$-C$_{60}$ arylthio group unsubstituted or substituted with at least one R$_{10a}$, —Si(Q$_1$)(Q$_2$)(Q$_3$), —N(Q$_1$)(Q$_2$), —B(Q$_1$)(Q$_2$), —C(=O)(Q$_1$), —S(=O)$_2$(Q$_1$), or —P(=O)(Q$_1$)(Q$_2$), b21 to b26 are each independently an integer from 1 to 5, c22 to c25 are each independently an integer from 1 to 8, at least one of A$_{21}$, A$_{22}$, L$_{21}$ to L$_{23}$, and Ar$_{21}$ to Ar$_{23}$ in Formula 2-1 includes a π electron-deficient nitrogen-containing C$_1$-C$_{60}$ cyclic group, at least one of R$_{22}$ to R$_{25}$ in Formula 2-3 includes an electron withdrawing group, the electron withdrawing group is:
—F, —CFH$_2$, —CF$_2$H, —CF$_3$, —CN, or —NO$_2$;
a C$_1$-C$_{60}$ alkyl group substituted with —F, —CFH$_2$, —CF$_2$H, —CF$_3$, —CN, —NO$_2$, or a combination thereof; or
a π electron-deficient nitrogen-containing C$_1$-C$_{60}$ cyclic group, R$_{10a}$ is:

deuterium, —F, —Cl, —Br, —I, a hydroxyl group, a cyano group, or a nitro group;

a C$_1$-C$_{60}$ alkyl group, a C$_2$-C$_{60}$ alkenyl group, a C$_2$-C$_{60}$ alkynyl group, or a C$_1$-C$_{60}$ alkoxy group, each unsubstituted or substituted with deuterium, —F, —Cl, —Br, —I, a hydroxyl group, a cyano group, a nitro group, a C$_3$-C$_{60}$ carbocyclic group, a C$_1$-C$_{60}$ heterocyclic group, a C$_6$-C$_{60}$ aryloxy group, a C$_6$-C$_{60}$ arylthio group, —Si(Q$_{11}$)(Q$_{12}$)(Q$_{13}$), —N(Q$_{11}$)(Q$_{12}$), —B(Q$_{11}$)(Q$_{12}$), —C(=O)(Q$_{11}$), —S(=O)$_2$(Q$_{11}$), —P(=O)(Q$_{11}$)(Q$_{12}$), or a combination thereof;

a C$_3$-C$_{60}$ carbocyclic group, a C$_1$-C$_{60}$ heterocyclic group, a C$_6$-C$_{60}$ aryloxy group, or a C$_6$-C$_{60}$ arylthio group, each unsubstituted or substituted with deuterium, —F, —Cl, —Br, —I, a hydroxyl group, a cyano group, a nitro group, a C$_1$-C$_{60}$ alkyl group, a C$_2$-C$_{60}$ alkenyl group, a C$_2$-C$_{60}$ alkynyl group, a C$_1$-C$_{60}$ alkoxy group, a C$_3$-C$_{60}$ carbocyclic group, a C$_1$-C$_{60}$ heterocyclic group, a C$_6$-C$_{60}$ aryloxy group, a C$_6$-C$_{60}$ arylthio group, —Si(Q$_{21}$)(Q$_{22}$)(Q$_{23}$), —N(Q$_{21}$)(Q$_{22}$), —B(Q$_{21}$)(Q$_{22}$), —C(=O)(Q$_{21}$), —S(=O)$_2$(Q$_{21}$), —P(=O)(Q$_{21}$)(Q$_{22}$), or a combination thereof; or —Si(Q$_{31}$)(Q$_{32}$)(Q$_{33}$), —N(Q$_{31}$)(Q$_{32}$), —B(Q$_{31}$)(Q$_{32}$), —C(=O)(Q$_{31}$), —S(=O)$_2$(Q$_{31}$), or —P(=O)(Q$_{31}$)(Q$_{32}$), wherein Q$_1$ to Q$_3$, Q$_{11}$ to Q$_{13}$, Q$_{21}$ to Q$_{23}$, and Q$_{31}$ to Q$_{33}$ are each independently: hydrogen; deuterium; —F; —Cl; —Br; —I; a hydroxyl group; a cyano group; a nitro group; a C$_1$-C$_{60}$ alkyl group; a C$_2$-C$_{60}$ alkenyl group; a C$_2$-C$_{60}$ alkynyl group; a C$_1$-C$_{60}$ alkoxy group; or a C$_3$-C$_{60}$ carbocyclic group or a C$_1$-C$_{60}$ heterocyclic group, each unsubstituted or substituted with deuterium, —F, a cyano group, a C$_1$-C$_{60}$ alkyl group, a C$_1$-C$_{60}$ alkoxy group, a phenyl group, a biphenyl group, or a combination thereof.

10. The light-emitting device of claim 1, wherein the second compound has a triplet energy (T1) level equal to or greater than about 2.85 eV.

11. The light-emitting device of claim 1, wherein
the light-emitting dopant in the emission layer includes a first dopant, a second dopant, or a combination thereof,
the first dopant is a phosphorescent dopant, and
the second dopant is a thermally activated delayed fluorescence dopant satisfying Equation 1:

$$\Delta E_{ST} = E(S1) - E(T1) \leq 0.3 \text{ eV} \quad \text{[Equation 1]}$$

wherein in Equation 1,
E(S1) is the lowest excitation singlet energy level (eV) of the thermally activated delayed fluorescence dopant, and
E(T1) is the lowest excitation triplet energy level (eV) of the thermally activated delayed fluorescence dopant.

12. The light-emitting device of claim 11, wherein the light-emitting dopant in the emission layer further includes a fluorescence dopant.

13. The light-emitting device of claim 1, wherein
the interlayer further includes:
a hole transport region between the first electrode and the emission layer; and
an electron transport region between the n-doping layer and the second electrode,
the hole transport region includes a hole injection layer, a hole transport layer, an emission auxiliary layer, an electron blocking layer, or a combination thereof, and
the electron transport region includes a buffer layer, a hole blocking layer, an electron control layer, an electron transport layer, an electron injection layer, or a combination thereof.

14. The light-emitting device of claim 13, wherein
the hole transport region includes a hole transport layer,
the hole transport layer includes a hole transport material, and
the hole transport material included in the hole transport layer and the first compound included in the emission layer are identical to each other.

15. The light-emitting device of claim 13, wherein
the electron transport region includes an electron transport layer,
the n-doping layer is disposed between the emission layer and the electron transport layer, and
the n-doping layer directly contacts the emission layer and directly contacts the electron transport layer.

16. The light-emitting device of claim 13, wherein the electron transport region includes a Li complex.

17. An electronic apparatus comprising the light-emitting device of claim 1.

18. The electronic apparatus of claim 17, further comprising a thin-film transistor including a source electrode, a drain electrode, and an active layer, wherein
the first electrode of the light-emitting device and the source electrode or the drain electrode of the thin-film transistor are electrically connected to each other.

19. The electronic apparatus of claim 17, further comprising a functional layer including a touch screen layer, a polarizing layer, a color filter, a color conversion layer, or a combination thereof.

* * * * *